(12) United States Patent
Kim et al.

(10) Patent No.: US 12,108,657 B2
(45) Date of Patent: Oct. 1, 2024

(54) COMPOUND FOR ORGANIC OPTOELECTRONIC DEVICE, COMPOSITION FOR ORGANIC OPTOELECTRONIC DEVICE, ORGANIC OPTOELECTRONIC DEVICE AND DISPLAY DEVICE

(71) Applicant: SAMSUNG SDI CO., LTD., Yongin-si (KR)

(72) Inventors: Wook Kim, Suwon-si (KR); Hyung Sun Kim, Suwon-si (KR); Min Seok Seo, Suwon-si (KR); Jiah Yoon, Suwon-si (KR); Hanill Lee, Suwon-si (KR); Sung-Hyun Jung, Suwon-si (KR); Ho Kuk Jung, Suwon-si (KR); Youngkyoung Jo, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 1050 days.

(21) Appl. No.: 17/023,666

(22) Filed: Sep. 17, 2020

(65) Prior Publication Data

US 2021/0098704 A1    Apr. 1, 2021

(30) Foreign Application Priority Data

Sep. 30, 2019   (KR) .......... 10-2019-0121103

(51) Int. Cl.
*H10K 85/60*   (2023.01)
*H10K 50/00*   (2023.01)

(52) U.S. Cl.
CPC ......... *H10K 85/622* (2023.02); *H10K 85/654* (2023.02); *H10K 85/6572* (2023.02); *H10K 85/6574* (2023.02); *H10K 85/6576* (2023.02); *H10K 50/00* (2023.02)

(58) Field of Classification Search
None
See application file for complete search history.

(56) References Cited

U.S. PATENT DOCUMENTS

| | | | |
|---|---|---|---|
| 5,061,569 A | 10/1991 | Vanslyke et al. | |
| 2010/0148161 A1† | 6/2010 | Kai et al. | |
| 2010/0187977 A1† | 7/2010 | Kai et al. | |
| 2011/0037062 A1* | 2/2011 | Fukumatsu | C07D 471/04 257/40 |
| 2013/0248849 A1* | 9/2013 | Feldman | H10K 85/346 252/500 |
| 2014/0275530 A1* | 9/2014 | Jatsch | C09K 11/025 546/276.7 |
| 2015/0171357 A1† | 6/2015 | Takada | |
| 2017/0069848 A1 | 3/2017 | Zeng et al. | |
| 2017/0117488 A1† | 4/2017 | Ahn et al. | |
| 2017/0317293 A1 | 11/2017 | Kim et al. | |
| 2019/0140193 A1 | 5/2019 | Dyatkin et al. | |

FOREIGN PATENT DOCUMENTS

| | | |
|---|---|---|
| CN | 101511834 A | 8/2009 |
| CN | 101679438 A | 3/2010 |

(Continued)

OTHER PUBLICATIONS

Sánchez, et al. "Indolocarbazole natural products: occurrence, biosynthesis, and biological activity", Natural Product Reports, 23, 1007-1045, Oct. 2006. (Year: 2006).*

(Continued)

*Primary Examiner* — Christopher M Rodd
(74) *Attorney, Agent, or Firm* — Lee IP Law, P.C.

(57) ABSTRACT

A compound for an organic optoelectronic device, a composition, an organic optoelectronic device, and a display device, the compound being represented by Chemical Formula 1A or Chemical Formula 1B.

[Chemical Formula 1A]

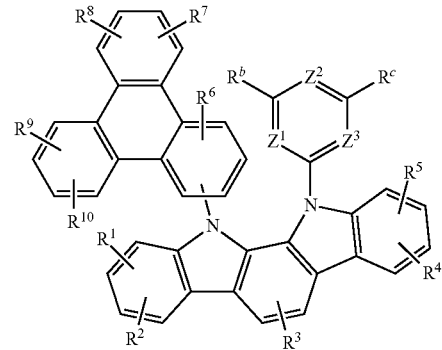

[Chemical Formula 1B]

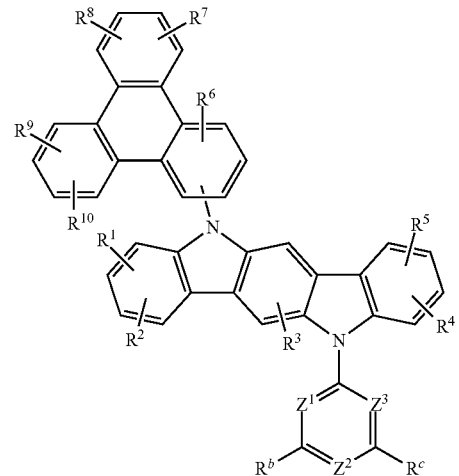

14 Claims, 1 Drawing Sheet

(56) References Cited

FOREIGN PATENT DOCUMENTS

| | | |
|---|---|---|
| CN | 103228661 A | 7/2013 |
| CN | 103889952 A | 6/2014 |
| CN | 104447505 A | 3/2015 |
| CN | 106133113 A | 11/2016 |
| CN | 106554771 A | 4/2017 |
| CN | 107623073 A | 1/2018 |
| CN | 107644942 A | 1/2018 |
| CN | 108148047 A | 6/2018 |
| CN | 109980112 A | 7/2019 |
| CN | 110144213 A | 8/2019 |
| JP | 1993-009471 A | 1/1993 |
| JP | 1995-126615 A | 5/1995 |
| JP | 1998-095972 A | 4/1998 |
| JP | 4550160 B2 | 9/2010 |
| JP | 2012-056880 A | 3/2012 |
| JP | 2012-140365 A | 7/2012 |
| KR | 10-2017-0037276 A | 4/2017 |
| KR | 10-2017-0051762 A | 5/2017 |
| KR | 10-2017-0073245 A | 6/2017 |
| KR | 10-1773363 B1 | 8/2017 |
| KR | 10-1948709 B1 | 2/2019 |
| WO | WO 1995-009147 A1 | 4/1995 |
| WO | WO 2012/039561 † | 3/2012 |

OTHER PUBLICATIONS

Chinese Office Action (including a search report) dated Aug. 18, 2023, of the corresponding Chinese Patent Application No. 202011035125.X.

Chinese Office action and Search Report dated Jan. 9, 2023.

\* cited by examiner
† cited by third party

COMPOUND FOR ORGANIC OPTOELECTRONIC DEVICE, COMPOSITION FOR ORGANIC OPTOELECTRONIC DEVICE, ORGANIC OPTOELECTRONIC DEVICE AND DISPLAY DEVICE

CROSS-REFERENCE TO RELATED APPLICATION

Korean Patent Application No. 10-2019-0121103, filed on Sep. 30, 2019, in the Korean Intellectual Property Office, and entitled: "Compound for Organic Optoelectronic Device, Composition for Organic Optoelectronic Device, Organic Optoelectronic Device and Display Device," is incorporated by reference herein in its entirety.

BACKGROUND

1. Field

Embodiments relate to a compound for an organic optoelectronic device, a composition for an organic optoelectronic device, an organic optoelectronic device, and a display device.

2. Description of the Related Art

An organic optoelectronic device (e.g., organic optoelectronic diode) is a device that converts electrical energy into photoenergy, and vice versa.

An organic optoelectronic device may be classified as follows in accordance with its driving principles. One is a photoelectric device where excitons generated by photoenergy are separated into electrons and holes and the electrons and holes are transferred to different electrodes respectively and electrical energy is generated, and the other is a light emitting device to generate photoenergy from electrical energy by supplying a voltage or a current to electrodes.

Examples of the organic optoelectronic device may include an organic photoelectric device, an organic light emitting diode, an organic solar cell, and an organic photo conductor drum.

SUMMARY

The embodiments may be realized by providing a compound for an organic optoelectronic device, the compound being represented by Chemical Formula 1A or Chemical Formula 1B:

[Chemical Formula 1A]

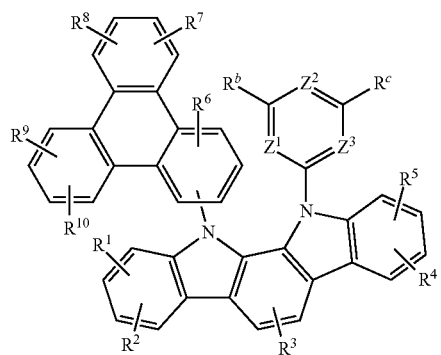

-continued

[Chemical Formula 1B]

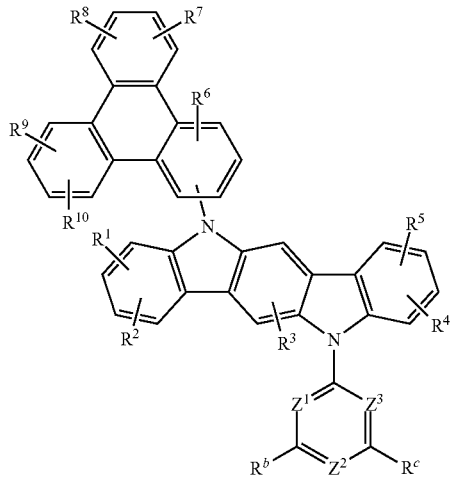

wherein, in Chemical Formula 1A and Chemical Formula 1B, $Z^1$ to $Z^3$ are independently N or $CR^a$, at least two of $Z^1$ to $Z^3$ being N, $R^a$ and $R^1$ to $R^{10}$ are independently hydrogen, deuterium, a substituted or unsubstituted C1 to C10 alkyl group, or a substituted or unsubstituted C6 to C20 aryl group, and $R^b$ and $R^c$ are independently a substituted or unsubstituted C6 to C20 aryl group or a substituted or unsubstituted C2 to C30 heterocyclic group.

The embodiments may be realized by providing a composition for an organic optoelectronic device, the composition including a first compound and a second compound, wherein: the first compound includes the compound for an organic optoelectronic device according to an embodiment, the second compound is represented by Chemical Formula 2:

[Chemical Formula 2]

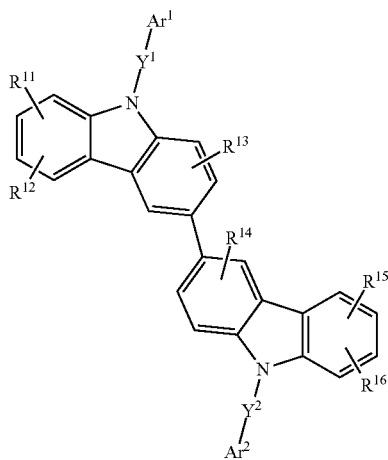

in Chemical Formula 2, $Y^1$ and $Y^2$ are independently a single bond or a substituted or unsubstituted C6 to C20 arylene group, $Ar^1$ and $Ar^2$ are independently a substituted or unsubstituted C6 to C20 aryl group or a substituted or unsubstituted C2 to C30 heterocyclic group, and $R^{11}$ to $R^{16}$ are independently hydrogen, deuterium, a substituted or unsubstituted C1 to C10 alkyl group, a substituted or unsubstituted C6 to C20 aryl group, a substituted or unsubstituted C2 to C30 heterocyclic group, a cyano group, or a combination thereof.

The embodiments may be realized by providing an organic optoelectronic device, including an anode and a cathode facing each other, and at least one organic layer between the anode and the cathode, wherein the at least one organic layer includes the compound or composition for an organic optoelectronic device according to an embodiment.

The embodiments may be realized by providing a display device comprising the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
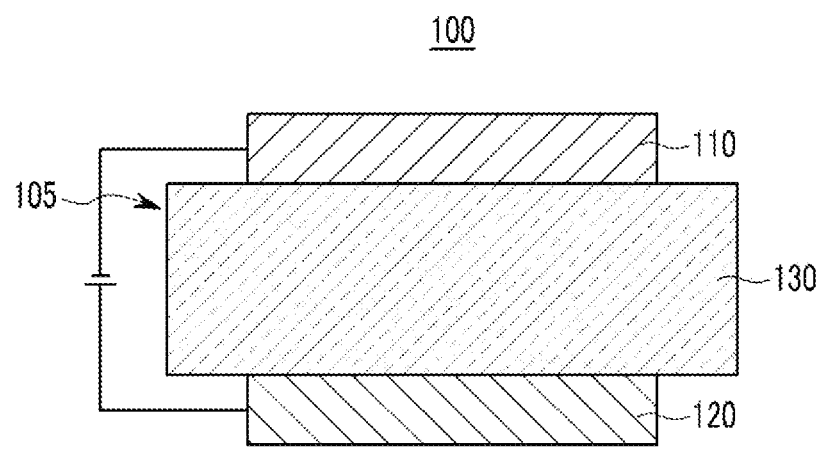
FIGS. 1 and 2 are cross-sectional views of organic light emitting diodes according to embodiments, respectively.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In addition, in specific examples, "substituted" refers to replacement of at least one hydrogen of a substituent or a compound by deuterium, a C1 to C20 alkyl group, a C6 to C30 aryl group, or a cyano group. In addition, in specific examples, "substituted" refers to replacement of at least one hydrogen of a substituent or a compound by deuterium, a C1 to C5 alkyl group, a C6 to C18 aryl group, or a cyano group. In addition, in specific examples, "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

As used herein, when a definition is not otherwise provided, "hetero" refers to one including one to three heteroatoms selected from N, O, S, P, and Si, and remaining carbons in one functional group.

As used herein, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like, a group in which two or more hydrocarbon aromatic moieties may be linked by a sigma bond, for example a biphenyl group, a terphenyl group, a quarterphenyl group, and the like, and a group in which two or more hydrocarbon aromatic moieties are fused directly or indirectly to provide a non-aromatic fused ring, for example, a fluorenyl group, and the like.

The aryl group may include a monocyclic, polycyclic or fused ring polycyclic (i.e., rings sharing adjacent pairs of carbon atoms) functional group.

As used herein, "heterocyclic group" is a generic concept of a heteroaryl group, and may include at least one heteroatom selected from N, O, S, P, and Si instead of carbon (C) in a ring such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof.

In the present specification, hole characteristics refer to an ability to donate an electron to form a hole when an electric field is applied and that a hole formed in the anode may be easily injected into the light emitting layer and transported in the light emitting layer due to conductive characteristics according to the highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to the lowest unoccupied molecular orbital (LUMO) level.

Hereinafter, a compound for an organic optoelectronic device according to an embodiment is described.

The compound for the organic optoelectronic device according to an embodiment may be represented by, e.g., Chemical Formula 1A or Chemical Formula 1B.

[Chemical Formula 1A]

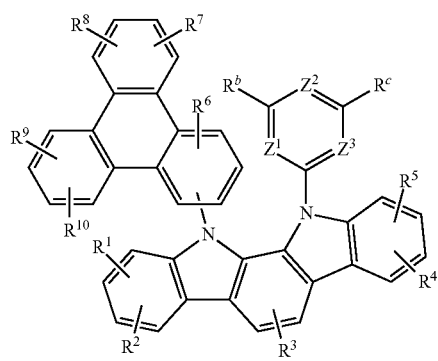

[Chemical Formula 1B]

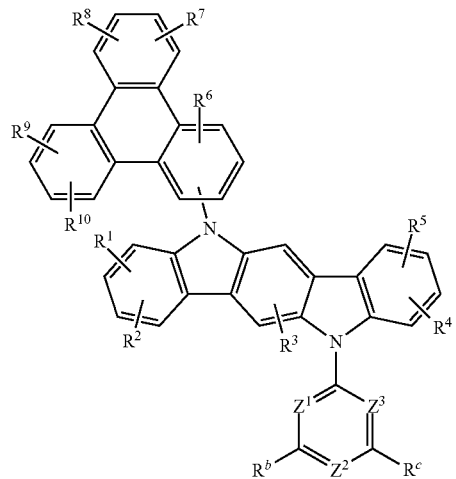

In Chemical Formula 1A and Chemical Formula 1B, $Z^1$ to $Z^3$ may each independently be, e.g., N or $CR^a$. In an implementation, at least two of $Z^1$ to $Z^3$ may be N.

$R^a$ and $R^1$ to $R^{10}$ may each independently be or include, e.g., hydrogen, deuterium, a substituted or unsubstituted C1 to C10 alkyl group, or a substituted or unsubstituted C6 to C20 aryl group.

$R^b$ and $R^c$ may each independently be or include, e.g., a substituted or unsubstituted C6 to C20 aryl group or a substituted or unsubstituted C2 to C30 heterocyclic group.

In the compound represented by Chemical Formula 1A or Chemical Formula 1B, a nitrogen-containing hexagonal ring moiety and an indolocarbazole moiety may be simultaneously introduced or included to implement bipolar characteristics and achieve stability.

In an implementation, by also including a triphenylene moiety, holes and electrons injected into the device may be delocalized (stabilized) to realize device characteristics of low driving, high efficiency, and long life-span.

The nitrogen-containing hexagonal ring moiety may be, e.g., a pyrimidinyl group or a triazinyl group.

In an implementation, Chemical Formula 1A may be, e.g., represented by one of Chemical Formula 1A-1 to Chemical Formula 1A-3.

[Chemical Formula 1A-1]

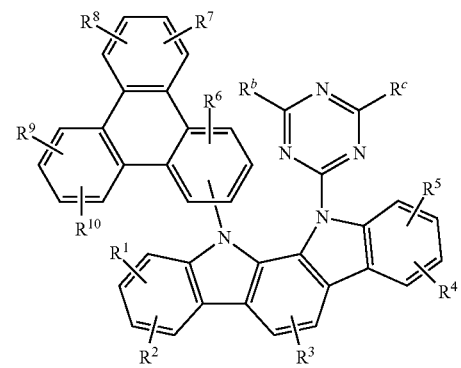

[Chemical Formula 1A-2]

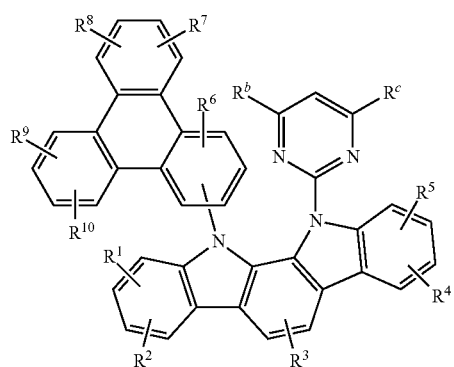

[Chemical Formula 1A-3]

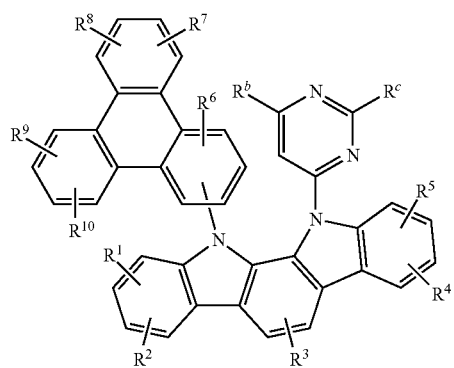

In Chemical Formula 1A-1 to Chemical Formula 1A-3, $Z^1$ to $Z^3$, $R^1$ to $R^{10}$, $R^b$, and $R^c$ may be defined the same as described above.

In an implementation, Chemical Formula 1B may be, e.g., represented by one of Chemical Formula 1B-1 to Chemical Formula 1B-3.

[Chemical Formula 1B-1]

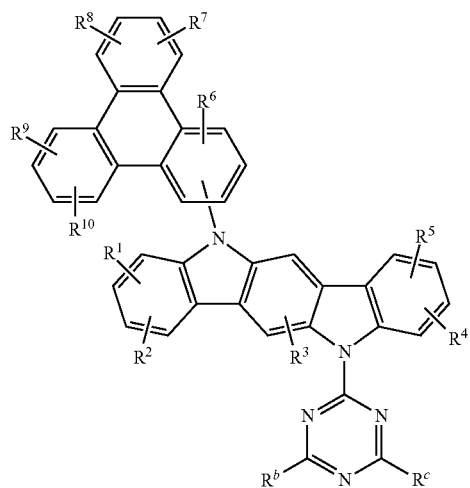

[Chemical Formula 1B-2]

(image on right side, top)

[Chemical Formula 1B-3]

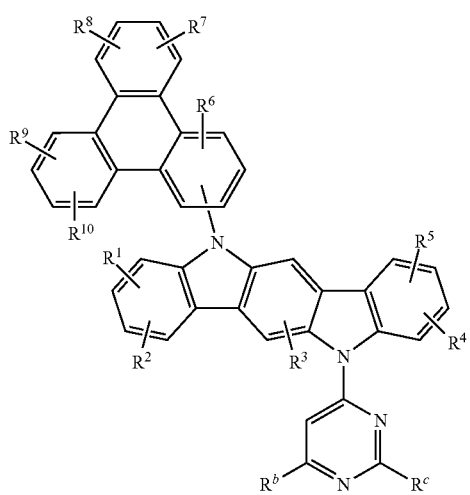

In Chemical Formula 1B-1 to Chemical Formula 1B-3, $Z^1$ to $Z^3$, $R^1$ to $R^{10}$, $R^b$, and $R^c$ may be defined the same as described above.

The compound for the organic optoelectronic device according to an embodiment may be represented by, e.g., Chemical Formula 1A-1 or Chemical Formula 1B-1.

In an implementation, Chemical Formula 1A-1 may be, e.g., represented by Chemical Formula 1A-1-a or Chemical Formula 1A-1-b.

[Chemical Formula 1A-1-a]

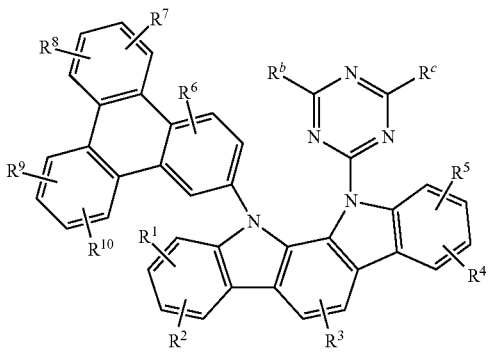

[Chemical Formula 1A-1-b]

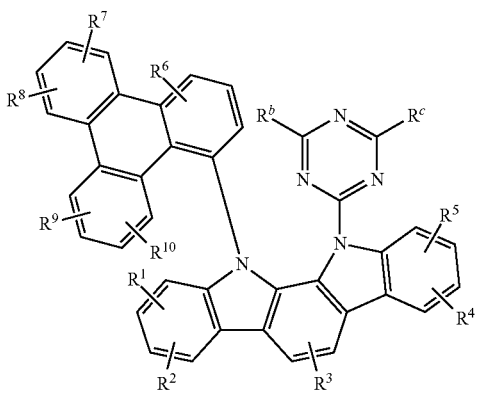

In Chemical Formula 1A-1-a and Chemical Formula 1A-1-b, $R^1$ to $R^{10}$, $R^b$, and $R^c$ may be defined the same as described above.

In an implementation, Chemical Formula 1B-1 may be, e.g, represented by Chemical Formula 1B-1-a or Chemical Formula 1B-1-b.

[Chemcial Formula 1B-1-a]

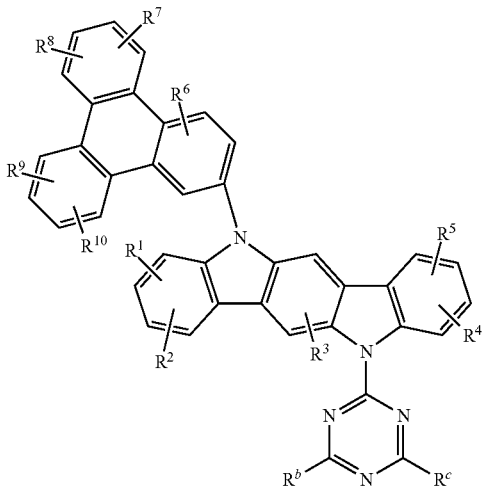

[Chemical Formula 1B-1-b]

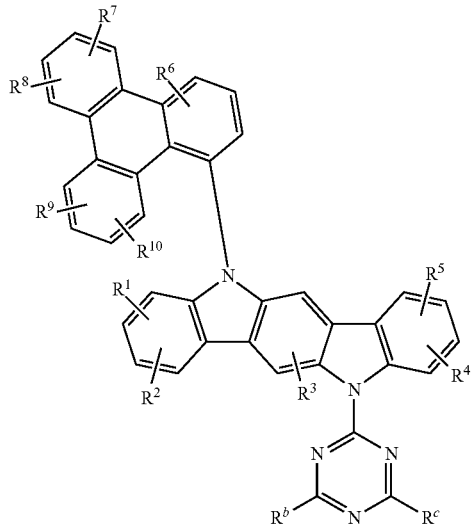

In Chemical Formula 1B-1-a and Chemical Formula 1B-1-b, $R^1$ to $R^{10}$, $R^b$, and $R^c$ may be defined the same as described above.

The compound for the organic optoelectronic device according to a specific embodiment may be represented by Chemical Formula 1A-1-a.

In an implementation, $R^b$ and $R^c$ may each independently be or include, e.g., a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, a substituted or unsubstituted dibenzofuranyl group, a substituted or unsubstituted dibenzothiophenyl group, a substituted or unsubstituted carbazolyl group, or a combination thereof In an implementation, $R^b$ and $R^c$ may each independently be, e.g., a group of Group I.

[Group I]

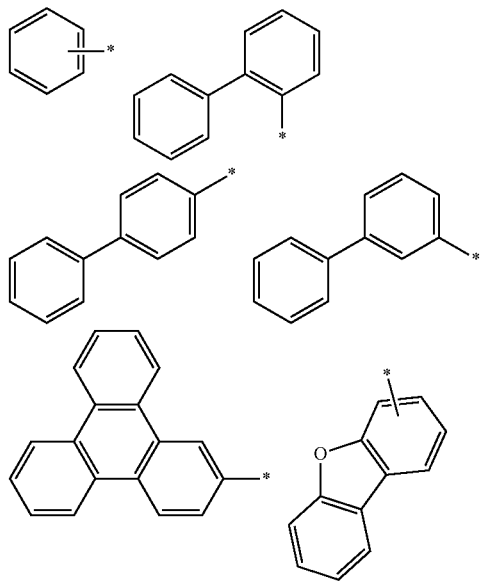

-continued

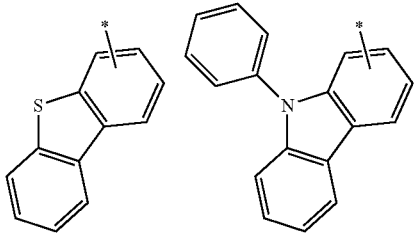

In Group I, * is a linking point.

In an implementation, $R^b$ and $R^c$ may independently be, e.g., a substituted or unsubstituted phenyl group or a substituted or unsubstituted biphenyl group.

In an implementation, the compound for the organic optoelectronic device represented by Chemical Formula 1A or Chemical Formula 1B may be, e.g., a compound of Group 1.

[Group 1]

[A-1]

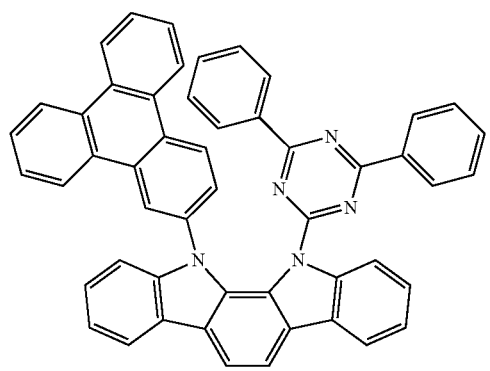

[A-2]

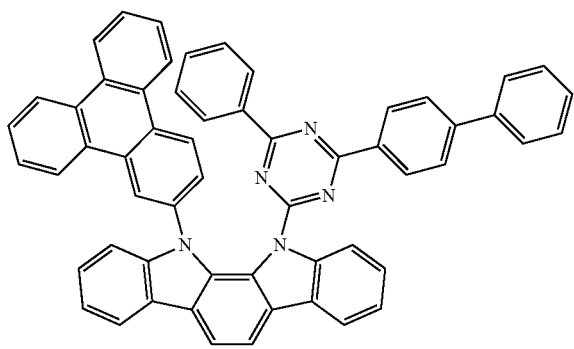

[A-3]

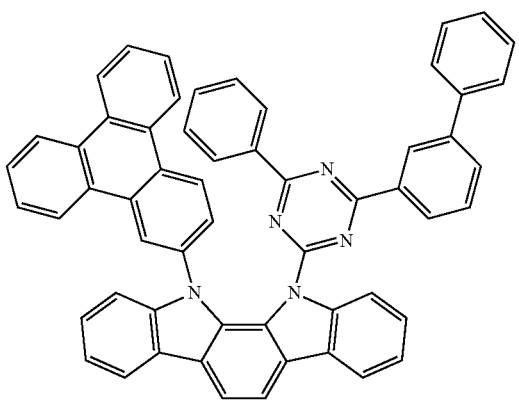

[A-4]

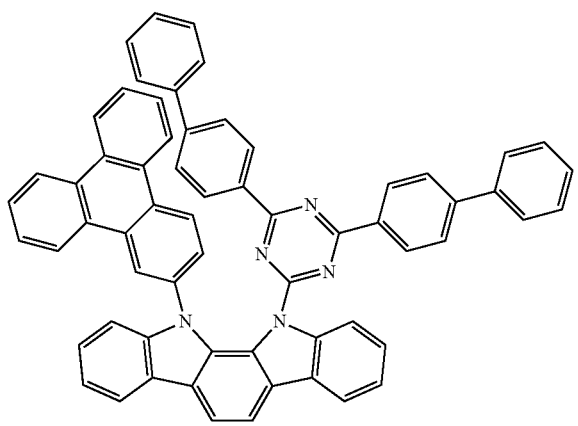

[A-5]

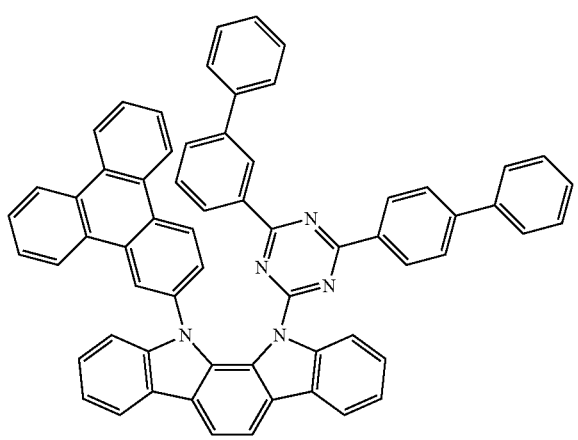

[A-6]
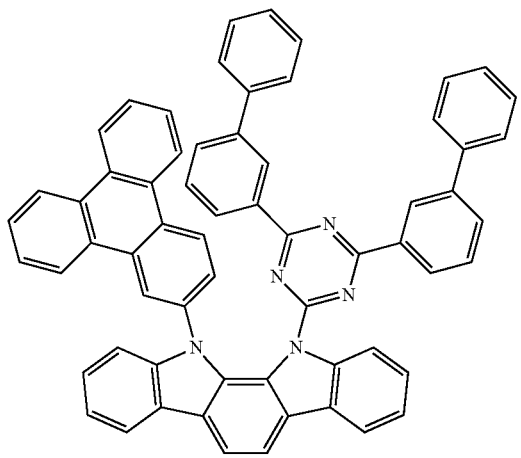
[A-7]
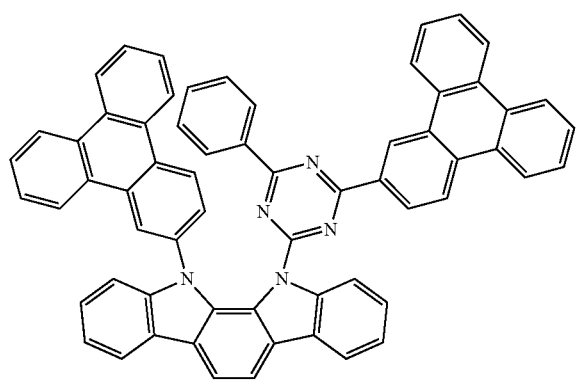
[A-8]
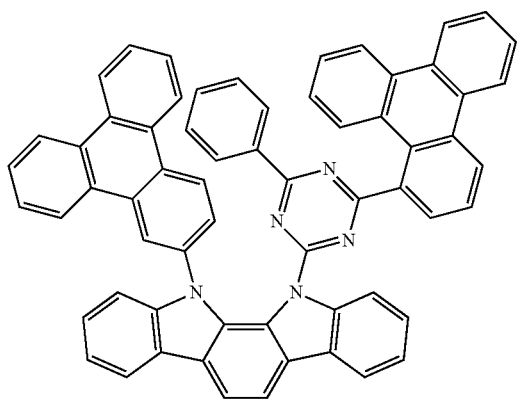
[A-9]
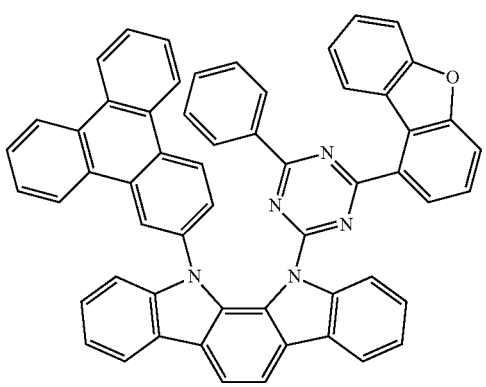
[A-10]
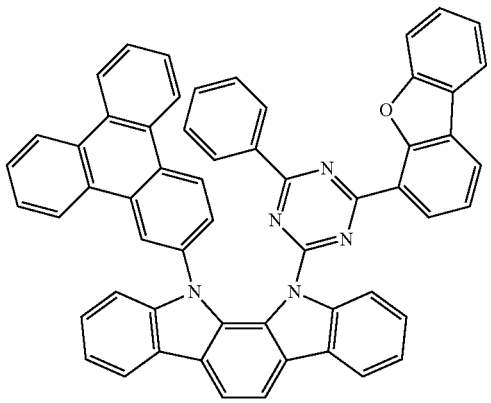
[A-11]
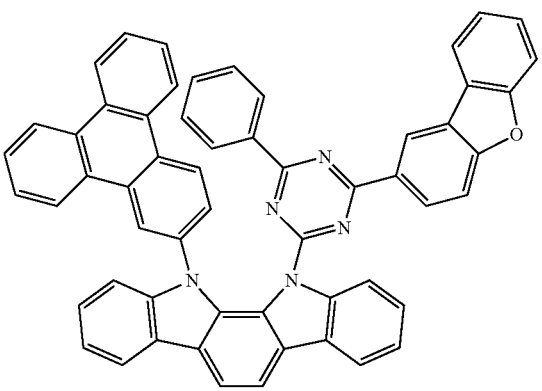
[A-12]
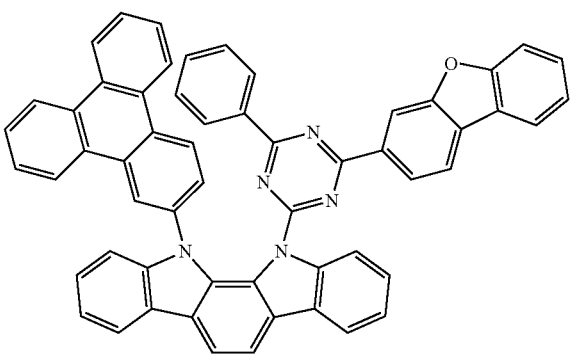

[A-13]
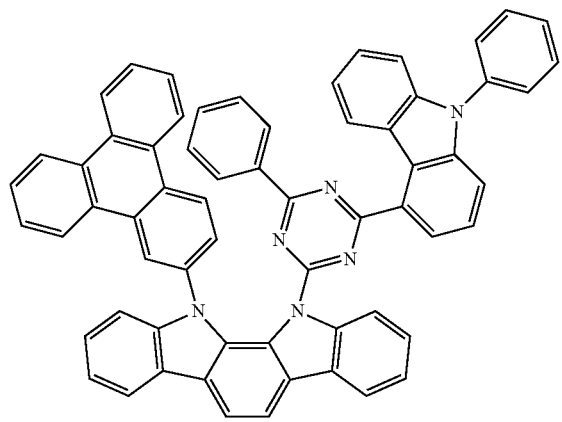
[A-14]
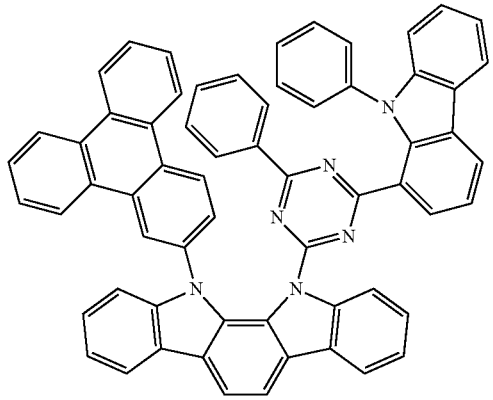
[A-15]
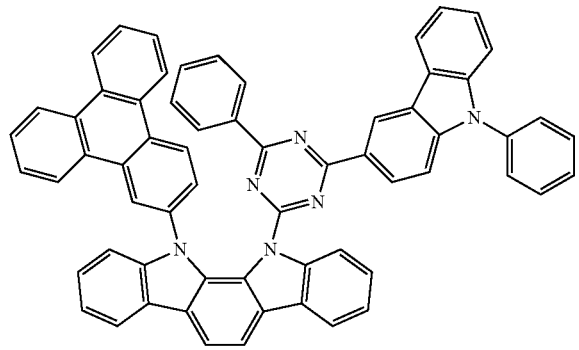
[A-16]
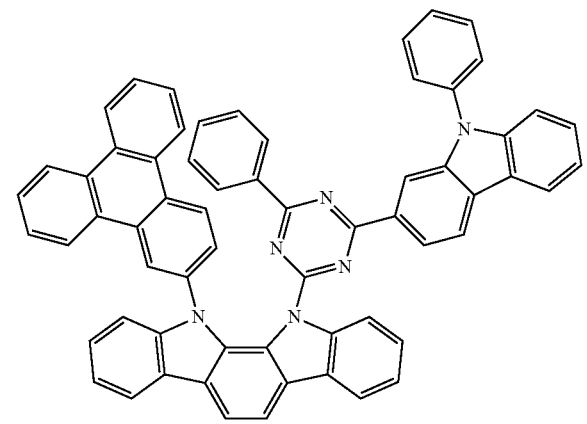
[A-17]
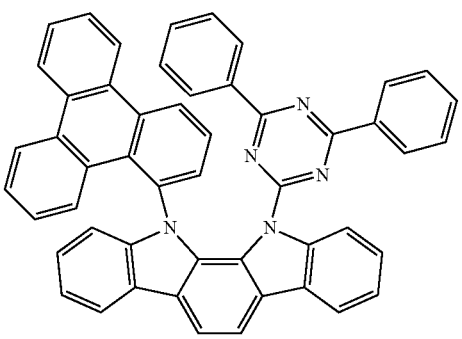
[A-18]
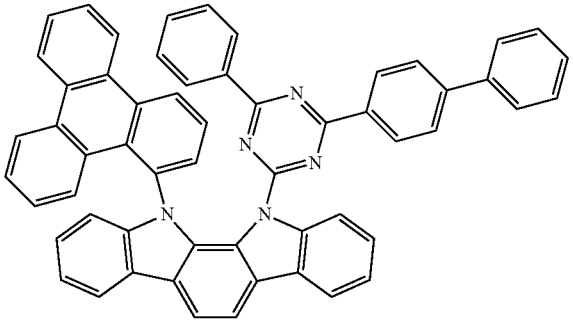
[A-19]
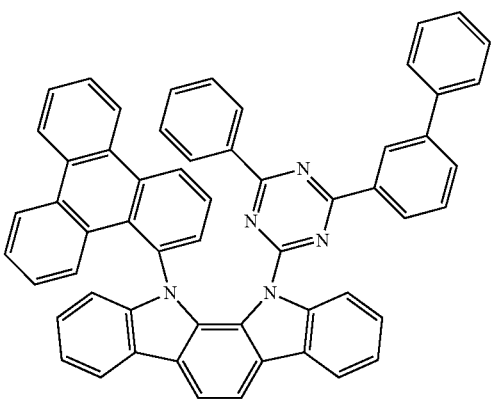

[A-20]
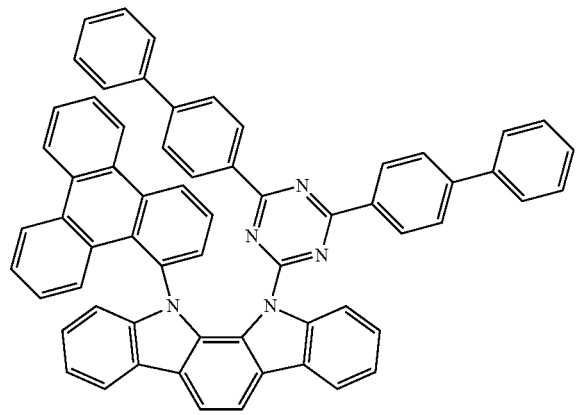
[A-21]
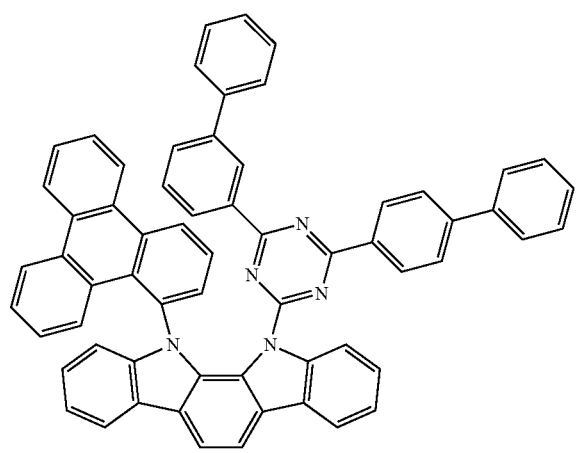
[A-22]
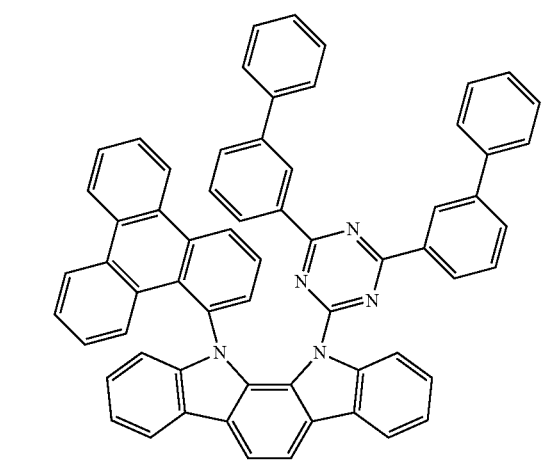
[A-23]
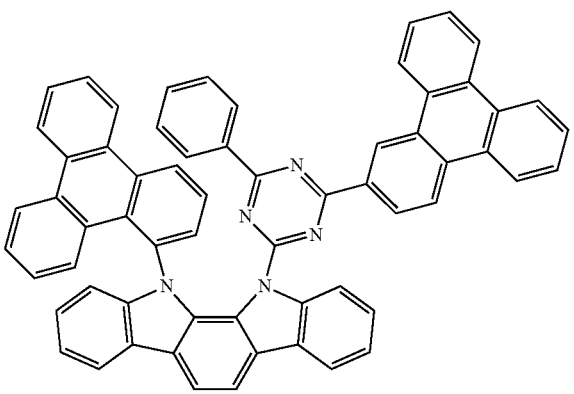
[A-24]
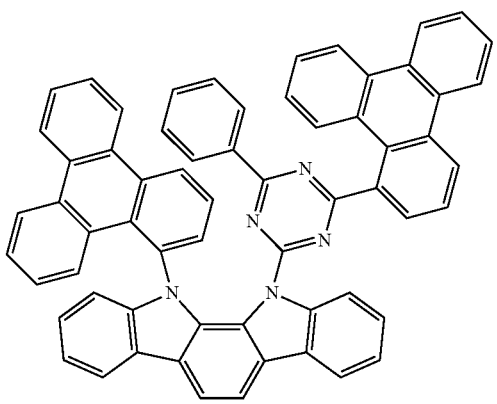
[A-25]
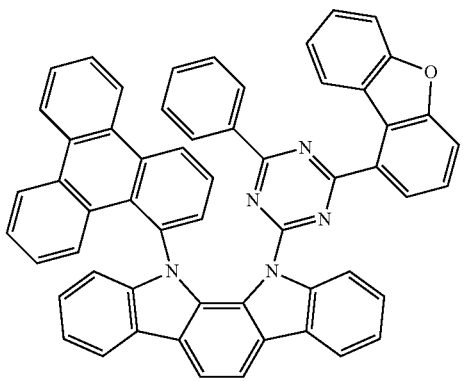
[A-26]
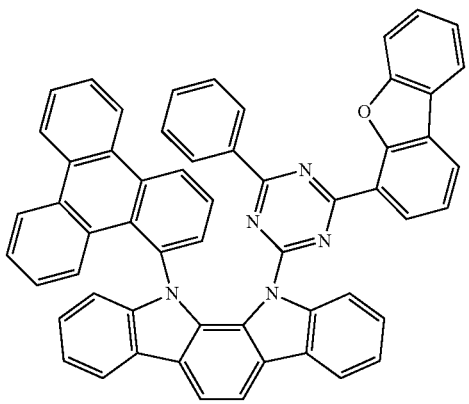

[A-27]
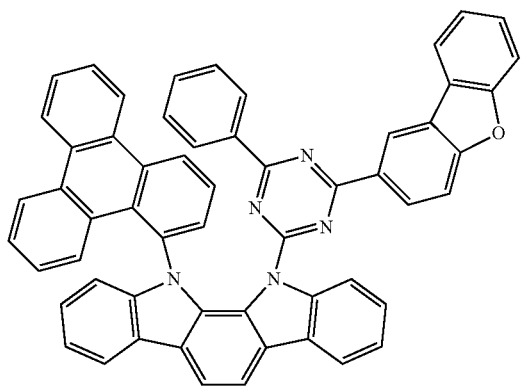
[A-28]
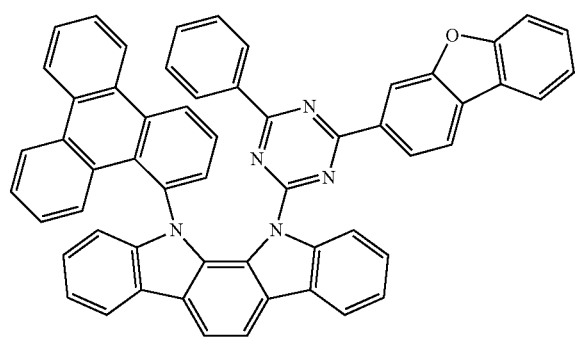
[A-29]
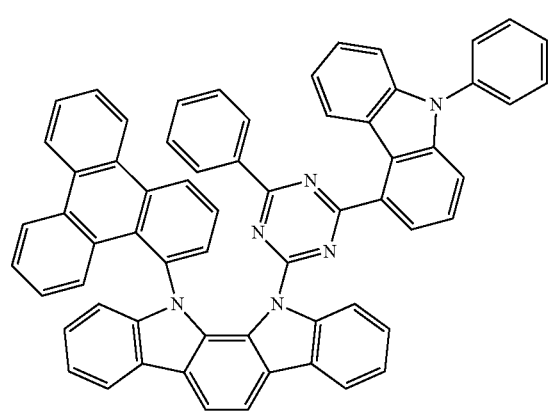
[A-30]
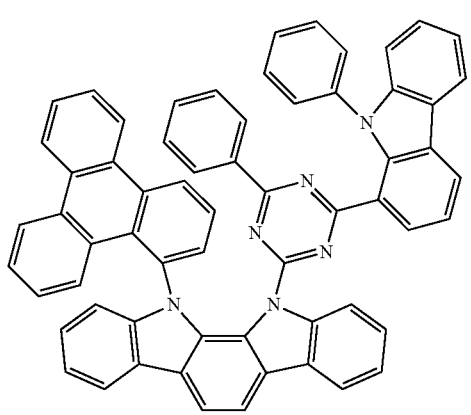
[A-31]
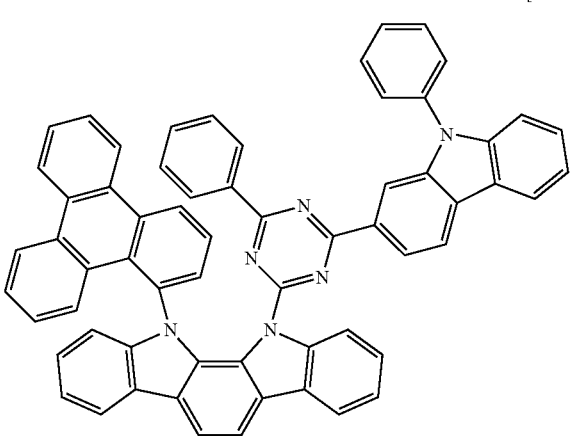
[A-32]
[A-33]
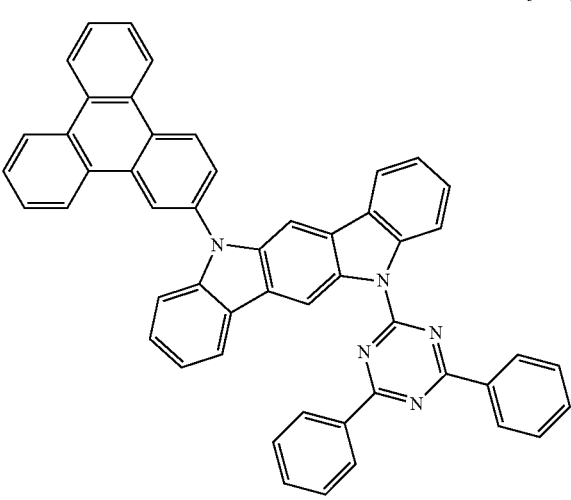

[A-34]
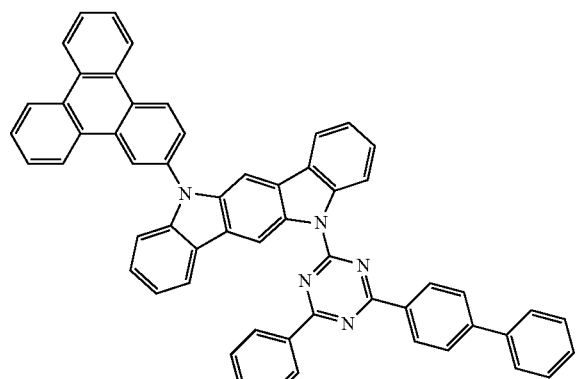
[A-37]
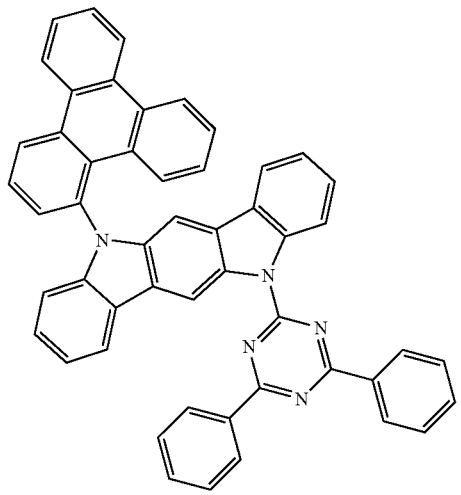
[A-35]
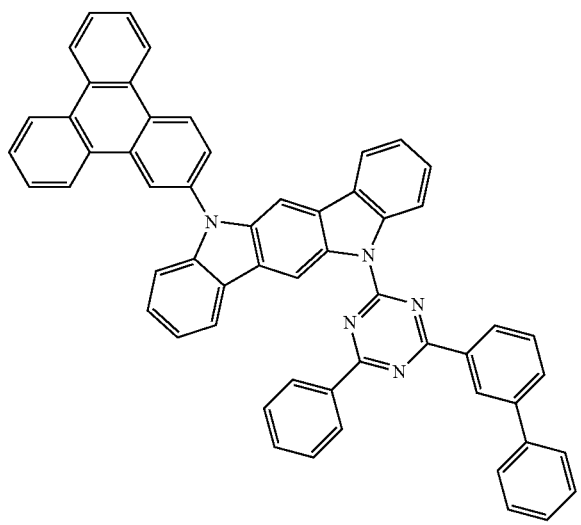
[A-38]
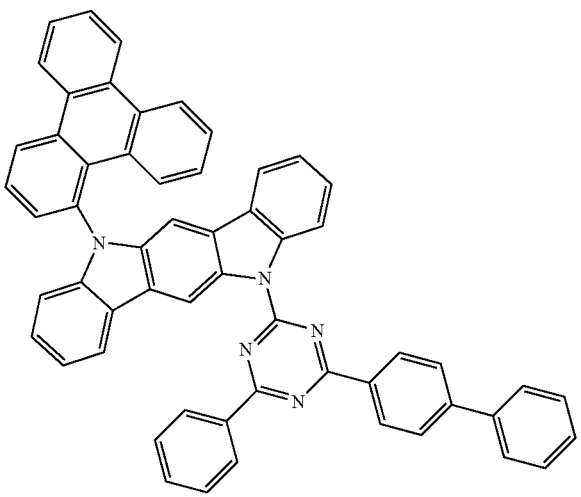
[A-36]
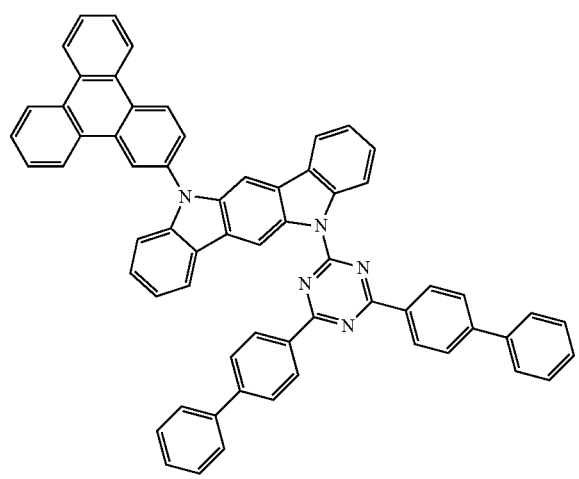
[A-39]
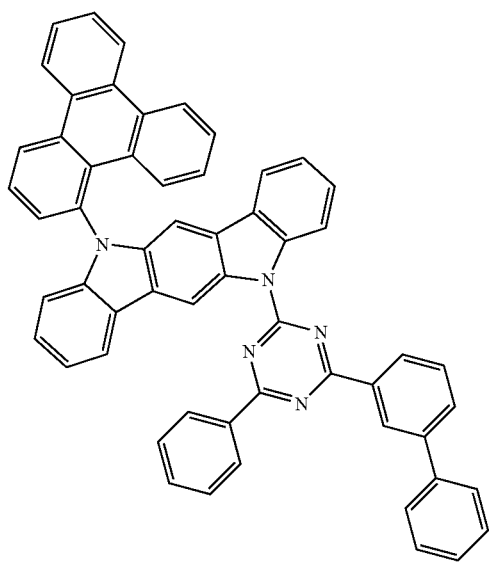

-continued

[A-40]

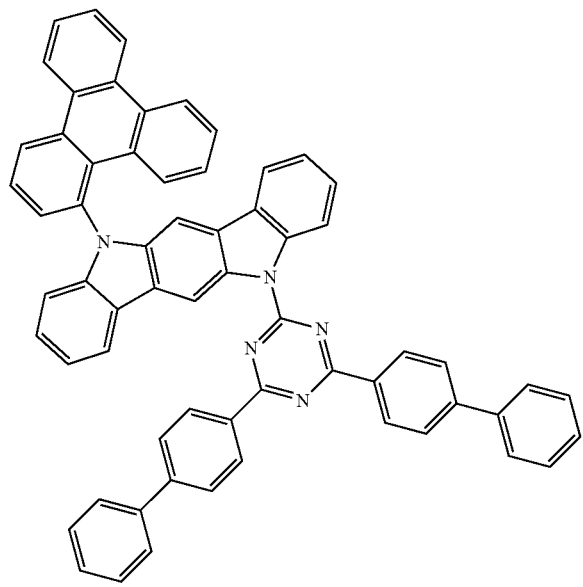

A composition for an organic optoelectronic device according to an embodiment includes the aforementioned compound (hereinafter referred to as "a first compound" or "a first compound for an organic optoelectronic device"), and a second compound for a an optoelectronic device represented by Chemical Formula 2.

[Chemical Formula 2]

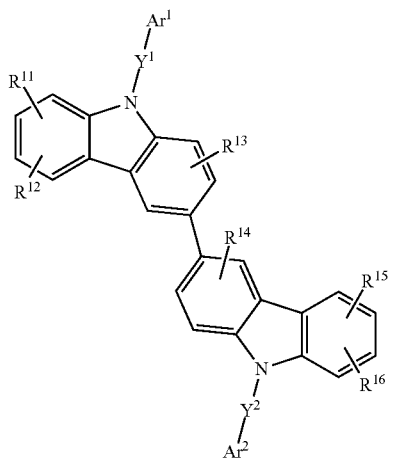

In Chemical Formula 2, $Y^1$ and $Y^2$ may each independently be or include, e.g., a single bond or a substituted or unsubstituted C6 to C20 arylene group.

$Ar^1$ and $Ar^2$ may each independently be or include, e.g., a substituted or unsubstituted C6 to C20 aryl group or a substituted or unsubstituted C2 to C30 heterocyclic group.

$R^{11}$ to $R^{16}$ may each independently be or include, e.g., hydrogen, deuterium, a substituted or unsubstituted C1 to C10 alkyl group, a substituted or unsubstituted C6 to C20 aryl group, a substituted or unsubstituted C2 to C30 heterocyclic group, a cyano group, or a combination thereof.

The second compound, which may be a material having fast and stable hole transfer characteristics, may be used in a light emitting layer together with the first compound (having fast and stable electron transfer characteristics) to provide a charge balance, to thereby have a glass transition temperature relative to a molecular weight to provide low driving and long life-span characteristics.

In an implementation, $Ar^1$ and $Ar^2$ of Chemical Formula 2 may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted triphenylenyl group, a substituted or unsubstituted carbazolyl group, a substituted or unsubstituted dibenzothiophenyl group, a substituted or unsubstituted dibenzofuranyl group, a substituted or unsubstituted fluorenyl group, or a substituted or unsubstituted pyridinyl group. In an implementation, $Y^1$ and $Y^2$ may each independently be, e.g., a single bond, a substituted or unsubstituted phenylene group, or a substituted or unsubstituted biphenylene group. In an implementation, $R^{10}$ to $R^{15}$ may each independently be, e.g., hydrogen, deuterium, or a substituted or unsubstituted C6 to C12 aryl group.

The "substituted" of Chemical Formula 2 may refer to replacement of at least one hydrogen by deuterium, a C1 to C4 alkyl group, a C6 to C18 aryl group, or a C2 to C30 heteroaryl group.

In an implementation, the moieties *—$Y^1$—$Ar^1$ and *—$Y^2$—$Ar^2$ of Chemical Formula 2 may each independently be, e.g., a moiety of Group II.

[Group II]

B-1

B-2

B-3

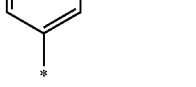

B-4

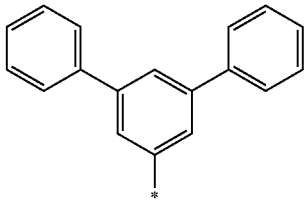

-continued
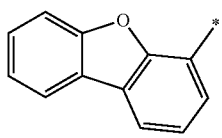
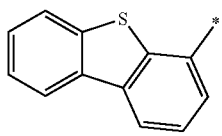
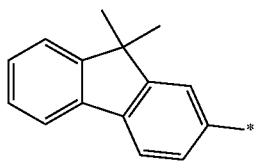
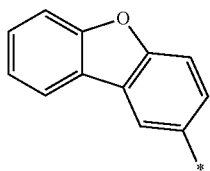
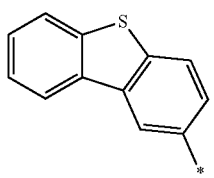
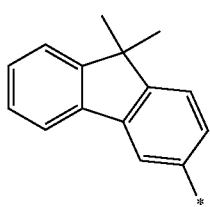
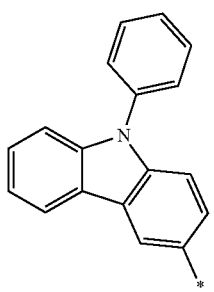
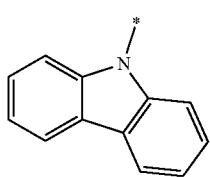
B-5
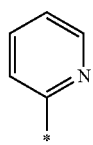
B-6
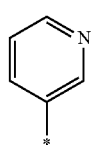
B-7
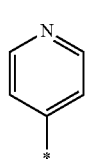
B-8
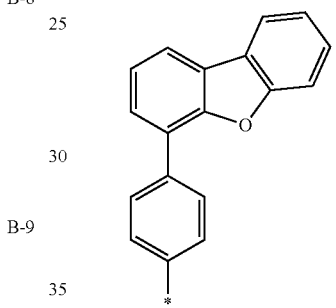
B-9
B-10
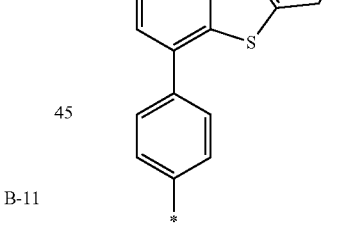
B-11
B-12
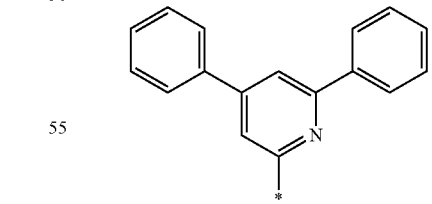
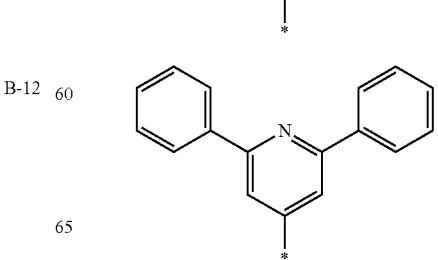
B-13
B-14
B-15
B-16
B-17
B-18
B-19

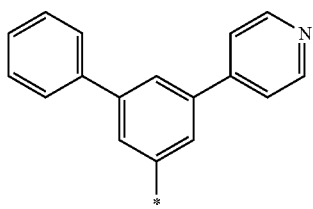
B-20
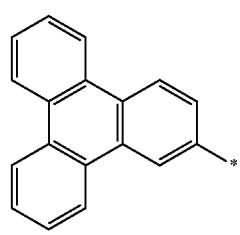
B-25
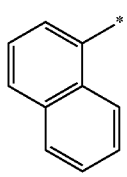
B-21
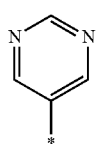
B-22
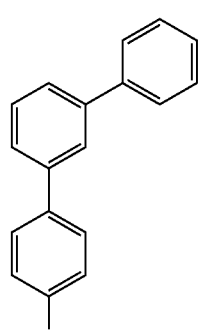
B-26
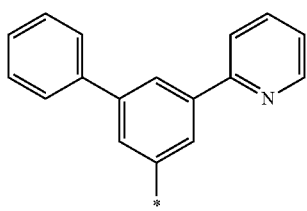
B-23
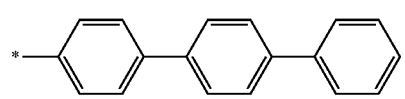
B-27
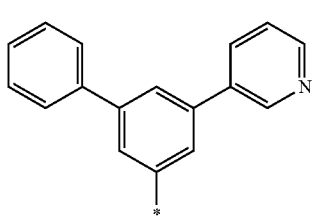
B-24
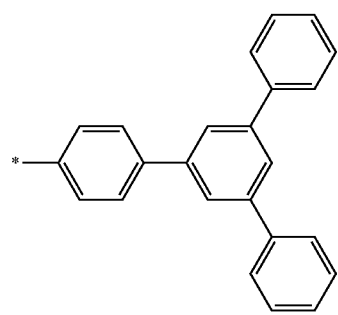
B-28

In Group II, * is a linking point.
In an implementation, the compound represented by Chemical Formula 2 may be, e.g., a compound of Group 2.
[Group 2]
[B-1]
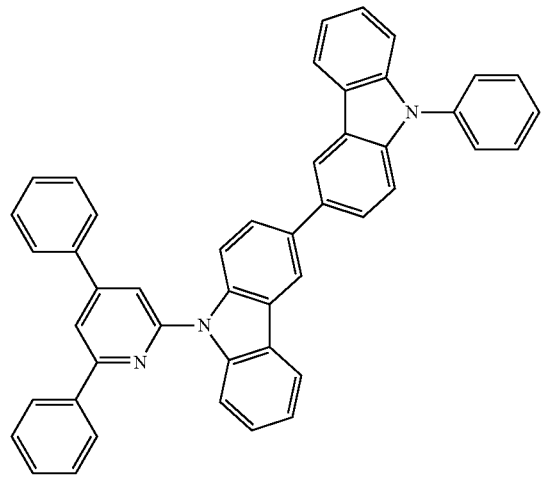
[B-2]
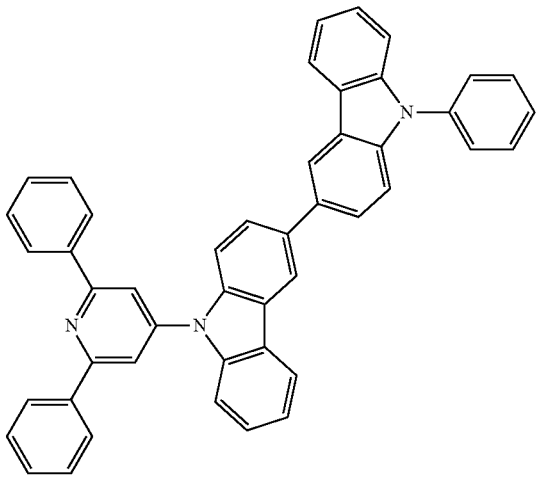
[B-3]
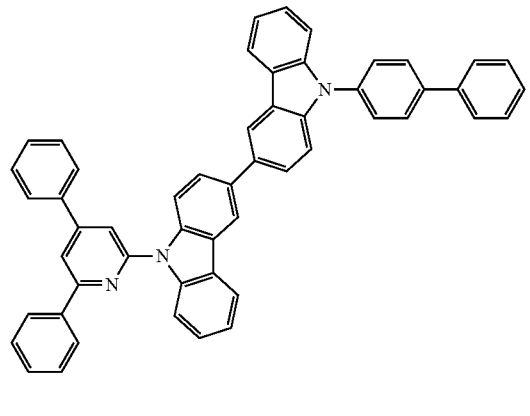
[B-4]
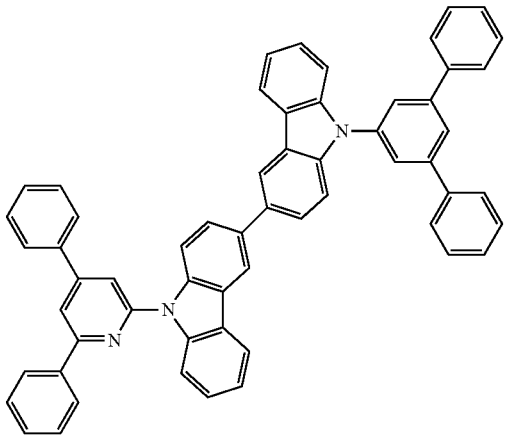
[B-5]
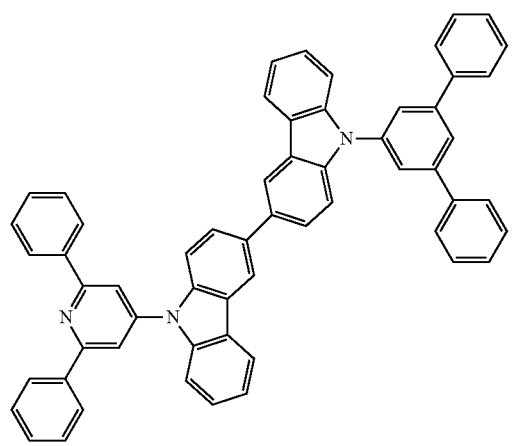
[B-6]
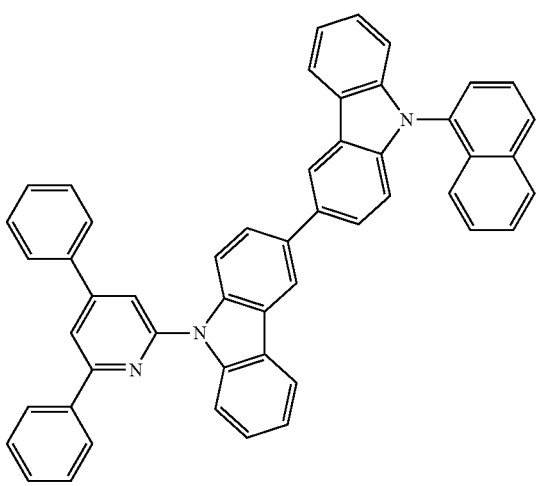

-continued
[B-7]
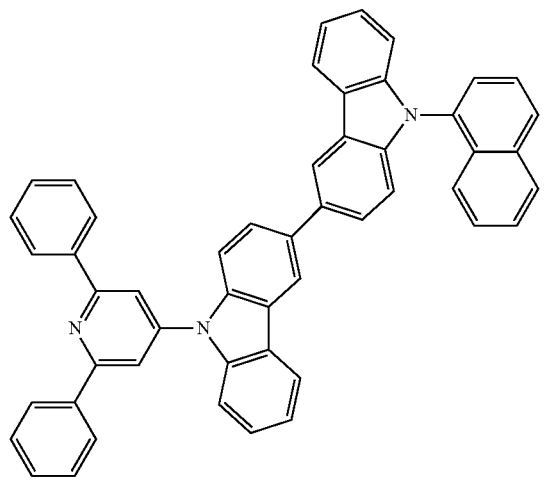
[B-8]
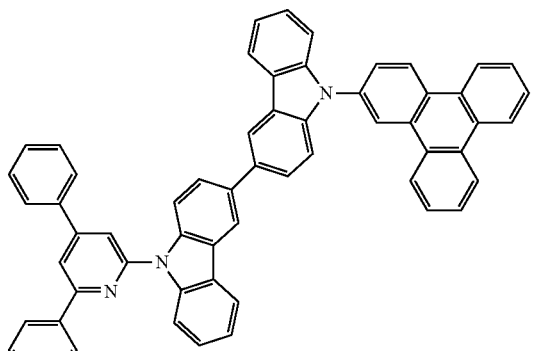
[B-9]
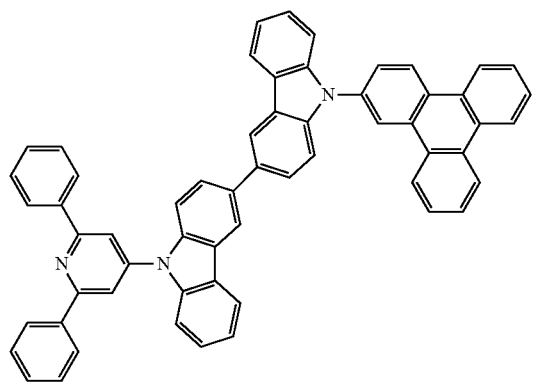
[B-10]
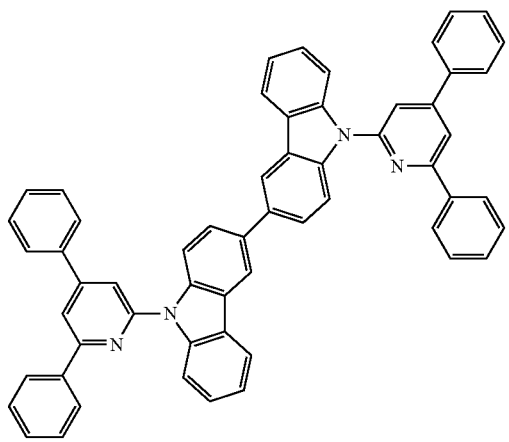
[B-11]
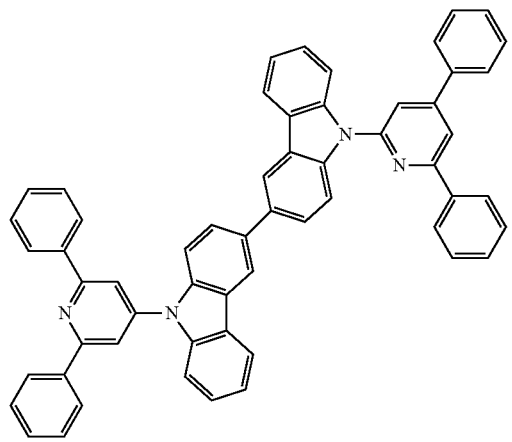
[B-12]
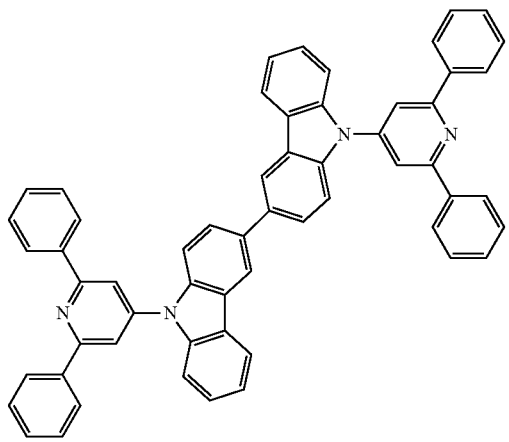

-continued
[B-13]
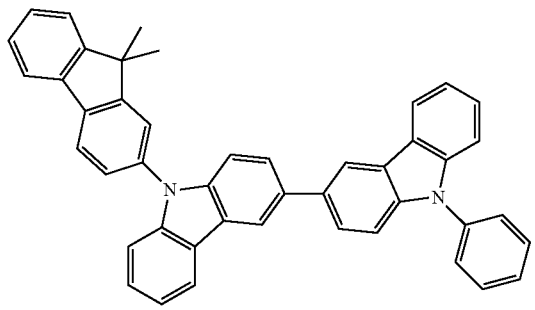
[B-14]
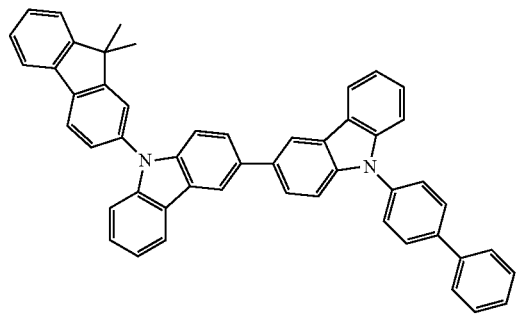
[B-15]
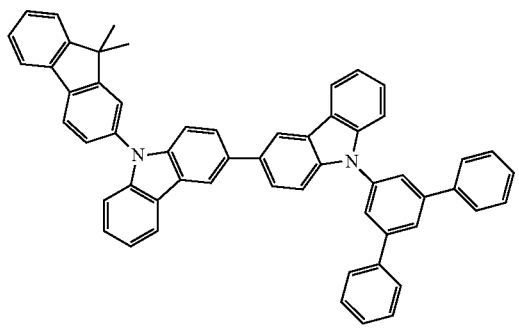
[B-16]
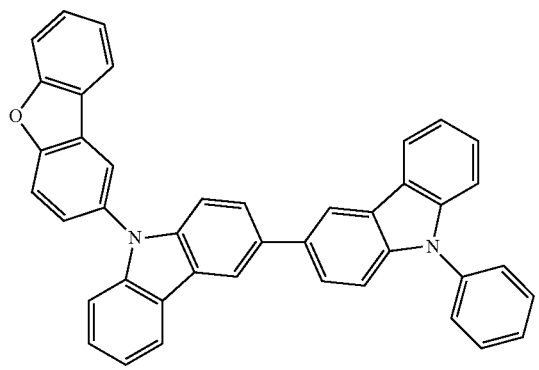
[B-17]
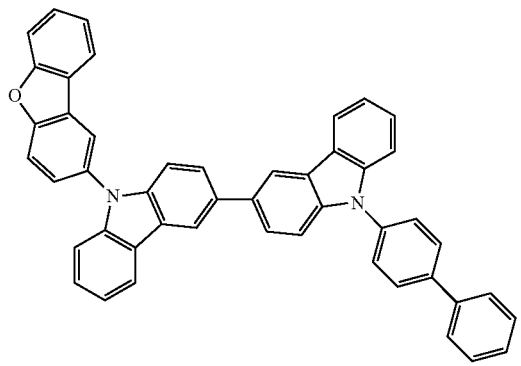
[B-18]
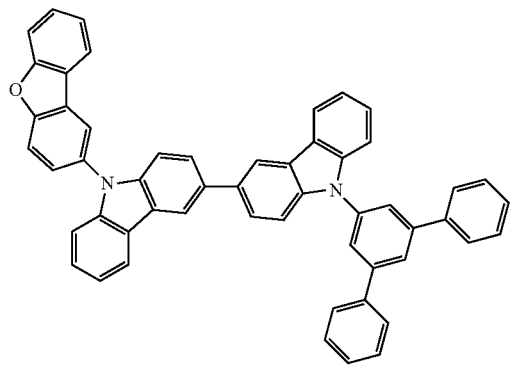
[B-19]
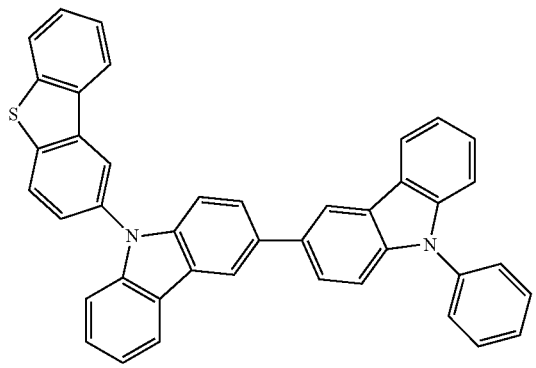
[B-20]
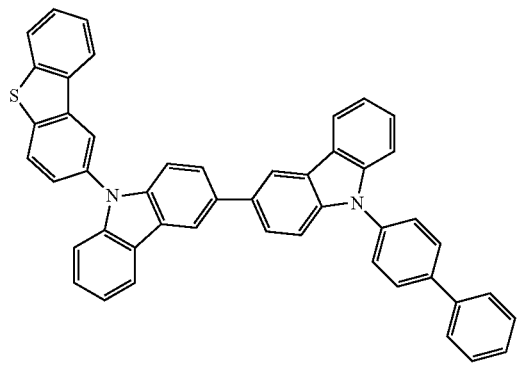

-continued
[B-21]
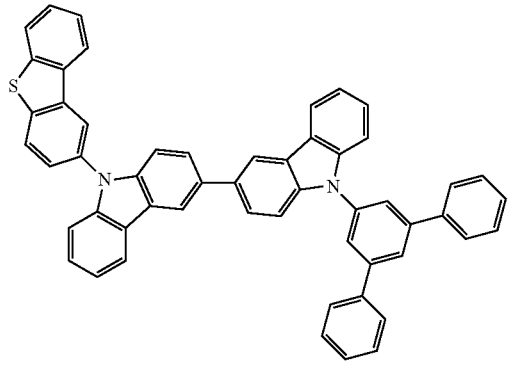
[B-22]
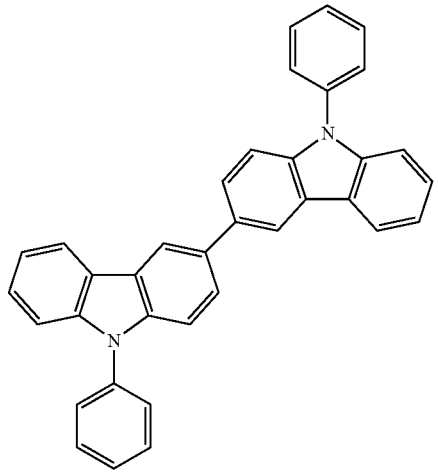
[B-23]
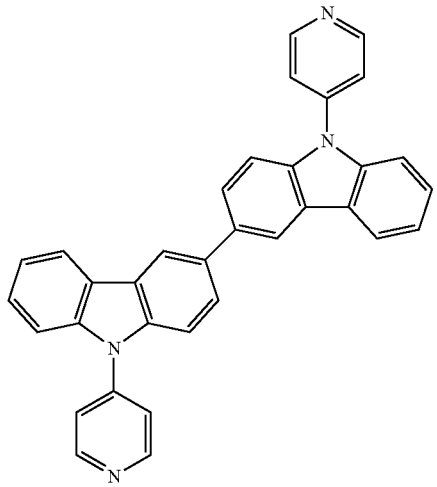
[B-24]
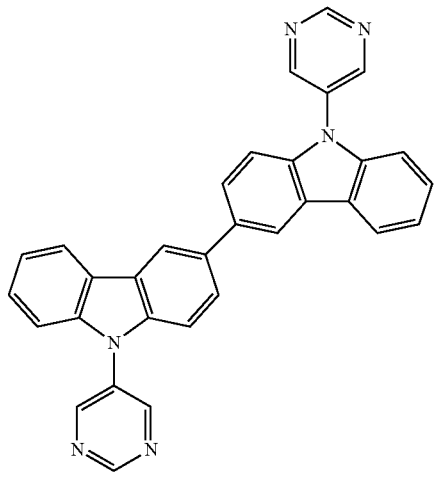
[B-25]
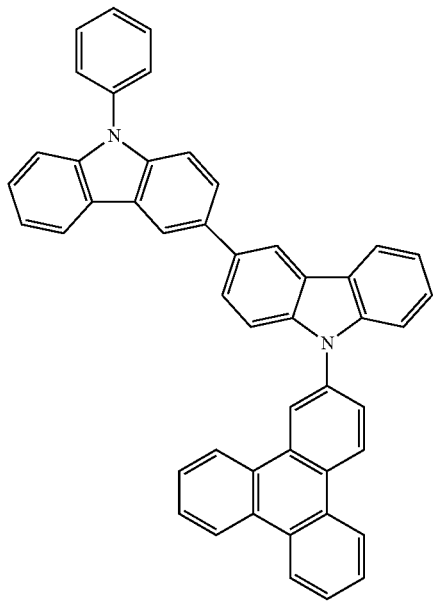
[B-26]
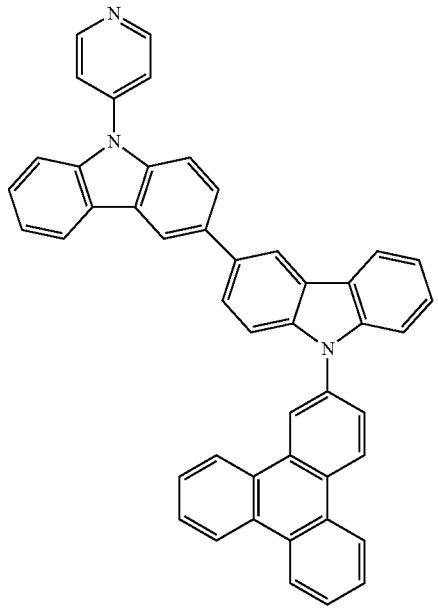

-continued
[B-27]
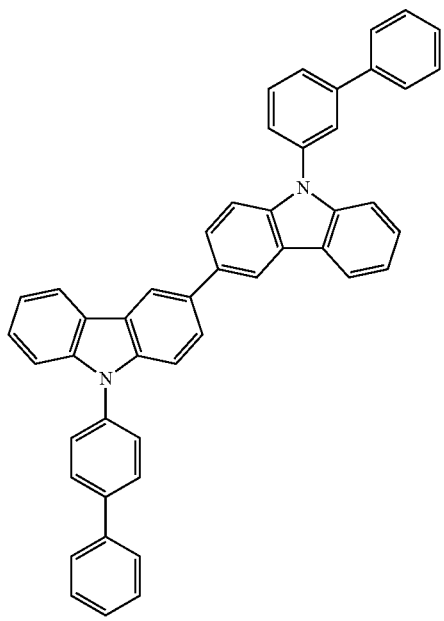
[B-28]
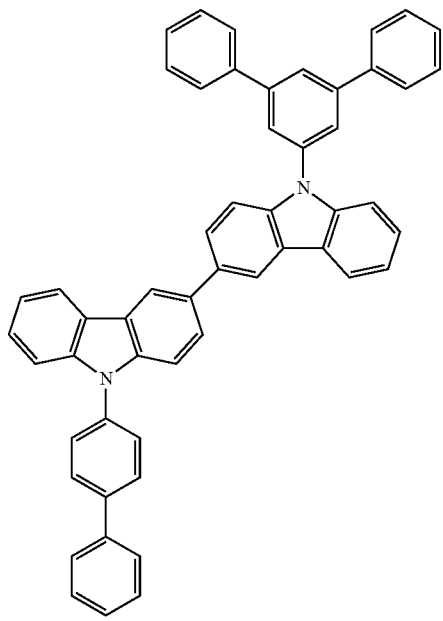
[B-29]
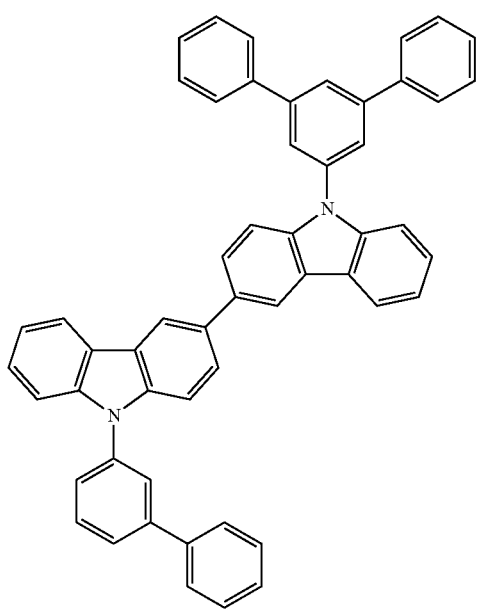
[B-30]
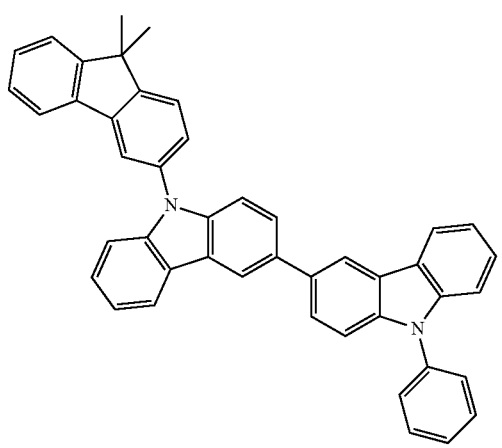

-continued
[B-31]
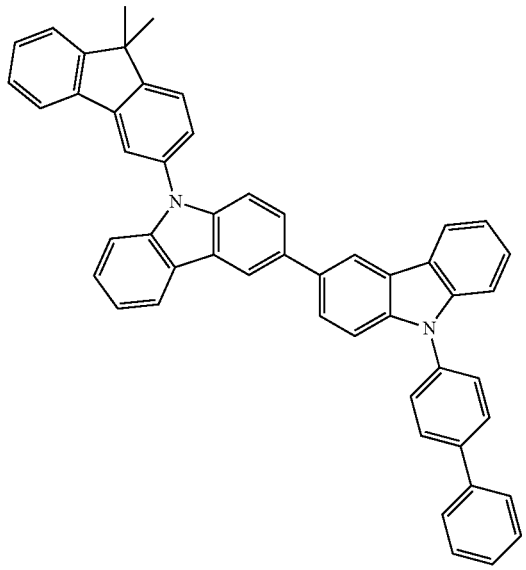
[B-32]
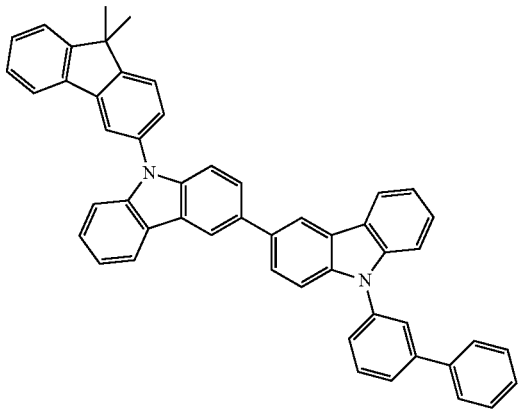
[B-33]
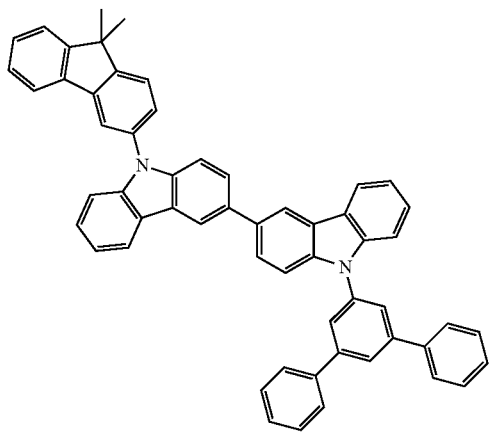
[B-34]
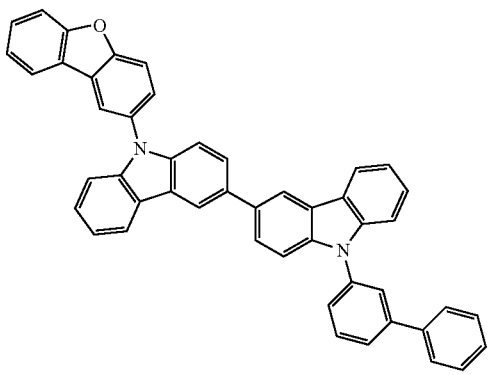
[B-35]
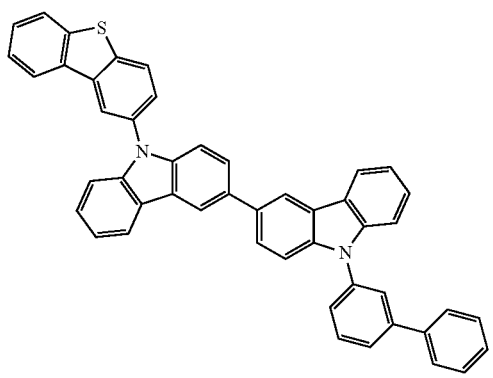
[B-36]
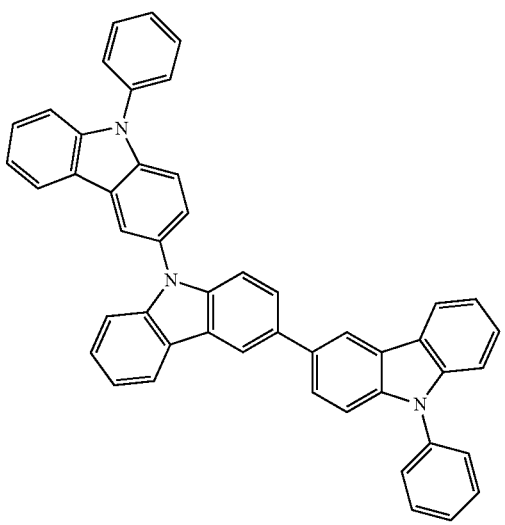

-continued
[B-37]
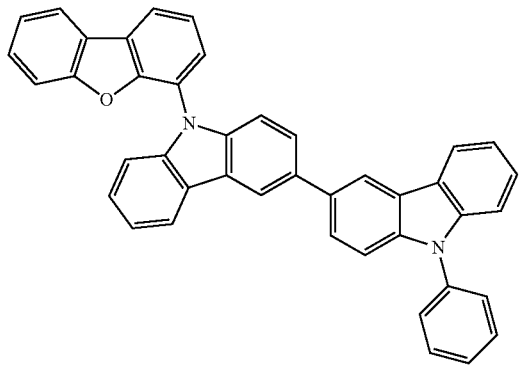
[B-38]
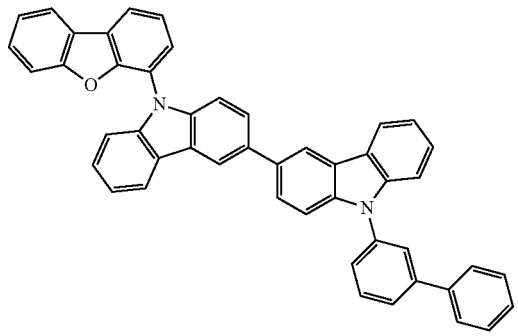
[B-39]
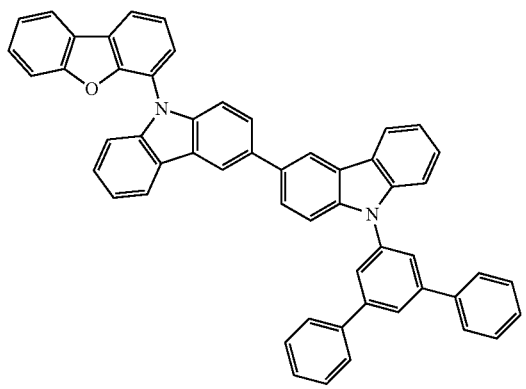
[B-40]
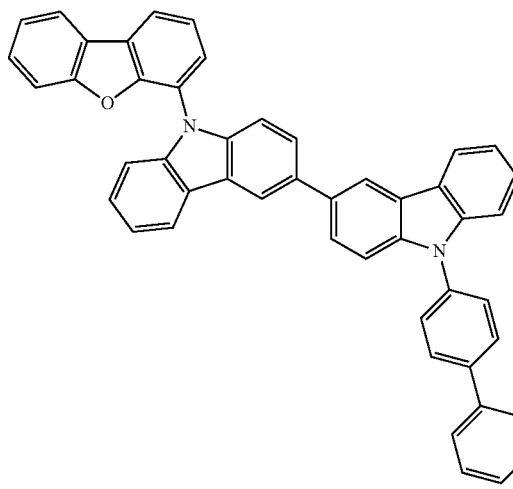
[B-41]
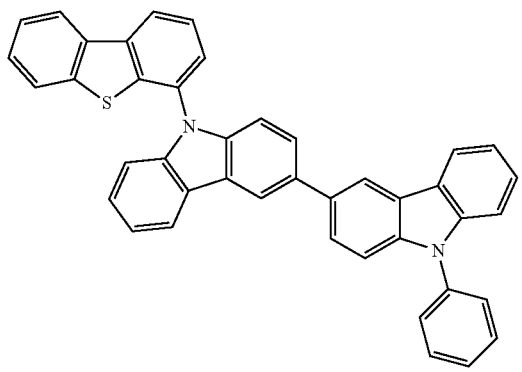
[B-42]
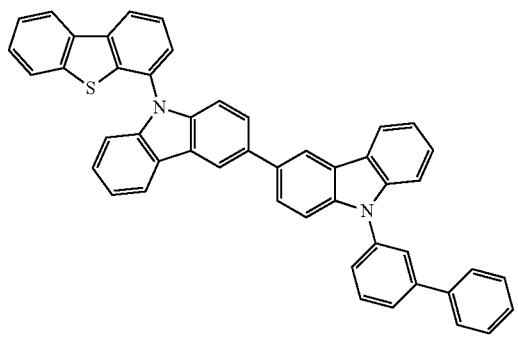

-continued
[B-43]
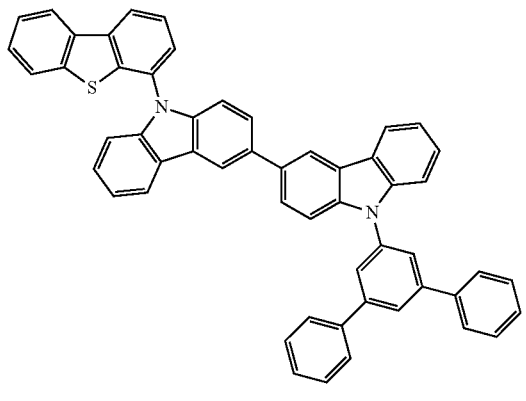
[B-44]
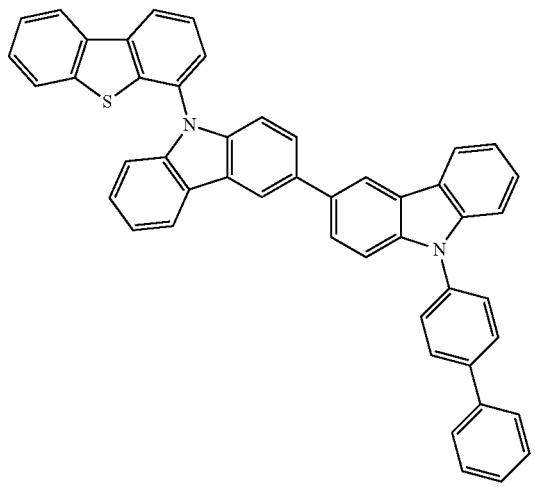
[B-45]
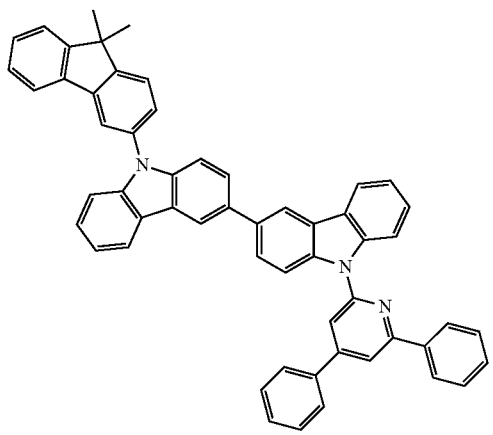
[B-46]
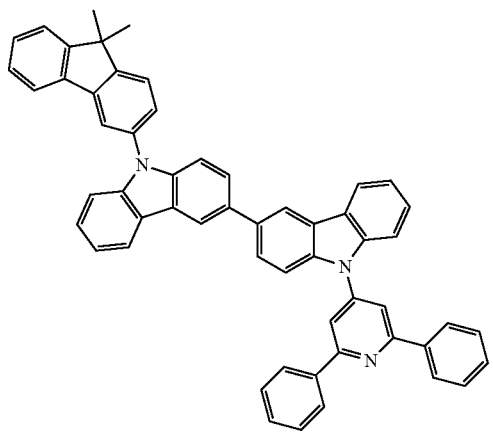
[B-47]
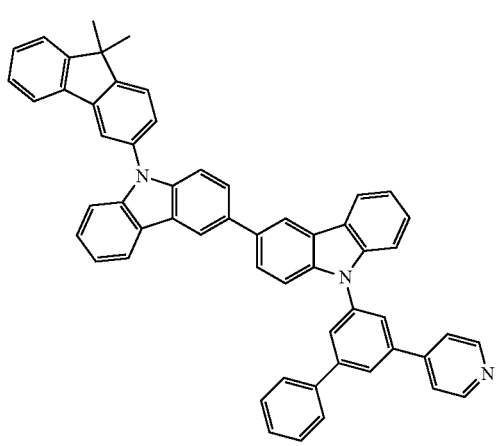
[B-48]
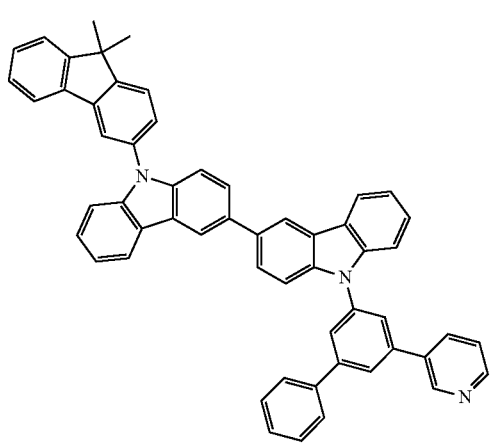

-continued
[B-49]
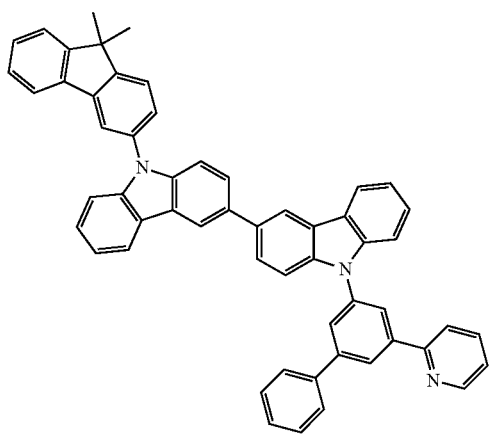
[B-50]
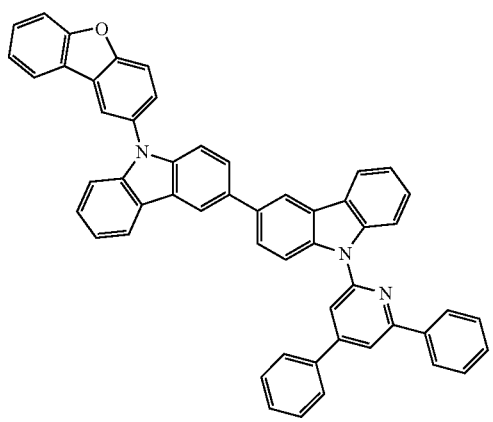
[B-51]
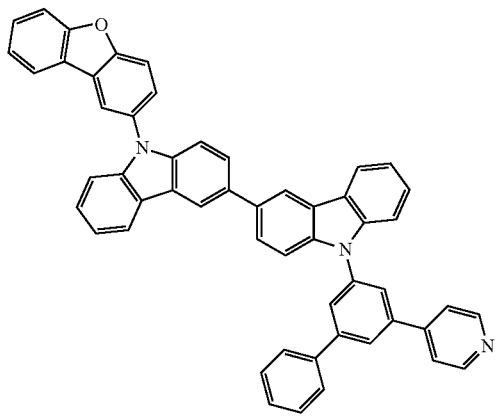
[B-52]
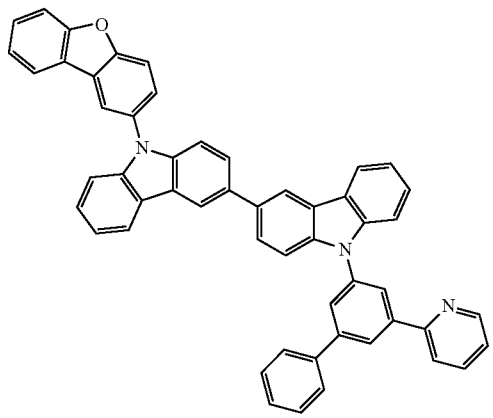
[B-53]
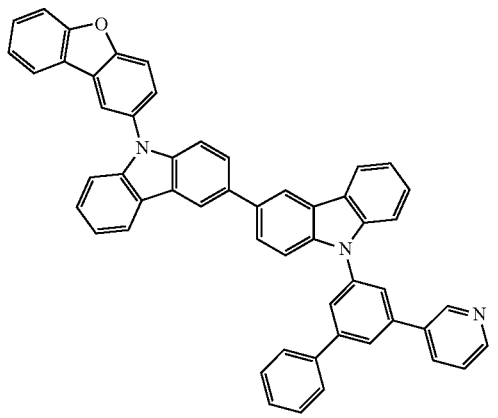
[B-54]
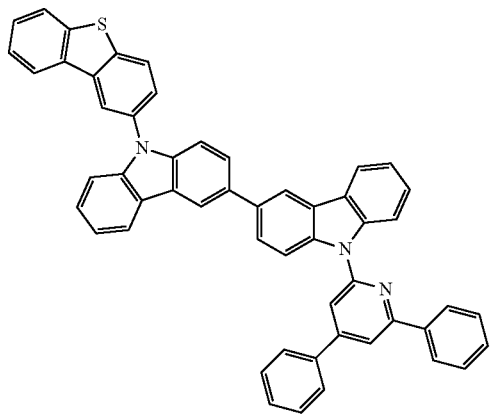

-continued
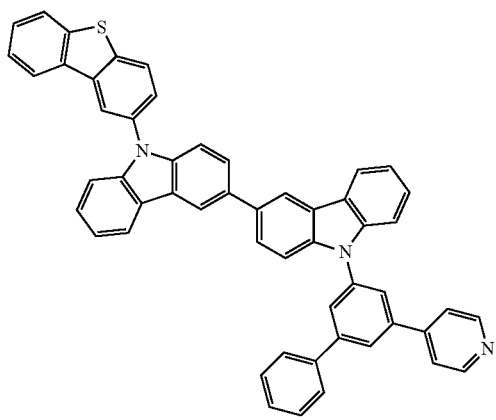
[B-55]
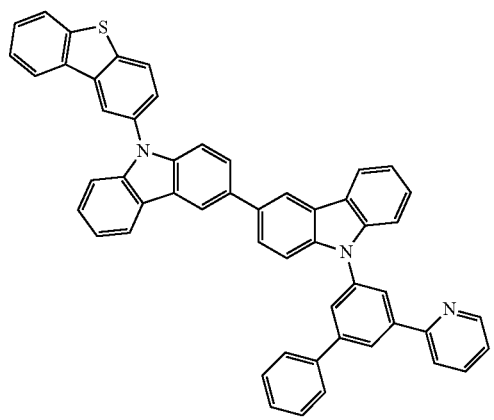
[B-56]
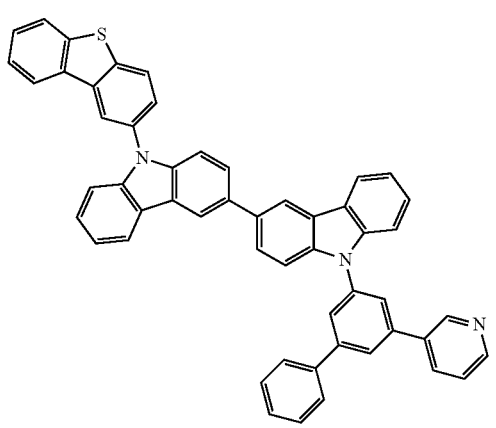
[B-57]
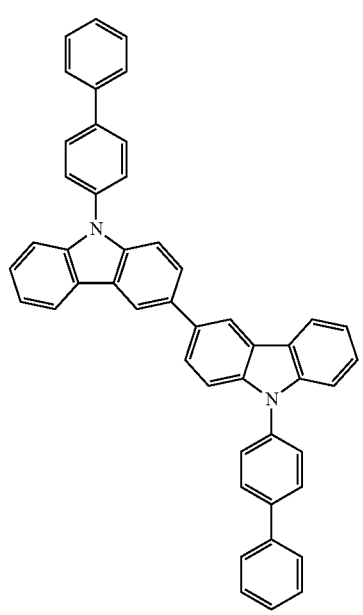
[B-58]
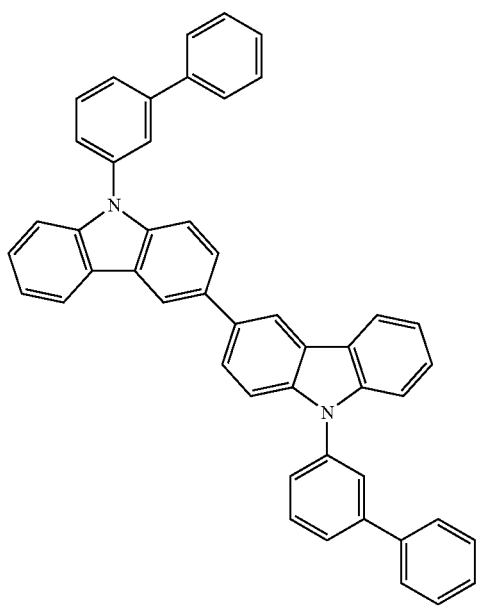
[B-59]
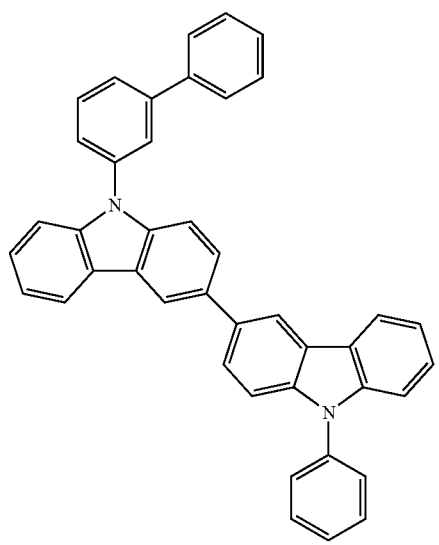
[B-60]

[B-61]
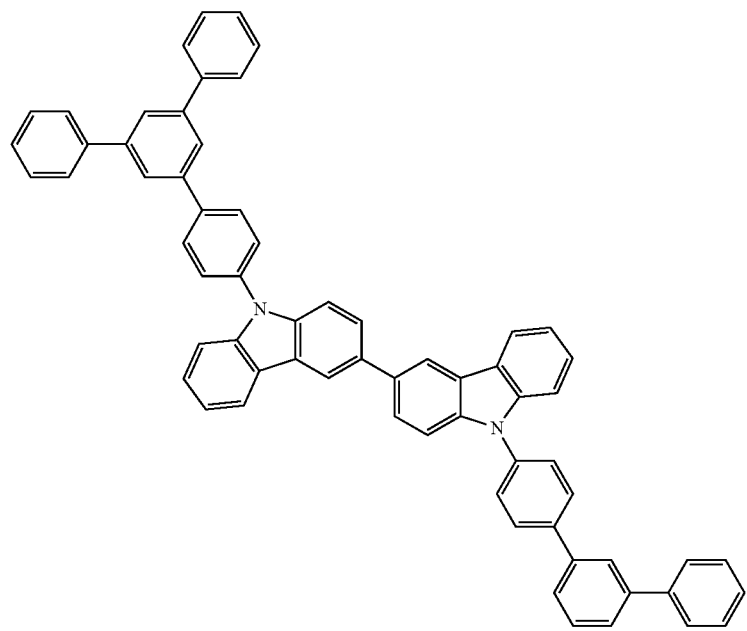
[B-62]
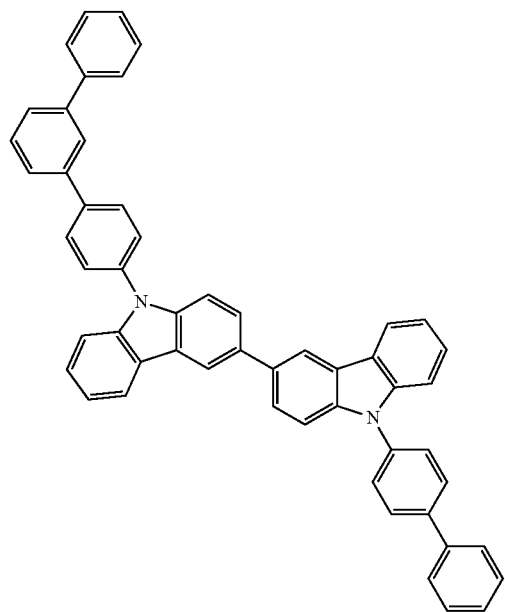
[B-63]
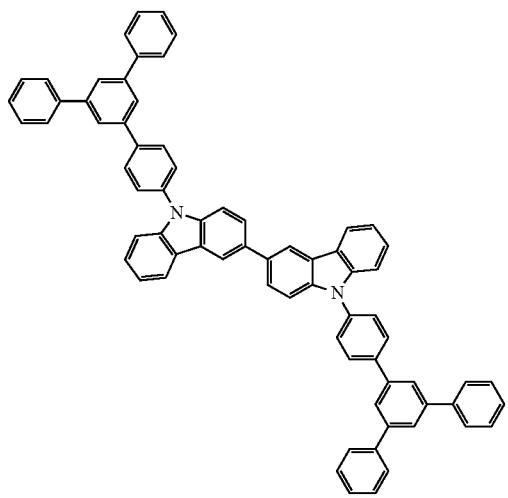

-continued
[B-64]
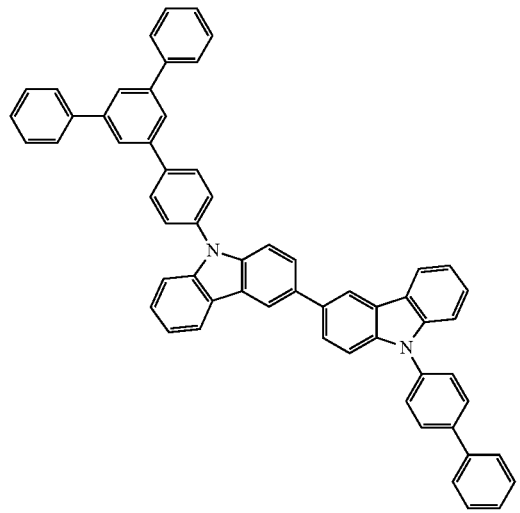
[B-65]
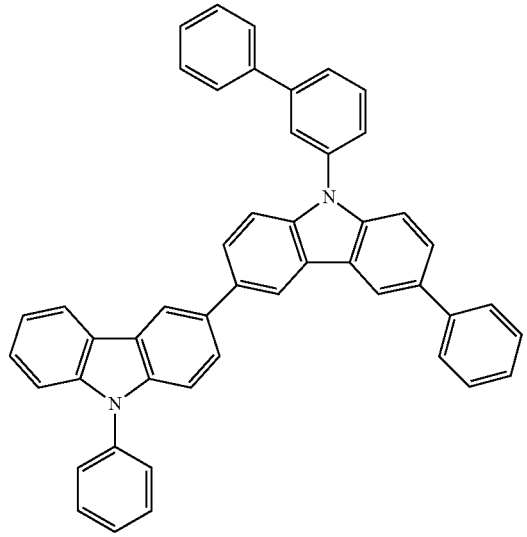
[B-66]
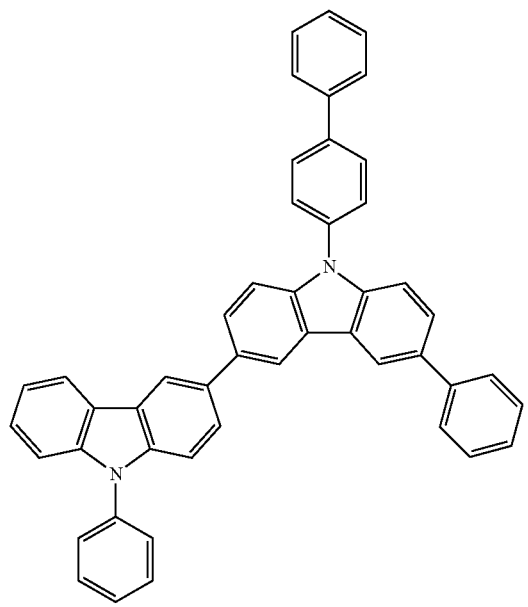
[B-67]
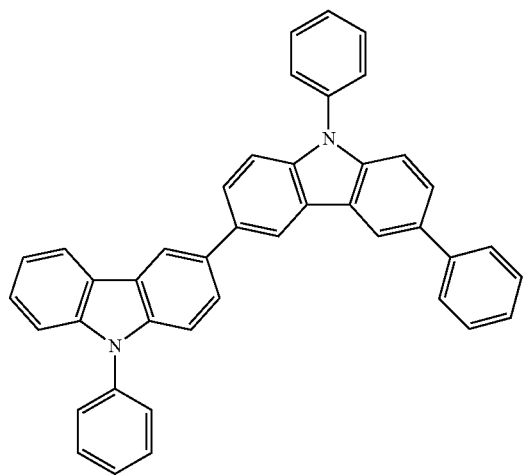

-continued
[B-68]
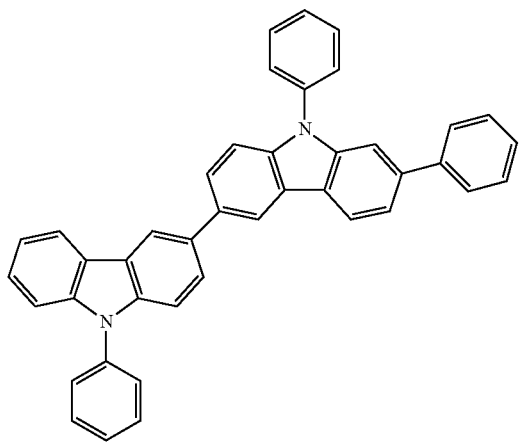
[B-69]
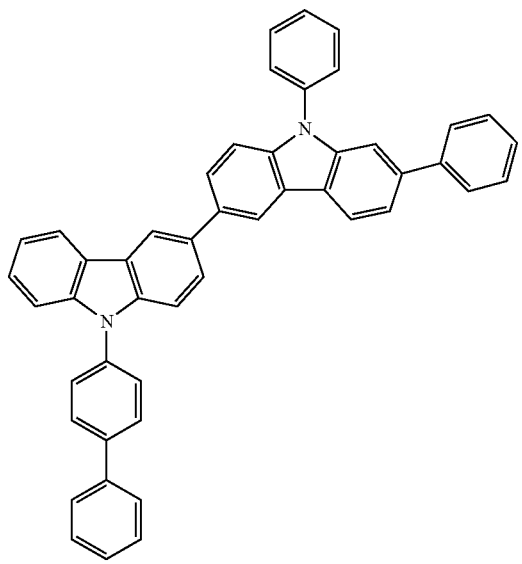
[B-70]
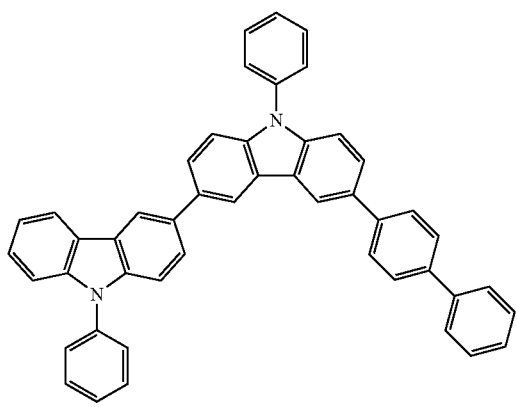
[B-71]
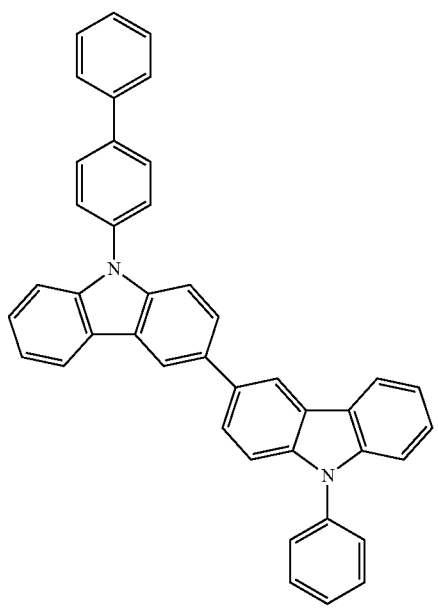

-continued

[B-72]

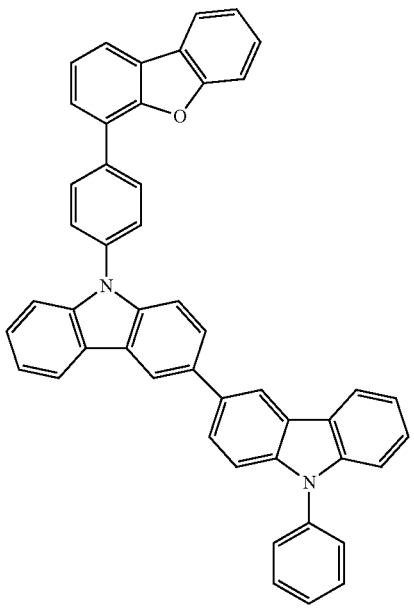

[B-73]

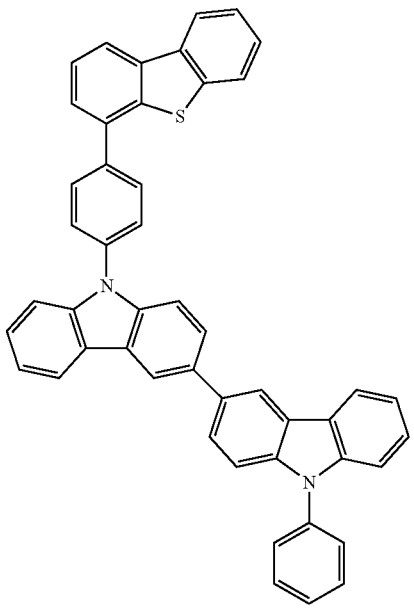

The first compound and the second compound may be applied in a form of a composition, e.g., as a mixture of the first compound and the second compound.

In an implementation, the aforementioned compound (first compound) or composition may be a host.

The first compound and the second compound may be included in a weight ratio of about 1:99 to about 99:1. Within the range, a desirable weight ratio may be adjusted using an electron transport capability of the first compound for the organic optoelectronic device and a hole transport capability of the second compound for the organic optoelectronic device to realize bipolar characteristics and thus to improve efficiency and life-span. Within the range, they may be for example included in a weight ratio of about 90:10 to about 10:90, about 80:20 to about 20:80, for example about 80:20 to about 30:70, or about 70:30 to about 30:70. In an implementation, they may be included in a weight ratio of about 70:30 to about 40:60, e.g., a weight ratio of about 70:30.

The aforementioned compound or composition may further include a dopant. The dopant may be, e.g., a phosphorescent dopant. In an implementation, the phosphorescent dopant may be, e.g., a red, green, or blue phosphorescent dopant. In an implementation, the phosphorescent dopant may be, e.g., a red or green phosphorescent dopant.

The dopant may be a material mixed in a relatively small amount to cause light emission, and may be a material such as a metal complex that emits light by multiple excitation into a triplet or more. The dopant may be, e.g., an inorganic, organic, or organic/inorganic compound, and one or more types thereof may be used.

Examples of the dopant may include a phosphorescent dopant and examples of the phosphorescent dopant may include an organic metal compound including Ir, Pt, Os, Ti, Zr, Hf, Eu, Tb, Tm, Fe, Co, Ni, Ru, Rh, Pd, or a combination thereof. In an implementation, the phosphorescent dopant may be, e.g., a compound represented by Chemical Formula Z.

$$L^3MX^A$$ [Chemical Formula Z]

In Chemical Formula Z, M may be, e.g., a metal, and $L^3$ and $X^A$ may each independently be, e.g., a ligand to form a complex compound with M.

The M may be, e.g., Ir, Pt, Os, Ti, Zr, Hf, Eu, Tb, Tm, Fe, Co, Ni, Ru, Rh, Pd, or a combination thereof, and the $L^3$ and X may be, e.g., a bidendate ligand.

The compound for an organic optoelectronic device (e.g., a layer including the compound) may be formed by a dry film formation method such as chemical vapor deposition (CVD).

Hereinafter, an organic optoelectronic device to which the aforementioned compound for the organic optoelectronic device is applied is described.

The organic optoelectronic device may be a suitable device to convert electrical energy into photoenergy and vice versa, e.g., an organic photoelectric device, an organic light emitting diode, an organic solar cell, or an organic photoconductor drum.

Herein, an organic light emitting diode as one example of an organic optoelectronic device is described referring to drawings.

Figure 2:
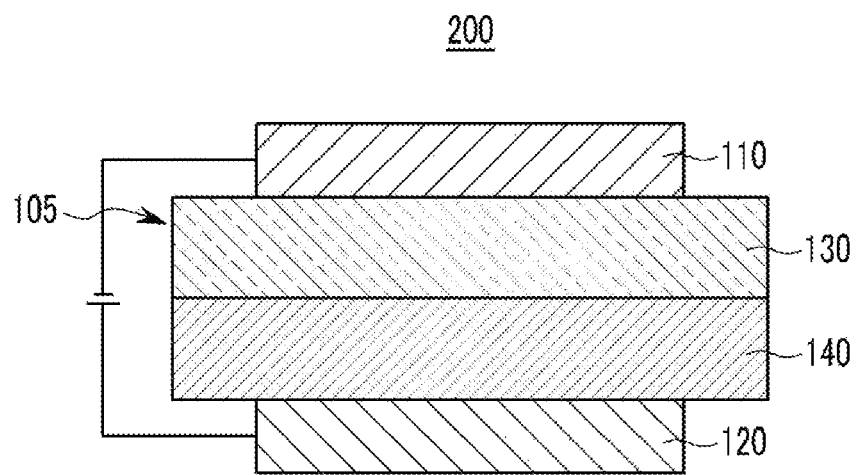

FIGS. 1 and 2 are cross-sectional views showing organic light emitting diodes according to embodiments.

Referring to FIG. 1, an organic light emitting diode 100 according to an embodiment may include an anode 120 and a cathode 110 facing each other and an organic layer 105 between the anode 120 and cathode 110.

The anode 120 may be made of a conductor having a large work function to facilitate hole injection, and may include, e.g., a metal, a metal oxide, or a conductive polymer. In an implementation, the anode 120 may include, e.g., a metal such as nickel, platinum, vanadium, chromium, copper, zinc, gold, and the like or an alloy thereof; a metal oxide such as zinc oxide, indium oxide, indium tin oxide (ITO), indium zinc oxide (IZO), and the like; a combination of a metal and an oxide such as ZnO and Al or $SnO_2$ and Sb; or a conductive polymer such as poly(3-methylthiophene), poly (3,4-(ethylene-1,2-dioxy)thiophene) (PEDOT), polypyrrole, and polyaniline.

The cathode 110 may be made of a conductor having a small work function to facilitate electron injection, and may include, e.g., a metal, a metal oxide, or a conductive polymer. In an implementation, the cathode 110 may include, e.g., a metal such as magnesium, calcium, sodium, potassium, titanium, indium, yttrium, lithium, gadolinium, aluminum, silver, tin, lead, cesium, barium, and the like, or an alloy thereof; or a multi-layer structure material such as LiF/Al, LiO$_2$/Al, LiF/Ca, LiF/Al, and BaF$_2$/Ca.

The organic layer 105 may include a light emitting layer 130 that includes the aforementioned compound or composition for the organic optoelectronic device.

The light emitting layer 130 may include, e.g., the aforementioned compound or composition for the organic optoelectronic device described above.

Referring to FIG. 2, an organic light emitting diode 200 may further include a hole auxiliary layer 140 in addition to the light emitting layer 130. The hole auxiliary layer 140 may help further increase hole injection and/or hole mobility and may help block electrons between the anode 120 and the light emitting layer 130. The hole auxiliary layer 140 may be, e.g., a hole transport layer, a hole injection layer, and/or an electron blocking layer, and may include at least one layer.

The hole auxiliary layer 140 may include, e.g., a compound of Group C.

In an implementation, the hole auxiliary layer 140 may include a hole transport layer between the anode 120 and the light emitting layer 130 and a hole transport auxiliary layer between the light emitting layer 130 and the hole transport layer, and a compound of Group C may be included in the hole transport auxiliary layer.

[Group C]

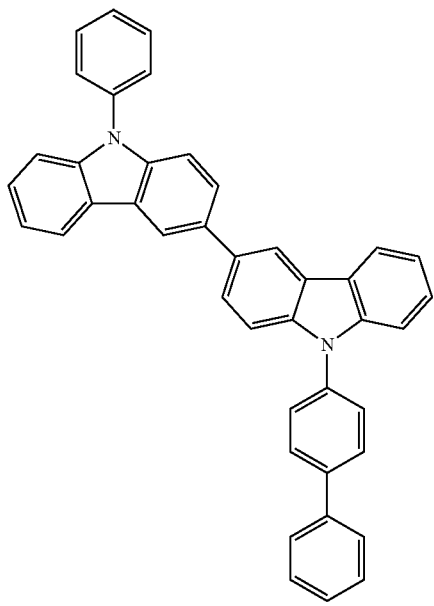

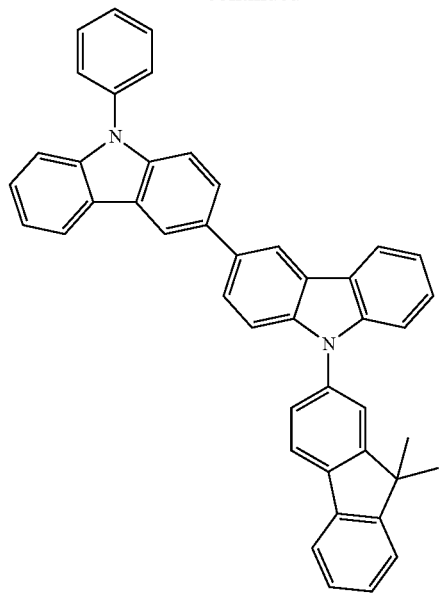

-continued

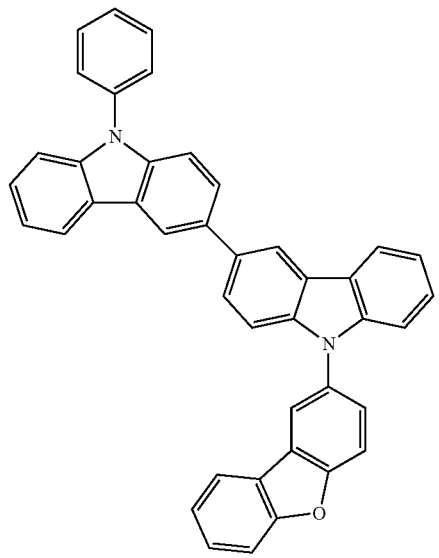

59
-continued
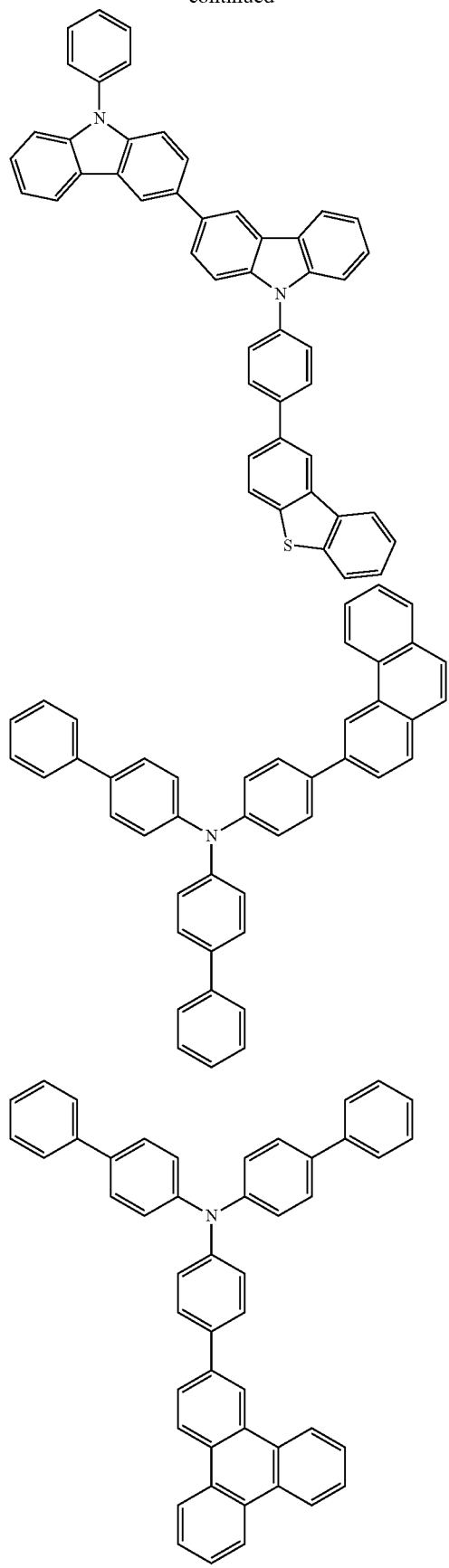
60
-continued
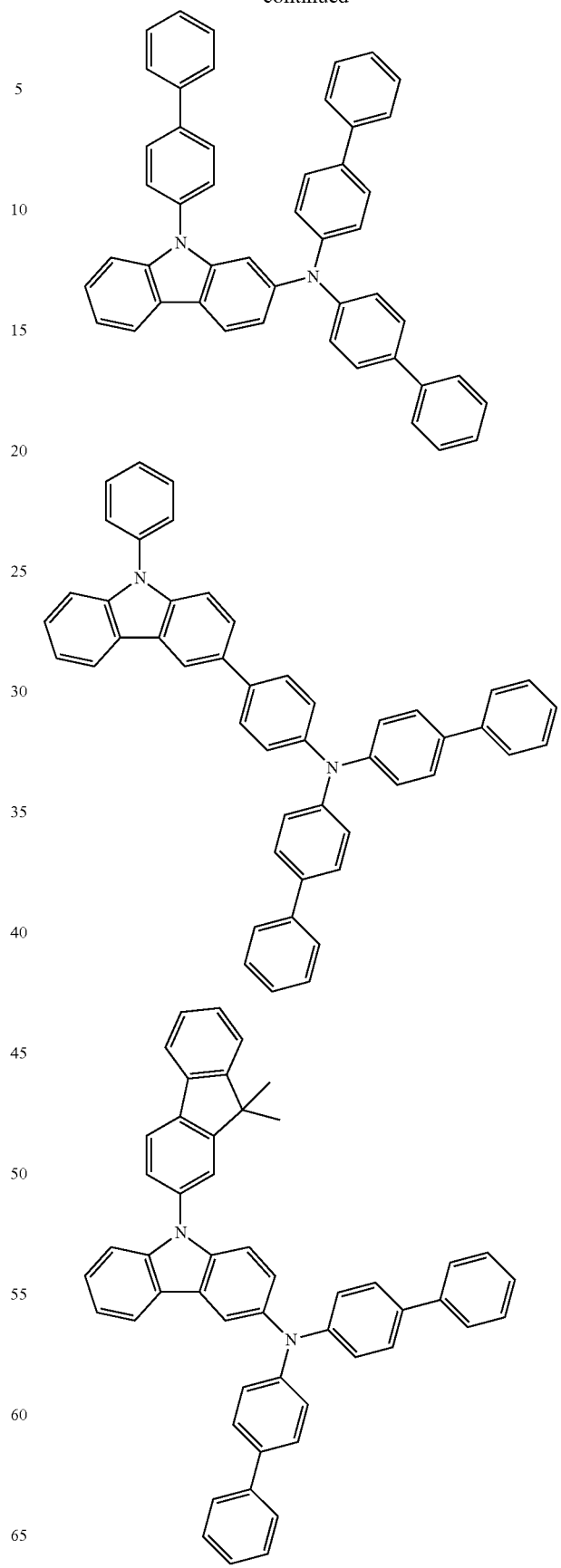

61
-continued
62
-continued
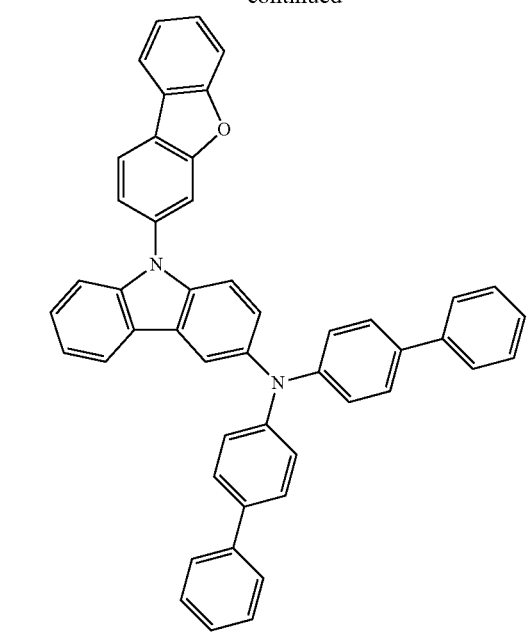
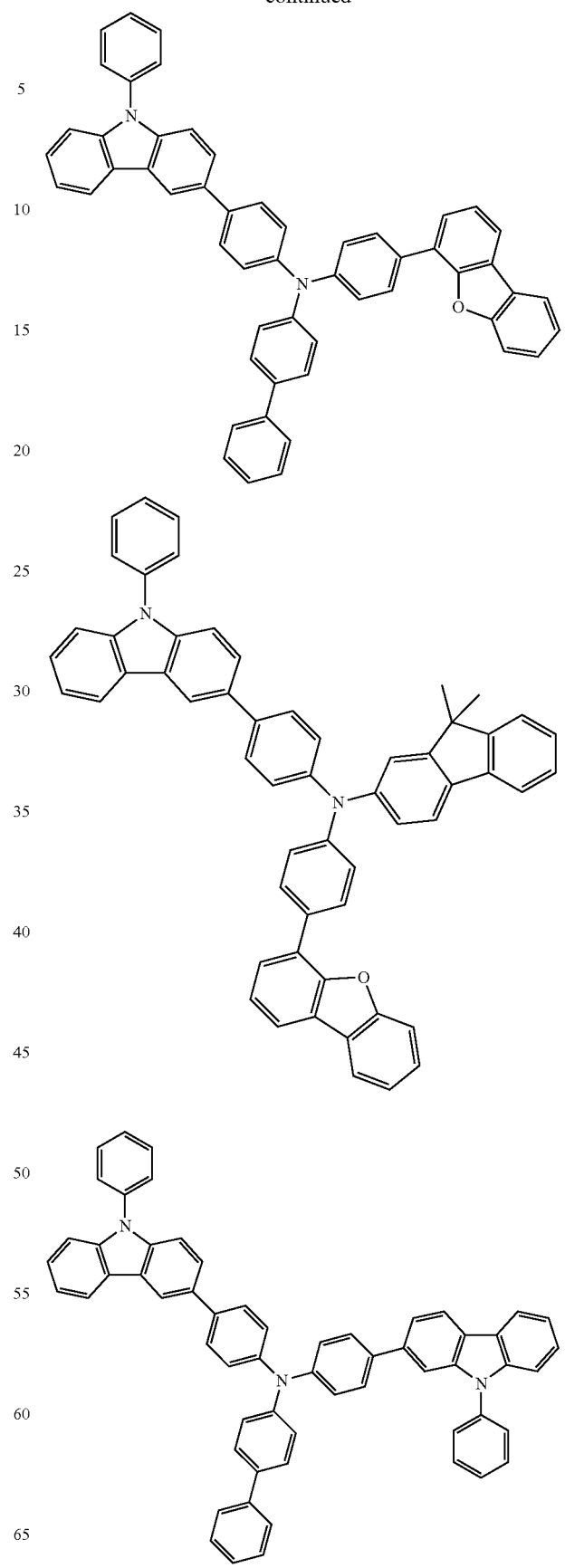

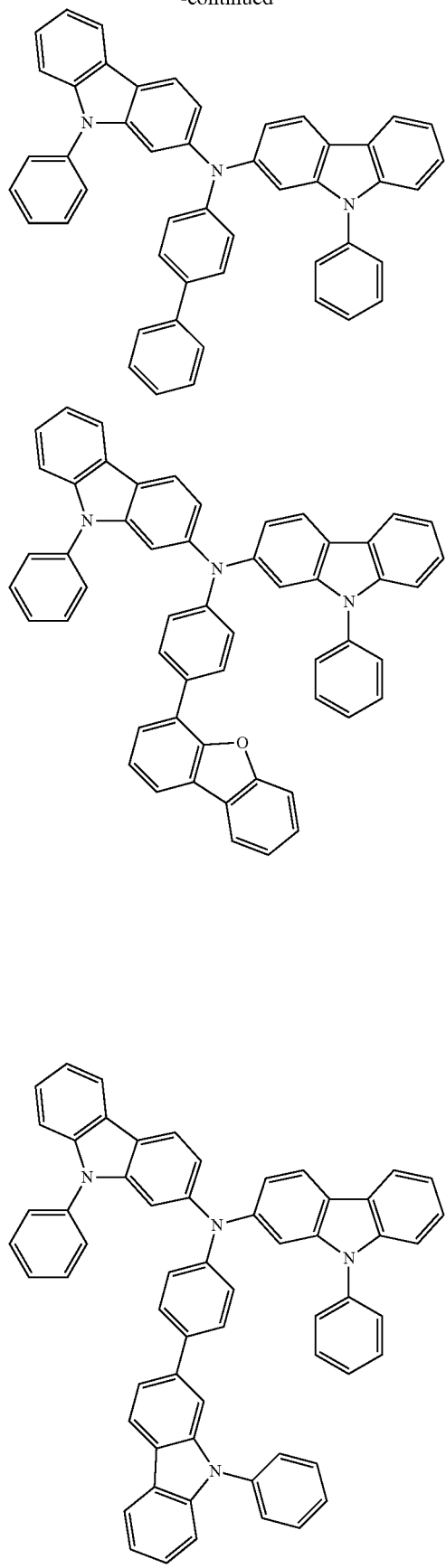
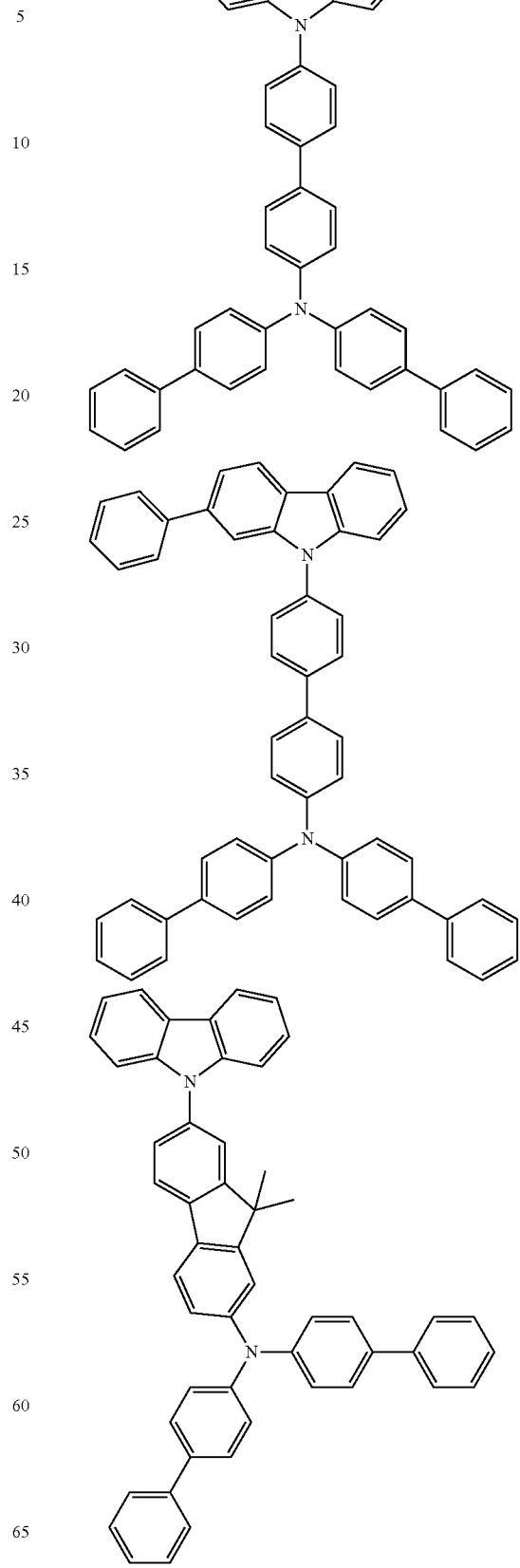

65
-continued
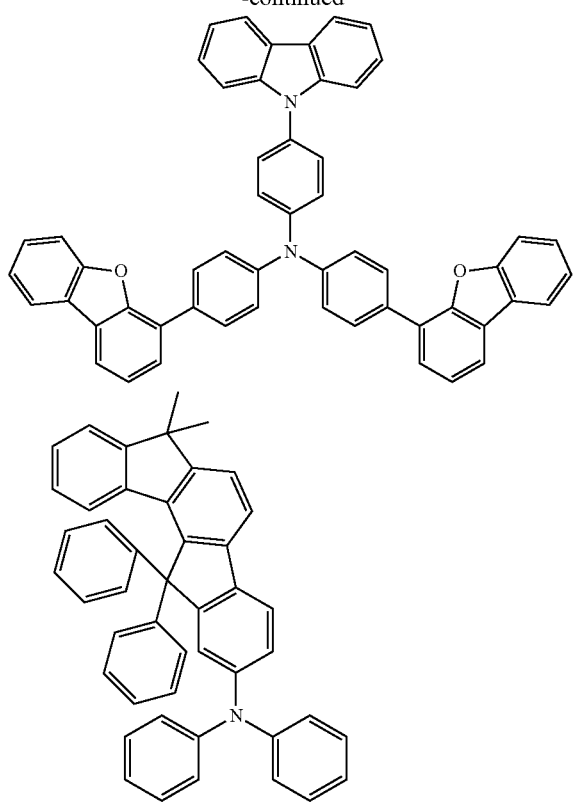
66
-continued
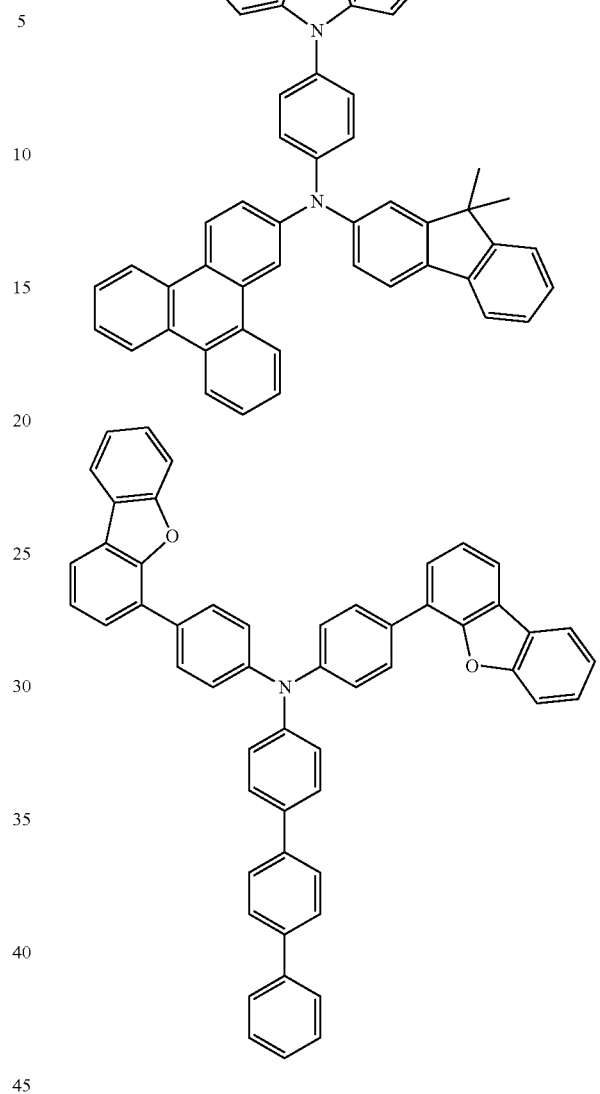
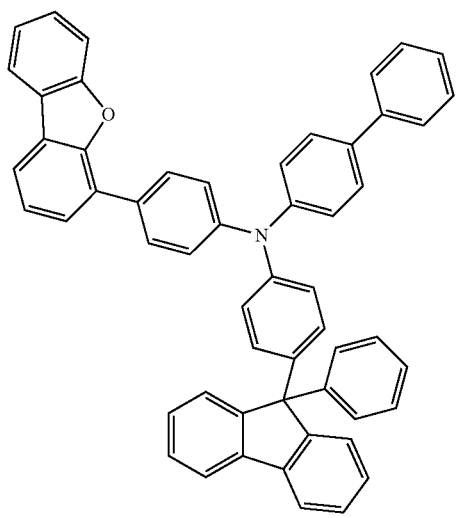
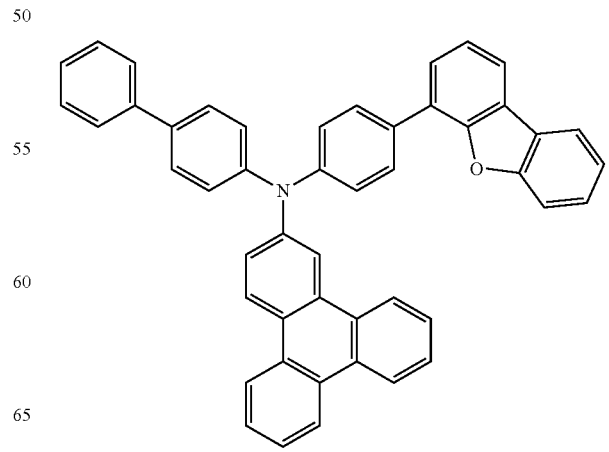

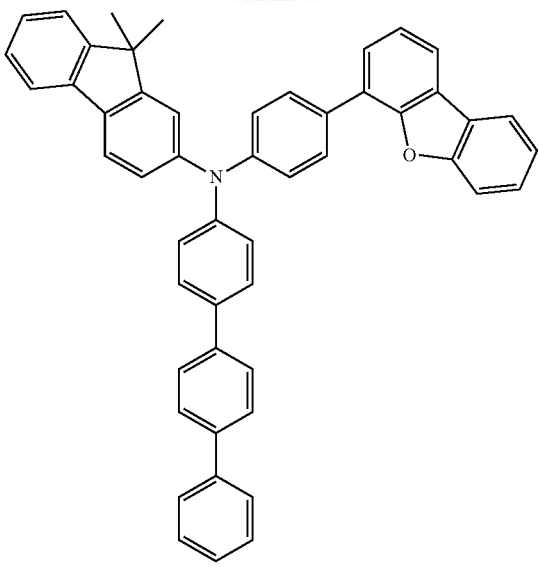
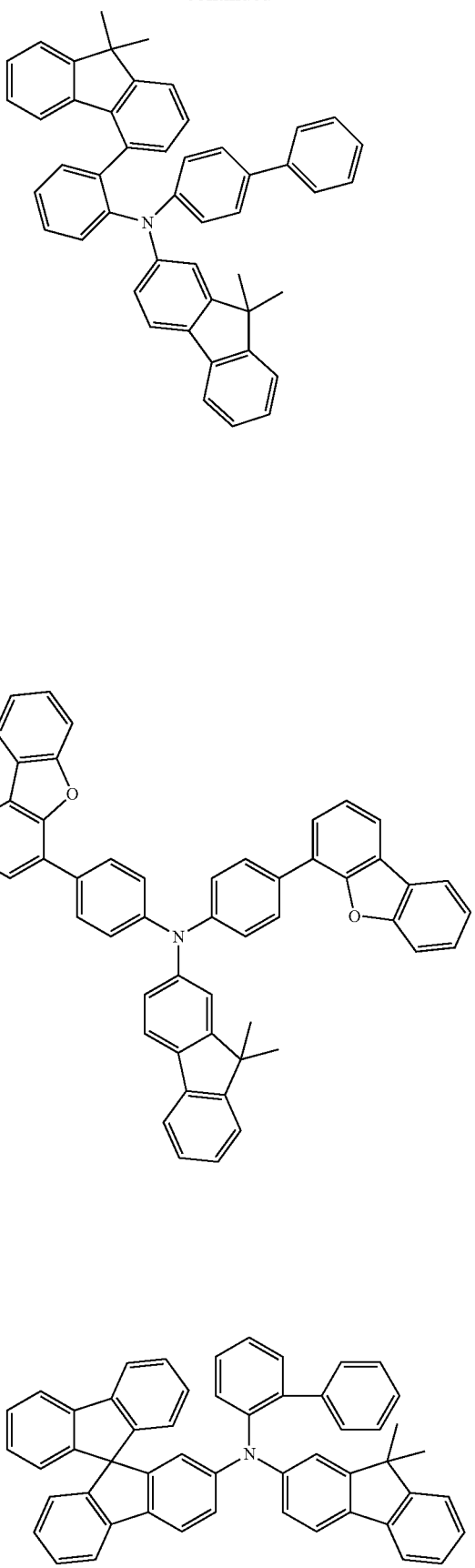

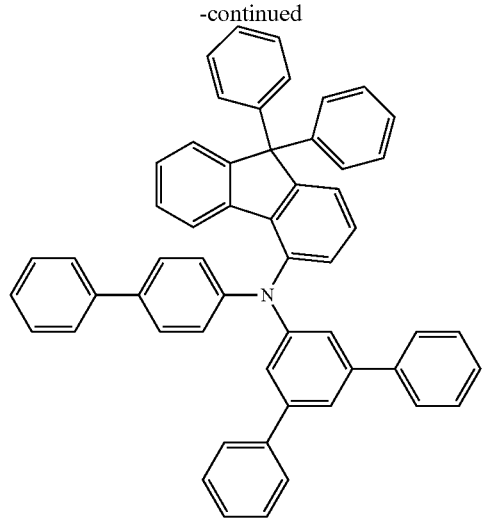
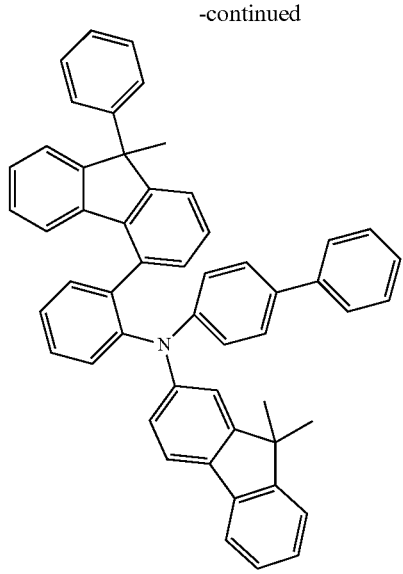
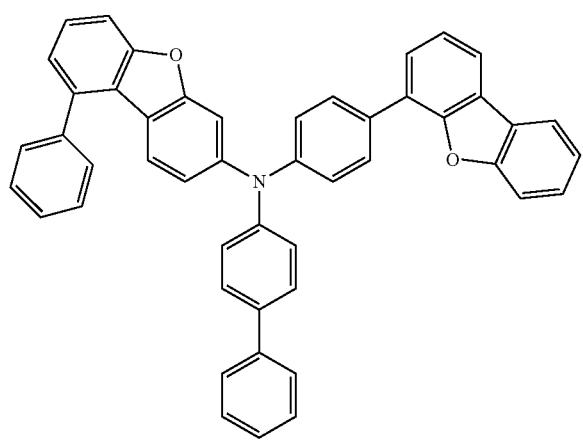
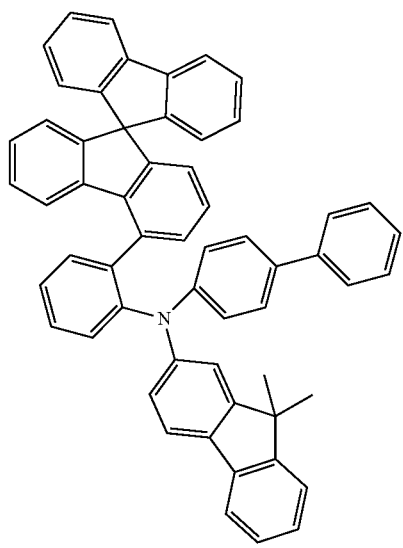
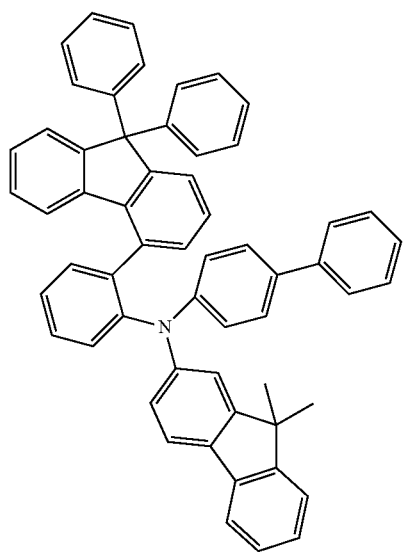
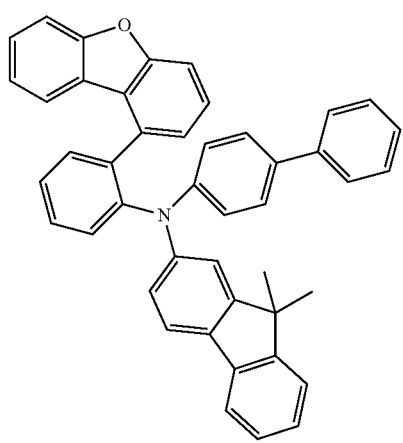

71
-continued
72
-continued
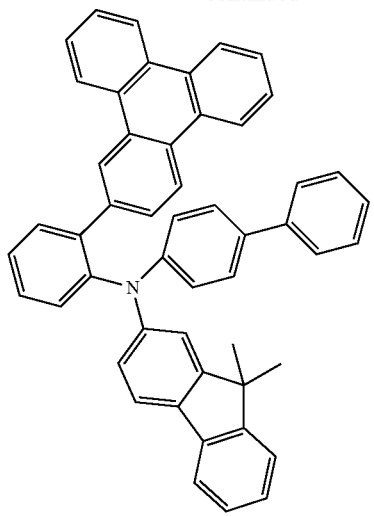
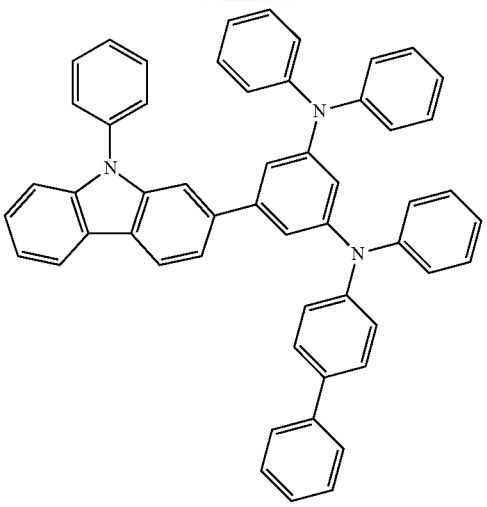
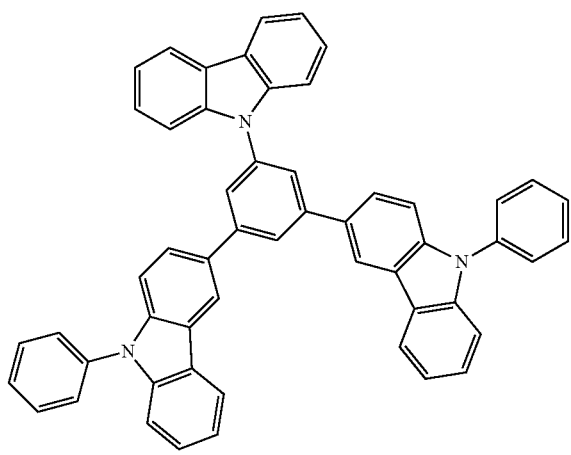
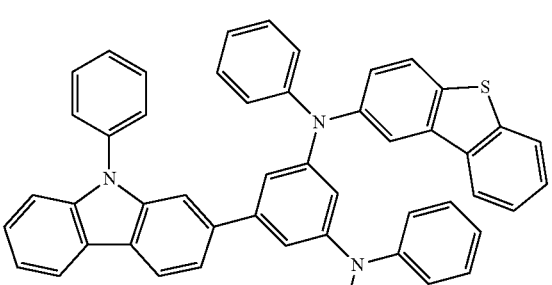
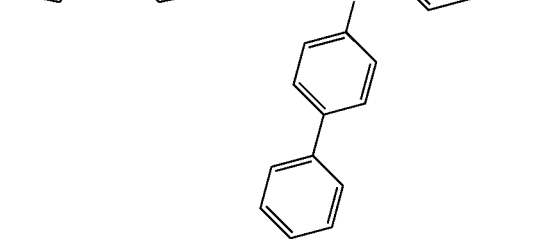
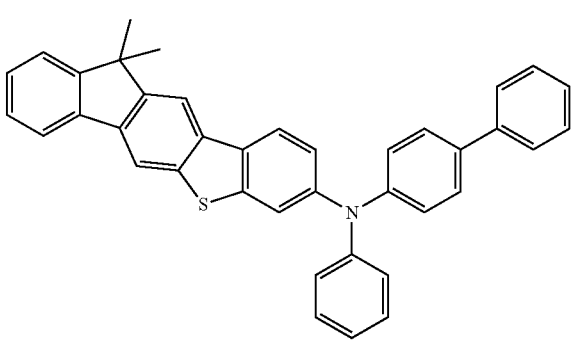
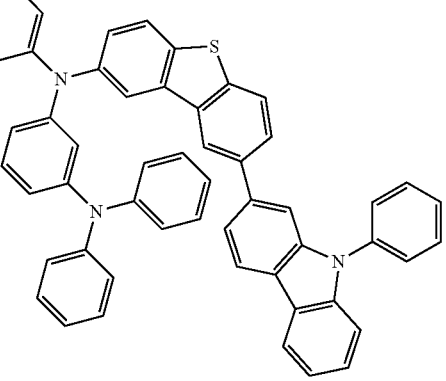

73
-continued
74
-continued
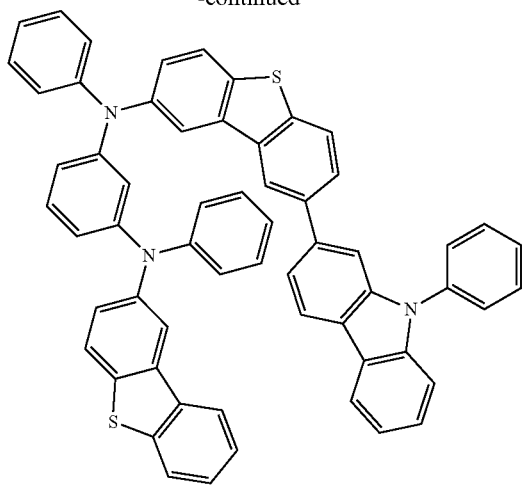
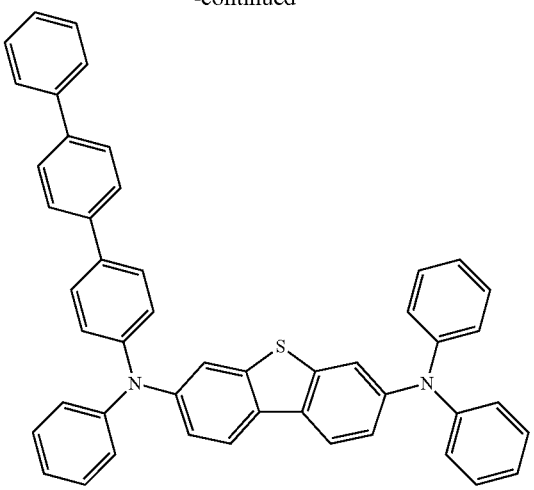
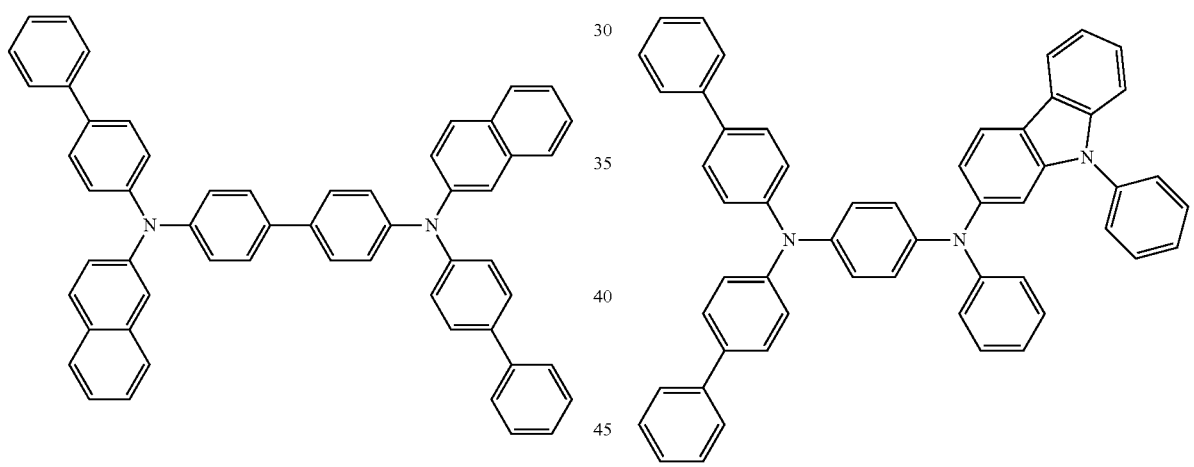
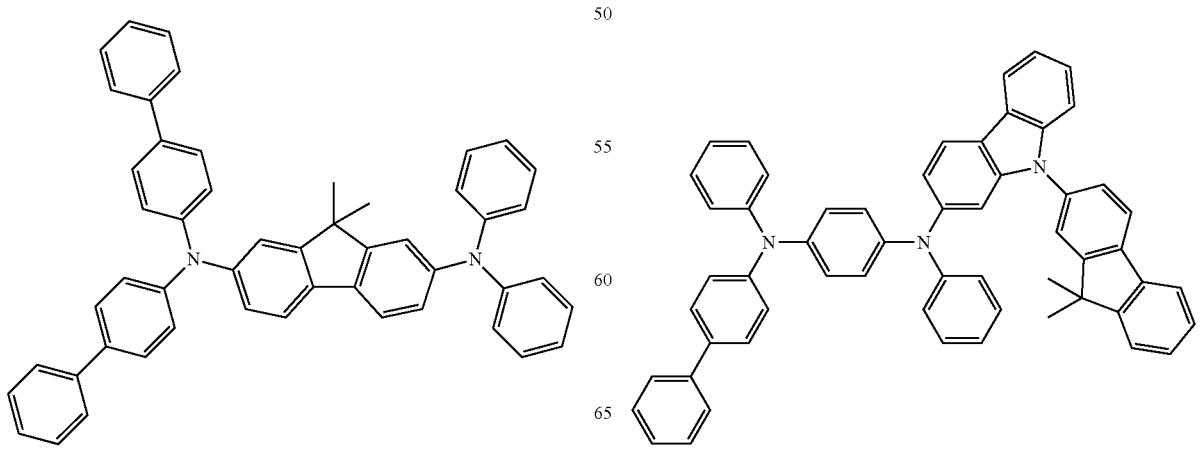

75
-continued
76
-continued
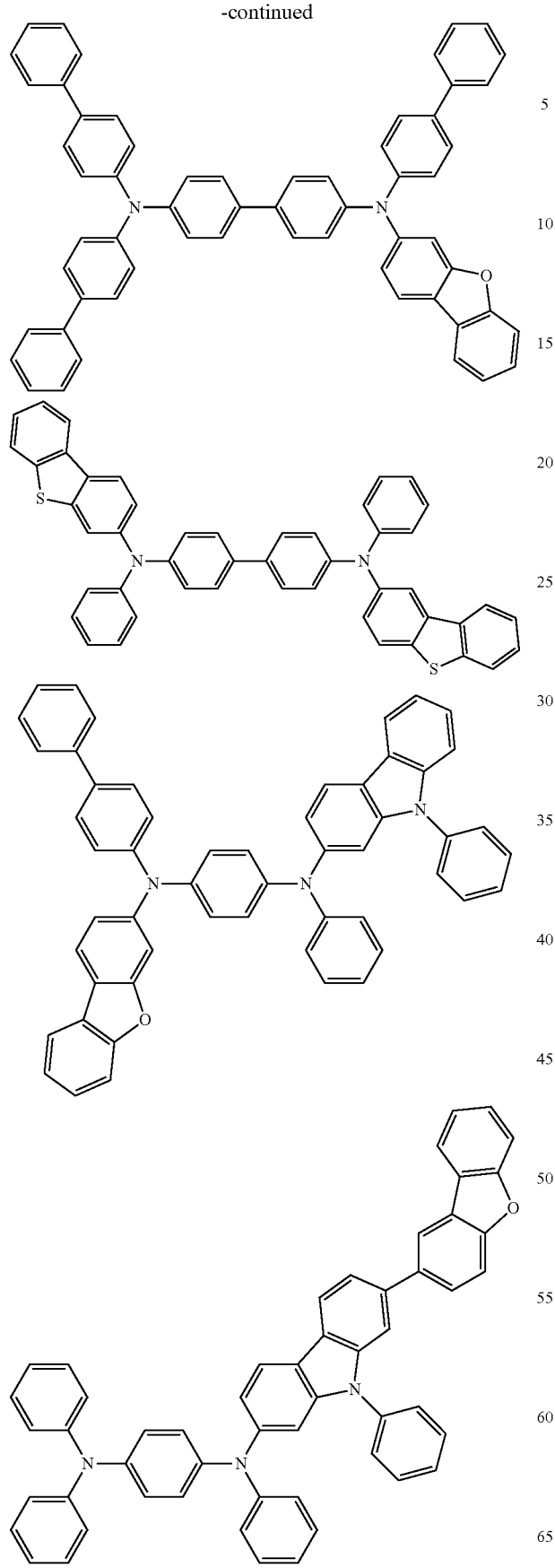
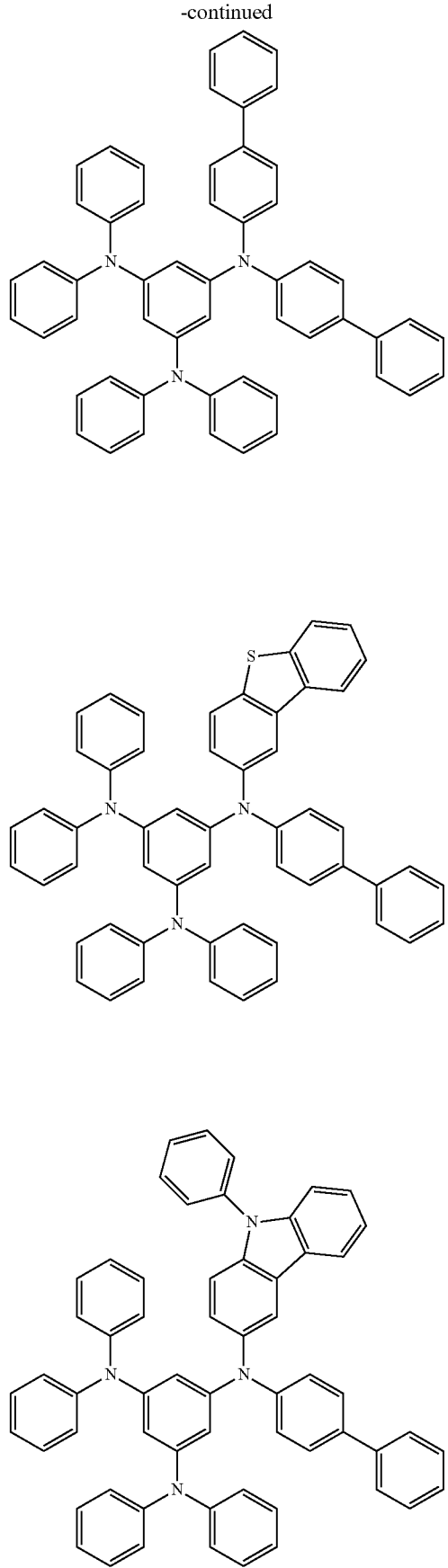

77
-continued
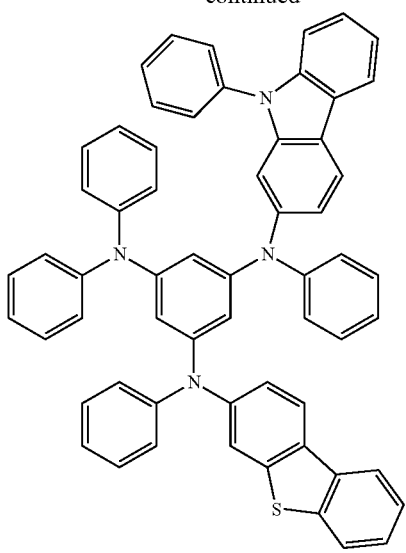
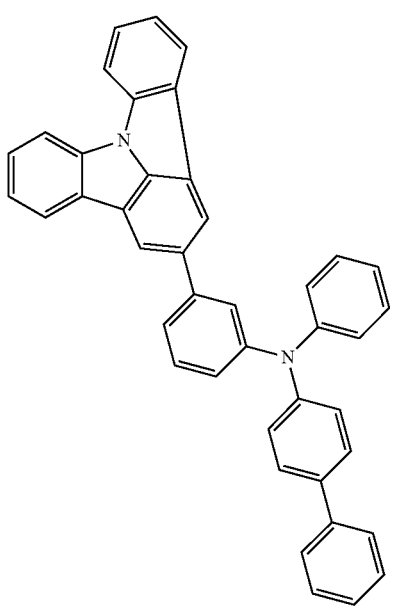
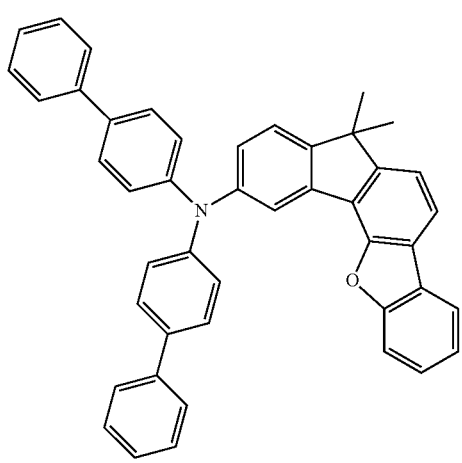
78
-continued
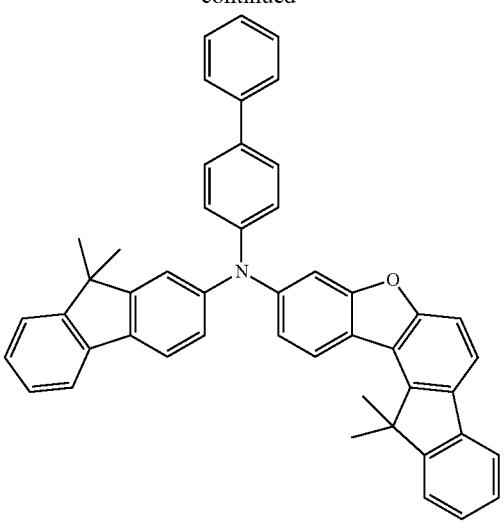
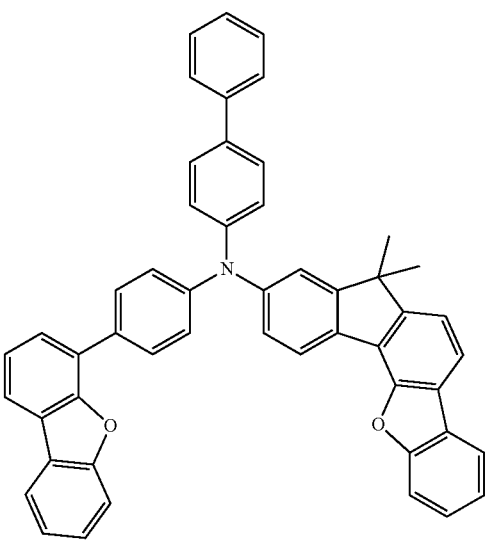
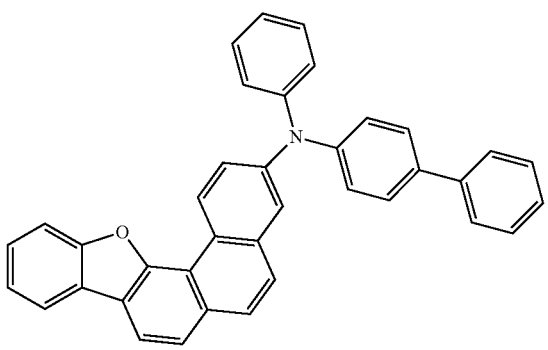

79
-continued
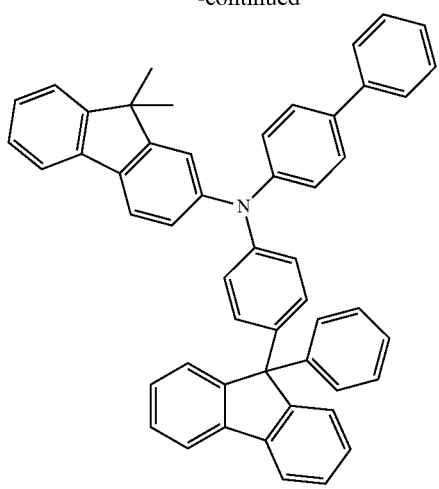
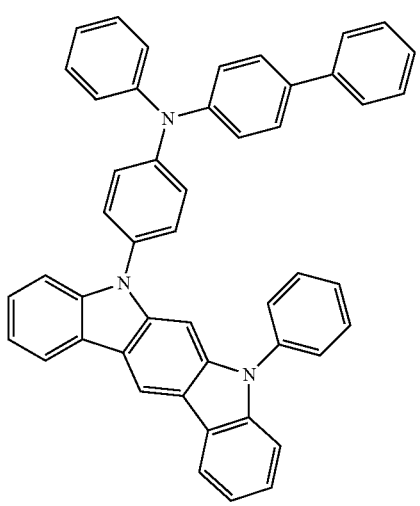
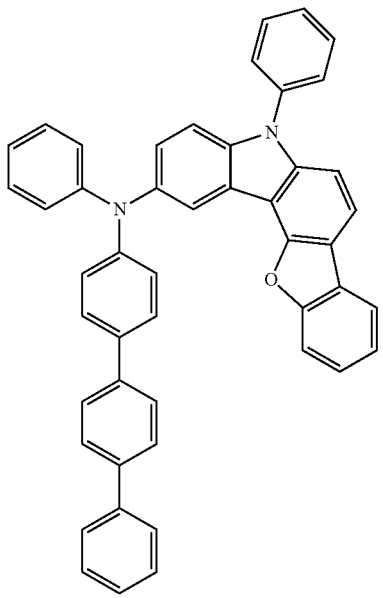
80
-continued
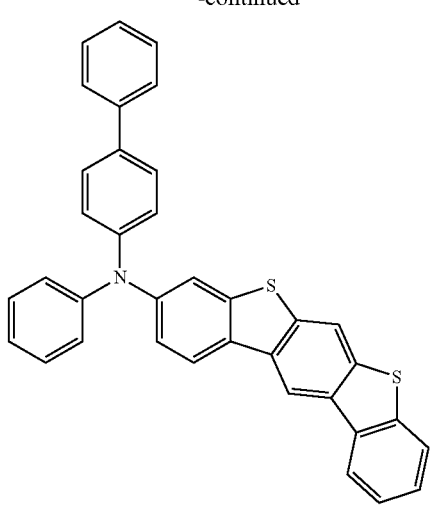
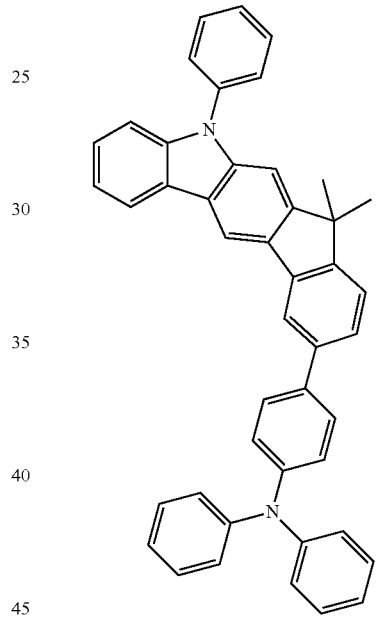
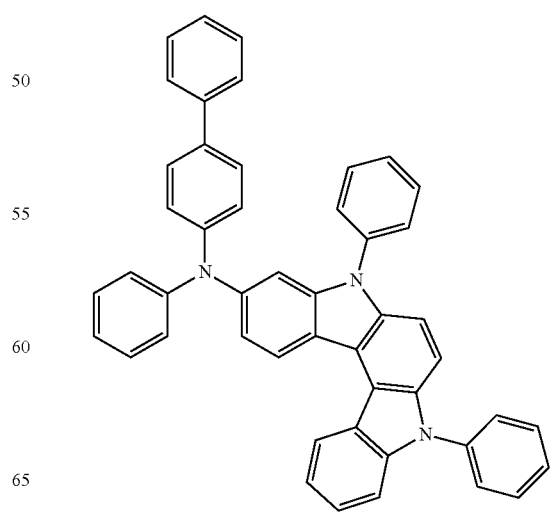

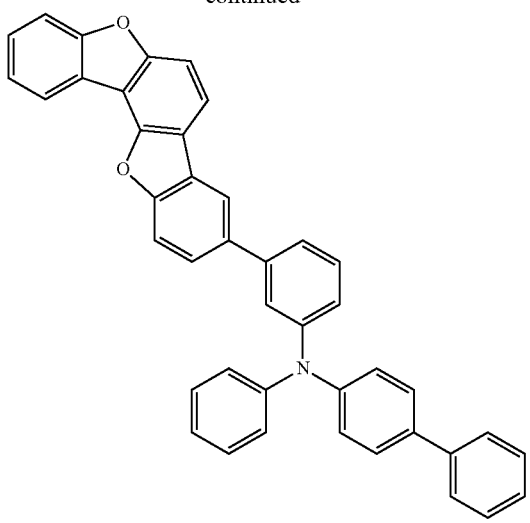

In the hole transport auxiliary layer, compounds disclosed in U.S. Pat. No. 5,061,569A, JP1993-009471A, WO1995-009147A1, JP1995-126615A, JP1998-095972A, and the like and compounds similar thereto may be used in addition to the compound.

In an implementation, the organic light emitting diode may further include an electron transport layer, an electron injection layer, or a hole injection layer as or in the organic layer 105.

The organic light emitting diodes 100 and 200 may be produced by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in Examples and Synthesis

Examples were purchased from Sigma-Aldrich Co. Ltd., TCI Inc., Tokyo chemical industry or P&H tech as far as there is no particular comment or were synthesized by known methods.

(Preparation of Compound for Organic Optoelectronic Device)

Examples of the compounds were synthesized through the following steps.

(Preparation of First Compound for Organic Optoelectronic Device)

Synthesis Example 1: Synthesis of Compound A-1

[Reaction Scheme 1]

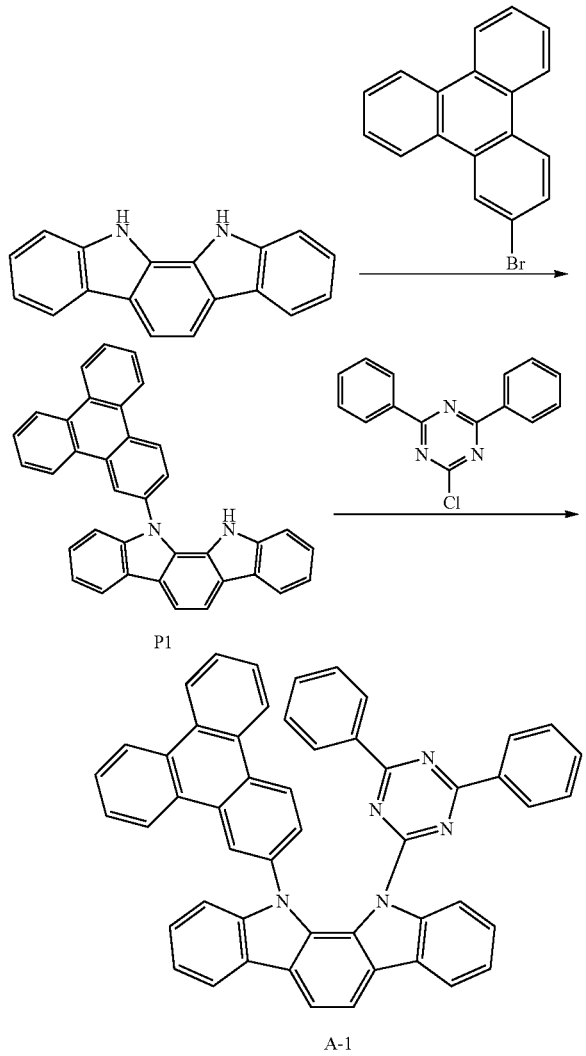

Step 1: Synthesis of Intermediate P1

11,12-dihydroindolo[2,3-a]carbazole (50 g, 195.08 mmol), 2-bromotriphenylene (60 g, 195.08 mmol), tris(dibenzylideneacetone)dipalladium (0) (8.9 g, 9.75 mmol), tri-tert-butylphosphine (16 g, 39.02 mmol), and sodium tert-butoxide (18.8 g, 195.08 mmol) were injected into a round-bottomed flask together with xylene (1 L) and stirred under reflux at 150° C. for 12 hours. After cooling to ambient temperature, dichloromethane (DCM) (700 mL) was injected and diluted, and the resultant was washed three times with brine (1 L). After drying the organic layer with MgSO$_4$, the solvent was removed. 31 g of Intermediate P1 (yield: 33%) was obtained using column chromatography (DCM:n-hexane=2:8).

Step 2: Synthesis of Compound A-1

Intermediate P1 (7 g, 14.7 mmol), 2-chloro-4,6-diphenyl-1,3,5-triazine (4.7 g, 17.6 mmol), and sodium hydride (0.9 g, 22.0 mmol) (60% dispersion in mineral oil) were injected into a round-bottomed flask together with dimethylformamide (DMF) (200 mL) solvent and stirred at ambient temperature for 12 hours. DCM (500 mL) was injected and diluted, and the resultant was washed three times with brine (500 mL). After drying the organic layer with MgSO$_4$, the solvent was removed. 4.5 g (yield: 43%) of Compound A-1 was obtained using column chromatography (DCM:n-hexane=4:6).

Synthesis Example 2: Synthesis of Compound A-2

Intermediate P1 (7 g, 14.7 mmol), 2-chloro-4-(biphenyl-4-yl)-6-phenyl-1,3,5-triazine (6.0 g, 17.6 mmol), and sodium hydride (0.9 g, 22.0 mmol) (60% dispersion in mineral oil) were injected into a round-bottomed flask together with DMF (200 mL) solvent and stirred at room temperature for 12 hours. DCM (500 mL) was injected and diluted, and the resultant was washed three times with brine (500 mL). After drying the organic layer with MgSO$_4$, the solvent was removed. 5.2 g (yield: 45%) of Compound A-2 was obtained using column chromatography (DCM:n-hexane=4:6).

[Reaction Scheme 2]

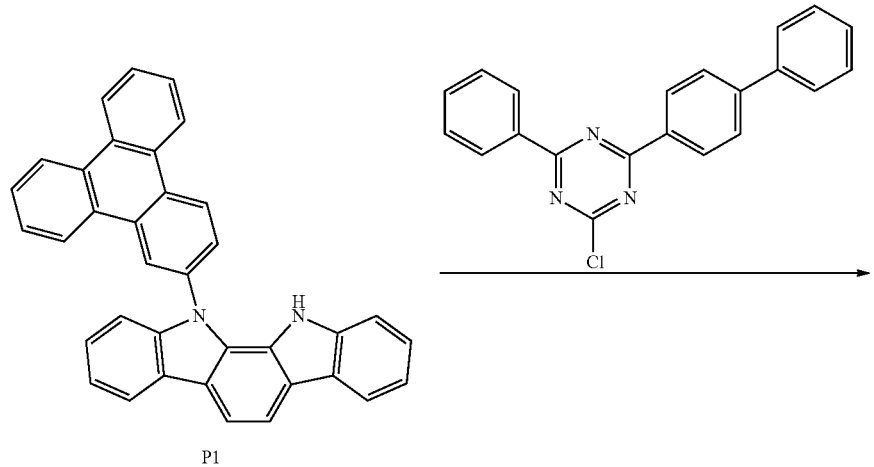

P1

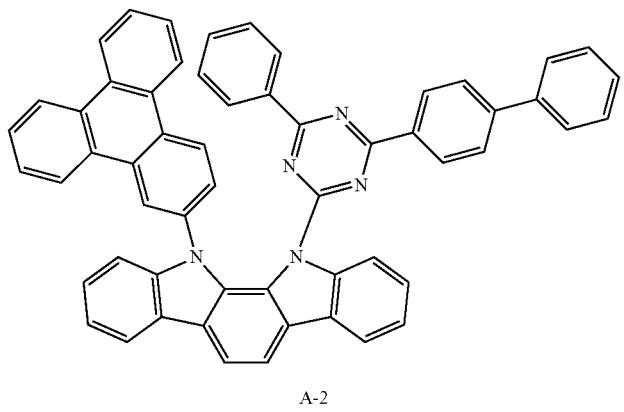

A-2

Synthesis Example 3: Synthesis of Compound A-3

[Reaction Scheme 3]

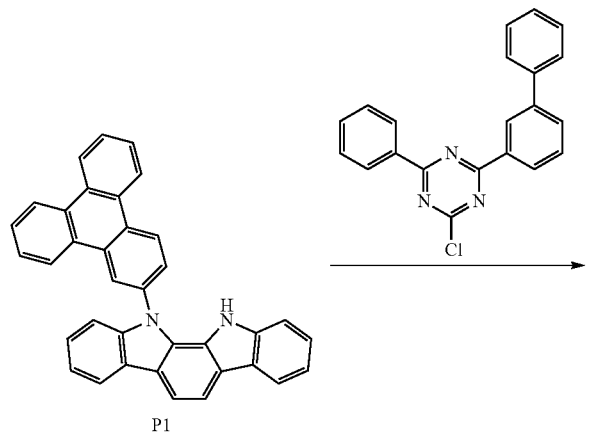

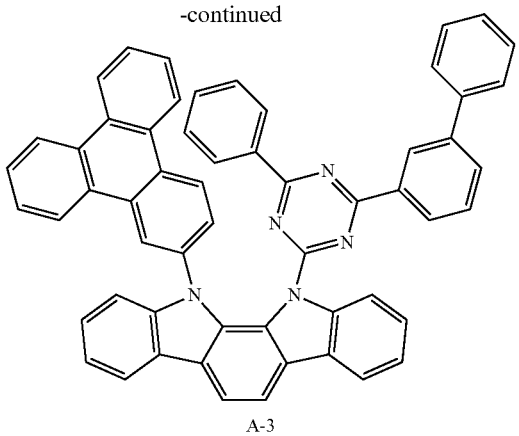

Intermediate P1 (7 g, 14.7 mmol), 2-chloro-4-(biphenyl-3-yl)-6-phenyl-1,3,5-triazine (6.0 g, 17.6 mmol), and sodium hydride (0.9 g, 22.0 mmol) (60% dispersion in mineral oil) were injected into a round-bottomed flask together with DMF (200 mL) solvent and stirred at room temperature for 12 hours. DCM (500 mL) was injected and diluted, and the resultant was washed three times with brine (500 mL). After drying the organic layer with $MgSO_4$, the solvent was removed. 5.8 g (yield: 50%) of Compound A-3 was obtained using column chromatography (DCM:n-hexane=4:6).

Synthesis Example 4: Synthesis of Compound A-4

[Reaction Scheme 4]

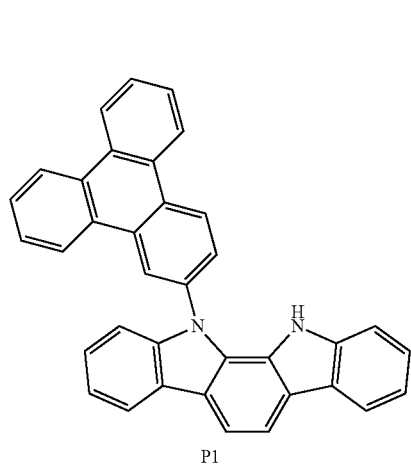

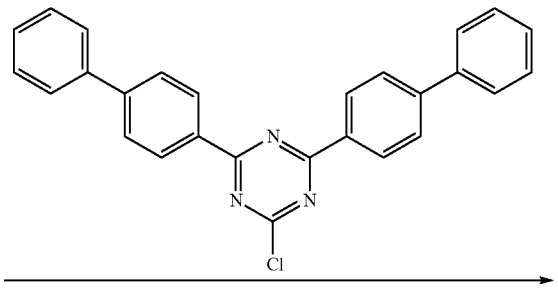

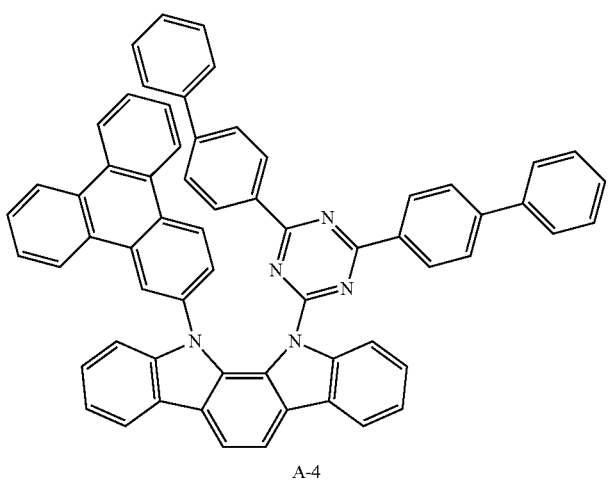

Intermediate P1 (7 g, 14.7 mmol), 2,4-bis([1,1'-biphenyl]-4-yl)-6-chloro-1,3,5-triazine (7.4 g, 17.6 mmol), and sodium hydride (0.9 g, 22.0 mmol) (60% dispersion in mineral oil) were injected into a round-bottomed flask together with DMF (200 mL) solvent and stirred at room temperature for 12 hours. DCM (500 mL) was injected and diluted, and the resultant was washed three times with brine (500 mL). After drying the organic layer with MgSO$_4$, the solvent was removed. 5.7 g (yield: 45%) of Compound A-4 was obtained using column chromatography (DCM:n-hexane=4:6).

Comparative Synthesis Example 1: Synthesis of Compound C-1

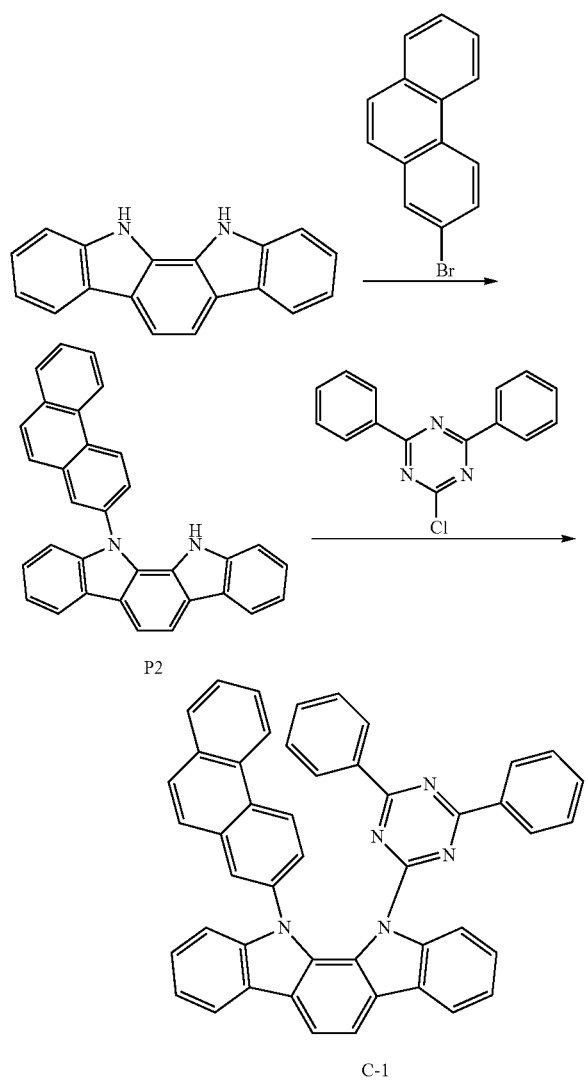

P2

C-1

Step 1: Synthesis of Intermediate P2

11,12-dihydroindolo[2,3-a]carbazole (50 g, 195.08 mmol), 2-bromophenanthrene (50 g, 195.08 mmol), tris(dibenzylideneacetone)dipalladium (0) (8.9 g, 9.75 mmol), tri-tert-butylphosphine (16 g, 39.02 mmol), and sodium tert-butoxide (18.8 g, 195.08 mmol) were injected into a round-bottomed flask together with xylene (1 L) and stirred under reflux at 150° C. for 12 hours. After cooling to ambient temperature, DCM (700 mL) was injected and diluted, and the resultant was washed three times with brine (1 L). After drying the organic layer with MgSO$_4$, the solvent was removed. 38 g (yield: 45%) of Intermediate P2 was obtained using column chromatography (DCM:n-hexane=2:8).

Step 2: Synthesis of Compound C-1

Intermediate P2 (6.3 g, 14.7 mmol), 2-chloro-4,6-diphenyl-1,3,5-triazine (4.7 g, 17.6 mmol), and sodium hydride (0.9 g, 22.0 mmol) (60% dispersion in mineral oil) were injected into a round-bottomed flask together with DMF (200 mL) solvent and stirred at room temperature for 12 hours. DCM (500 mL) was injected and diluted, and the resultant was washed three times with brine (500 mL). After drying the organic layer with MgSO$_4$, the solvent was removed. 3.9 g (yield: 40%) of Compound C-1 was obtained using column chromatography (DCM:n-hexane=4:6).

Comparative Synthesis Example 2: Synthesis of Compound C-2

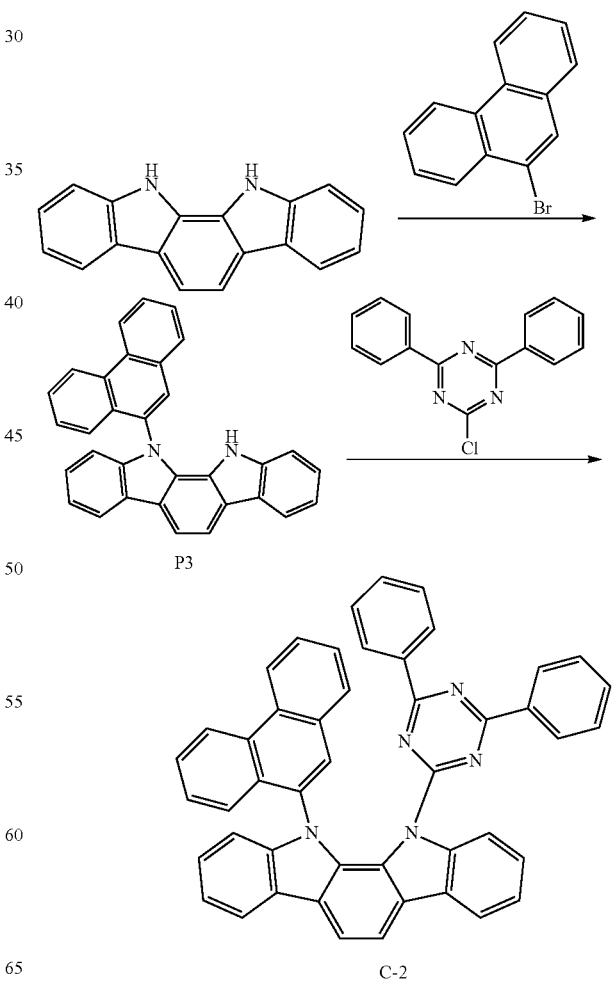

P3

C-2

Step 1: Synthesis of Intermediate P3

11,12-dihydroindolo[2,3-a]carbazole (50 g, 195.08 mmol), 9-bromophenanthrene (50 g, 195.08 mmol), tris(dibenzylideneacetone)dipalladium (0) (8.9 g, 9.75 mmol), tri-tert-butylphosphine (16 g, 39.02 mmol), and sodium tert-butoxide (18.8 g, 195.08 mmol) were injected into a round-bottomed flask together with xylene (1 L) and stirred under reflux at 150° C. for 12 hours. After cooling to ambient temperature, DCM (700 mL) was injected and diluted, and the resultant was washed three times with brine (1 L). After drying the organic layer with MgSO$_4$, the solvent was removed. 20 g (yield: 38%) of Intermediate P3 was obtained using column chromatography (DCM:n-hexane=2:8).

Step 2: Synthesis of Compound C-2

Intermediate P3 (6.3 g, 14.7 mmol), 2-chloro-4,6-diphenyl-1,3,5-triazine (4.7 g, 17.6 mmol), and sodium hydride (0.9 g, 22.0 mmol) (60% dispersion in mineral oil) were injected into a round-bottomed flask together with DMF (200 mL) solvent and stirred at room temperature for 12 hours. DCM (500 mL) was injected and diluted, and the resultant was washed three times with brine (500 mL). After drying the organic layer with MgSO$_4$, the solvent was removed. 4.5 g (yield: 46%) of Compound C-2 was obtained using column chromatography (DCM:n-hexane=4:6).

Comparative Synthesis Example 3: Synthesis of Compound D-1

[Reaction Scheme 7]

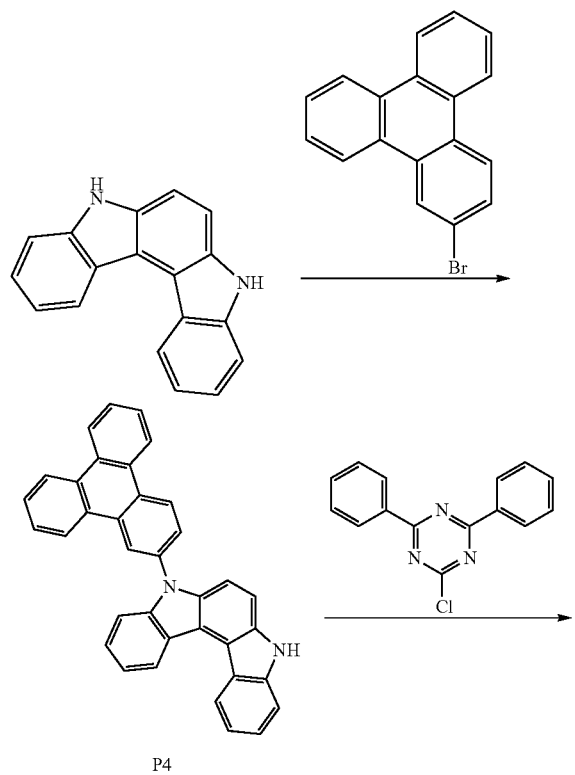

P4

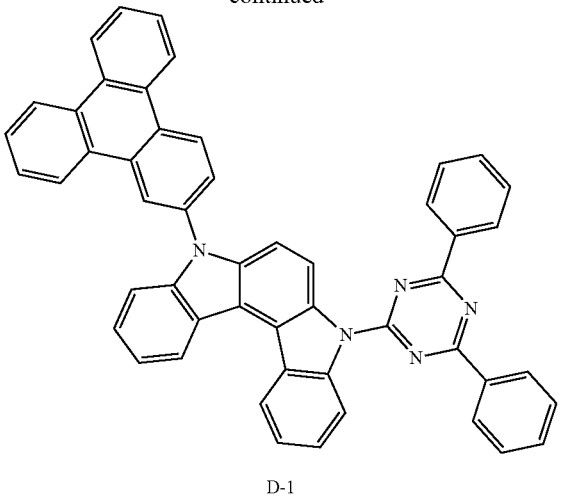

D-1

Step 1: Synthesis of Intermediate P4

5,8-dihydroindolo[2,3-c]carbazole (50 g, 195.08 mmol), 2-bromotriphenylene (50 g, 195.08 mmol), tris(dibenzylideneacetone)dipalladium (0) (8.9 g, 9.75 mmol), tri-tert-butylphosphine (16 g, 39.02 mmol), and sodium tert-butoxide (18.8 g, 195.08 mmol) were injected into a round-bottomed flask together with xylene (1 L) and stirred under reflux at 150° C. for 12 hours. After cooling to ambient temperature, DCM (700 mL) was injected and diluted, and the resultant was washed three times with brine (1 L). After drying the organic layer with MgSO$_4$, the solvent was removed. 42 g (yield: 45%) of Intermediate P4 was obtained using column chromatography (DCM:n-hexane=2:8).

Step 2: Synthesis of D-1

Intermediate P4 (7 g, 14.7 mmol), 2-chloro-4,6-diphenyl-1,3,5-triazine (4.7 g, 17.6 mmol), and sodium hydride (0.9 g, 22.0 mmol) (60% dispersion in mineral oil) were injected into a round-bottomed flask together with DMF (200 mL) solvent and stirred at room temperature for 12 hours. DCM (500 mL) was injected and diluted, and the resultant was washed three times with brine (500 mL). After drying the organic layer with MgSO$_4$, the solvent was removed. 5.2 g (yield: 50%) of Compound D-1 was obtained using column chromatography (DCM:n-hexane=4:6).

(Preparation of Second Compound for Organic Optoelectronic Device)

Compound B-58 was synthesized by a method from US 2017/0317293 A1.

(Production of Organic Light Emitting Diode)

Example 1

A glass substrate coated with ITO (Indium tin oxide) with a thickness of 1,500 Å was washed with distilled water. After washing with the distilled water, the glass substrate was ultrasonically washed with isopropyl alcohol, acetone, or methanol, dried and then, moved to a plasma cleaner, cleaned by using oxygen plasma for 10 minutes, and moved to a vacuum depositor. This obtained ITO transparent electrode was used as an anode, Compound A was vacuum-deposited on the ITO substrate to form a 700 Å-thick hole injection layer, and Compound B was deposited to be 50

Å-thick on the injection layer, and then Compound C was deposited to be 1,020 Å-thick to form a hole transport layer. On the hole transport layer, 400 Å-thick light emitting layer was formed by using Compound A-1 obtained in Synthesis Example 1 as a host and doping 7 wt % of PhGD as a dopant by a vacuum-deposition. Subsequently, on the light emitting layer, a 300 Å-thick electron transport layer was formed by simultaneously vacuum-depositing Compound D and Liq in a weight ratio of 1:1, and on the electron transport layer, Liq and Al were sequentially vacuum-deposited to be 15 Å-thick and 1,200 Å-thick, producing an organic light emitting diode.

The organic light emitting diode had a five-layered organic thin layer, and specifically the following structure.

ITO/Compound A (700 Å)/Compound B (50 Å)/Compound C (1,020 Å)/EML [Compound A-1: PhGD (7 wt %)] (400 Å)/Compound D:Liq (300 Å)/Liq (15 Å)/Al (1,200 Å)

Compound A: N4,N4'-diphenyl-N4,N4'-bis(9-phenyl-9H-carbazol-3-yl)biphenyl-4,4'-diamine Compound B: 1,4,5,8,9,11-hexaazatriphenylene-hexacarbonitrile (HAT-CN)

Compound C: N-(biphenyl-4-yl)-9,9-dimethyl-N-(4-(9-phenyl-9H-carbazol-3-yl)phenyl)-9H-fluoren-2-amine Compound D: 8-(4-(4,6-di(naphthalen-2-yl)-1,3,5-triazin-2-yl)phenyl)quinoline

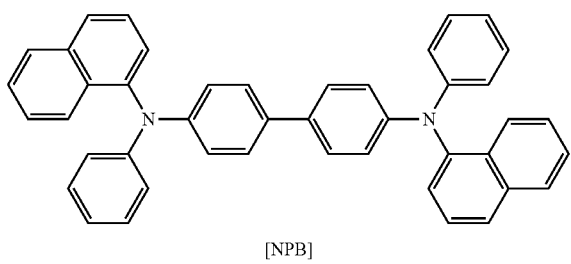

[NPB]

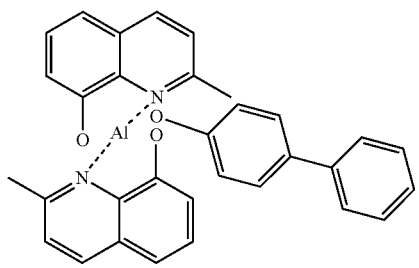

[BAlq]

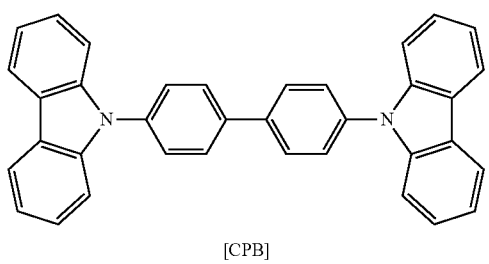

[CPB]

PhGD

Examples 2 to 5 and Comparative Examples 1 to 4

Organic light emitting diodes were produced in the same manner as in Example 1, except that the compositions were changed to Table 1 and Table 2.

Evaluation

Driving voltages, luminous efficiency, and life-span characteristics of the organic light emitting diodes according to Examples 1 to 5 and Comparative Examples 1 to 4 were evaluated.

Specific measurement methods are as follows, and the results are shown in Tables 1 and 2.

(1) Measurement of Current Density Change Depending on Voltage Change

The obtained organic light emitting diodes were measured regarding a current value flowing in the unit device, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Power Efficiency

Power efficiency (cd/A) at the same current density (10 mA/cm$^2$) were calculated by using the luminance and current density from the items (1) and (2).

(4) Measurement of Life-Span

The results were obtained by measuring a time when current efficiency (cd/A) was decreased down to 95%, while luminance (cd/m$^2$) was maintained to be 24,000 cd/m$^2$.

(5) Measurement of Driving Voltage

A driving voltage of each diode was measured using a current-voltage meter (Keithley 2400) at 15 mA/cm$^2$.

(6) Calculation of T95 Life-Span Ratio (%)

As for a single host, T95(h) ratios of T95(h)'s of examples relative to that of comparative example, or as for a mixed host prepared by applying the same second host, T95(h) ratios of T95(h)'s of examples (applying the compound of synthesis examples as the first host) relative to that of comparative example (applying the compound of comparative synthesis example as the first host) are exhibited.

T95 life-span ratio (%)={[T95(h) of examples, comparative examples (a single host or a mixed host)]/[T95(h) of reference data (comparative example applying the compound of comparative synthesis example as the singe host or the first host of the mixed host)]}×100

(7) Calculation of Driving Voltage Ratio (%)

As for the single host, driving voltages of examples relative to that of comparative example, or as for the mixed host prepared by applying the same second host, driving voltage ratios of driving voltages of examples (applying the compound of synthesis example as the first host) relative to that of comparative example (applying the compound of comparative synthesis example as the first host) are exhibited.

Driving voltage ratio (%)={[driving voltages (V) of examples, comparative examples (the single host or the mixed host))]/[driving voltage (V) of reference data (comparative example applying the compound of comparative synthesis example as the single host or the first host of the mixed host)]}×100

(8) Calculation of Power Efficiency Ratio (%)

As for the single host, power efficiency ratios of power efficiency of examples relative to that of comparative example, or as for the mixed host prepared by applying the same second host, power efficiency of the examples (applying the compound of synthesis example as the first host) relative to that of the comparative example (applying the compound of comparative synthesis example as the first host) are exhibited.

Power efficiency ratio (%)={[power efficiency (Cd/A) of examples, comparative examples (the single host or the mixed host)]/[power efficiency (Cd/A) of reference data (comparative example applying the compound of comparative synthesis example as the single host or the first host of the mixed host)]}×100

TABLE 1

| Nos. | Single host | Color | Driving voltage ratio (%) | Power Efficiency ratio (%) | T95 life-span ratio (%) |
|---|---|---|---|---|---|
| Example 1 | A-1 | green | 100% | 101% | 165% |
| Example 2 | A-2 | green | 100% | 102% | 170% |
| Example 3 | A-3 | green | 98% | 103% | 168% |
| Example 4 | A-4 | green | 101% | 103% | 170% |
| Comparative Example 1 (reference data) | C-1 | green | 100% | 100% | 100% |
| Comparative Example 2 | C-2 | green | 101% | 99% | — |
| Comparative Example 3 | D-1 | green | 97% | 98% | 115% |

TABLE 2

| Nos. | Mixed host First host | Mixed host Second host | Weight ratio (first compound:second compound) | Power efficiency ratio (%) | T95 life-span ratio (%) |
|---|---|---|---|---|---|
| Example 5 | A-1 | B-58 | 7:3 | 102% | 265% |
| Comparative Example 4 (reference data) | C-1 | B-58 | 7:3 | 100% | 100% |

Referring to Tables 1 and 2, materials of the Examples (substituted with triphenylene at the same position) stabilized holes and electrons injected into EML due to expanded aromaticity, compared with structures substituted with phenanthrene in Comparative Examples 1, 2, and 4, and thus exhibited a greatly increased life-span. In addition, in the materials of the Examples, the triphenylene and the triazine in charge of LUMO were relatively closer than in Comparative Example 3, and unlike Comparative Example 3, since the triphenylene increased a stability for electrons while wrapping one side of the triazine, life-spans were improved.

By way of summation and review, an organic light emitting diode (OLED) has recently drawn attention due to an increase in demand for flat panel displays. The organic light emitting diode converts electrical energy into light, and the performance of organic light emitting diode may be greatly influenced by the organic materials between electrodes.

One or more embodiments may provide a compound for an organic optoelectronic device capable of realizing an organic optoelectronic device having high efficiency and long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic optoelectronic device, the compound being represented by Chemical Formula 1A or Chemical Formula 1B:

[Chemical Formula 1A]

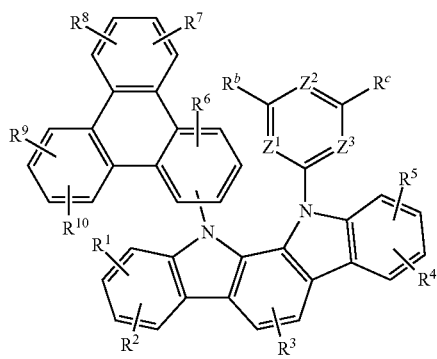

[Chemical Formula 1B]

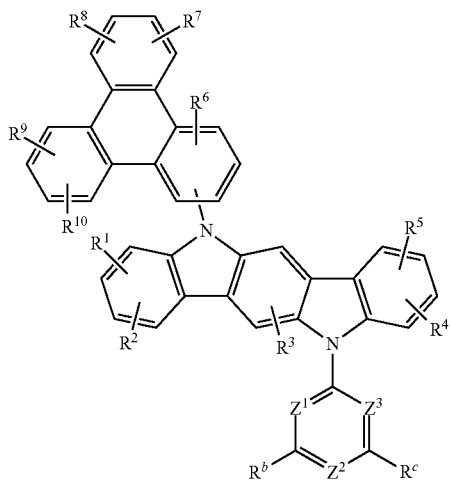

wherein, in Chemical Formula 1A and Chemical Formula 1B, $Z^1$ to $Z^3$ are independently N or $CR^a$, at least two of $Z^1$ to $Z^3$ being N, $R^a$ and $R^1$ to $R^{10}$ are independently hydrogen, deuterium, a substituted or unsubstituted C1 to C10 alkyl group, or a substituted or unsubstituted C6 to C20 aryl group, and $R^b$ and $R^c$ are independently a substituted or unsubstituted C6 to C20 aryl group or a substituted or unsubstituted C2 to C30 heterocyclic group.

2. The compound as claimed in claim 1, wherein:

Chemical Formula 1A is represented by Chemical Formula 1A-1 and Chemical Formula 1B is represented by Chemical Formula 1B-1:

[Chemical Formula 1A-1]

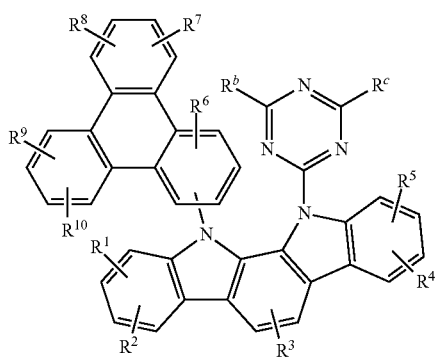

[Chemical Formula 1B-1]

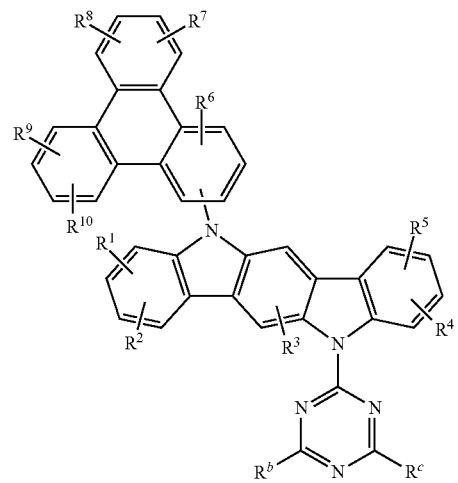

in Chemical Formula 1A-1 and Chemical Formula 1B-1,
$R^1$ to $R^{10}$, $R^b$, and $R^c$ are defined the same as those of Chemical Formulae 1A and 1B.

3. The compound as claimed in claim 1, wherein:

the compound is represented by Chemical Formula 1A,

Chemical Formula 1A is represented by Chemical Formula 1A-1-a:

[Chemcial Formula 1A-1-a]

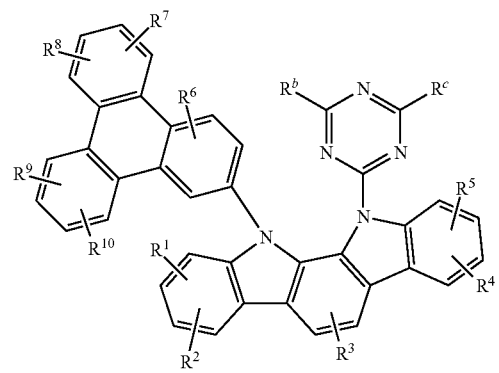

in Chemical Formula 1A-1-a, $R^1$ to $R^{10}$, $R^b$, and $R^c$ are defined the same as those of Chemical Formula 1A.

4. The compound as claimed in claim 1, wherein $R^b$ and $R^c$ are independently a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, a substituted or unsubstituted dibenzofuranyl group, a substituted or unsubstituted dibenzothiophenyl group, a substituted or unsubstituted carbazolyl group, or a combination thereof.

5. The compound as claimed in claim 1, wherein:
$R^b$ and $R^c$ are independently a group of Group I:
[Group I]
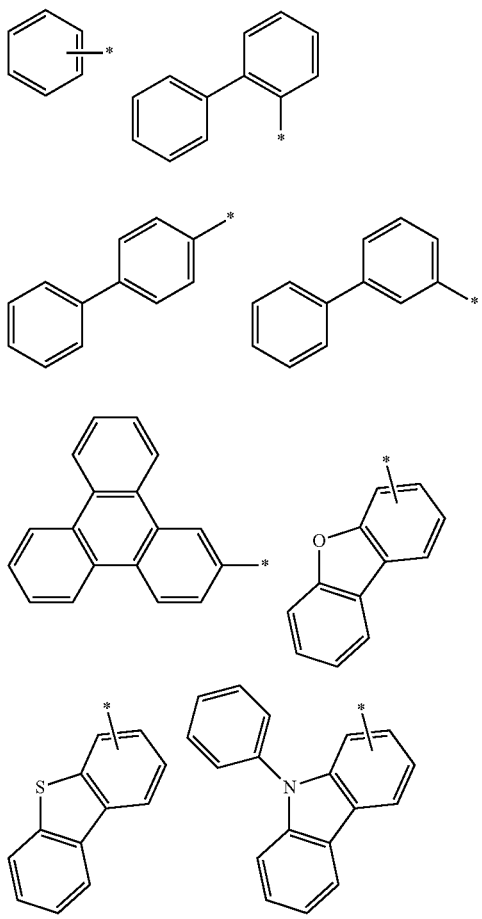
in Group I, * is a linking point.
6. The compound as claimed in claim 1, wherein the compound is a compound of Group 1:
[Group 1]
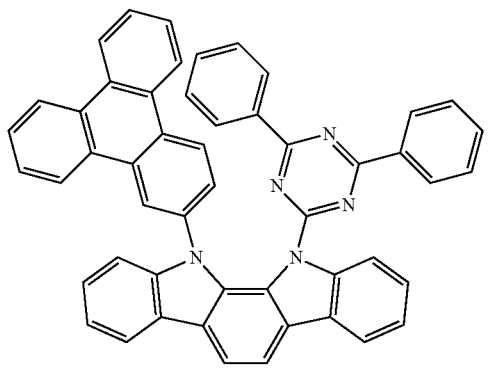
[A-1]
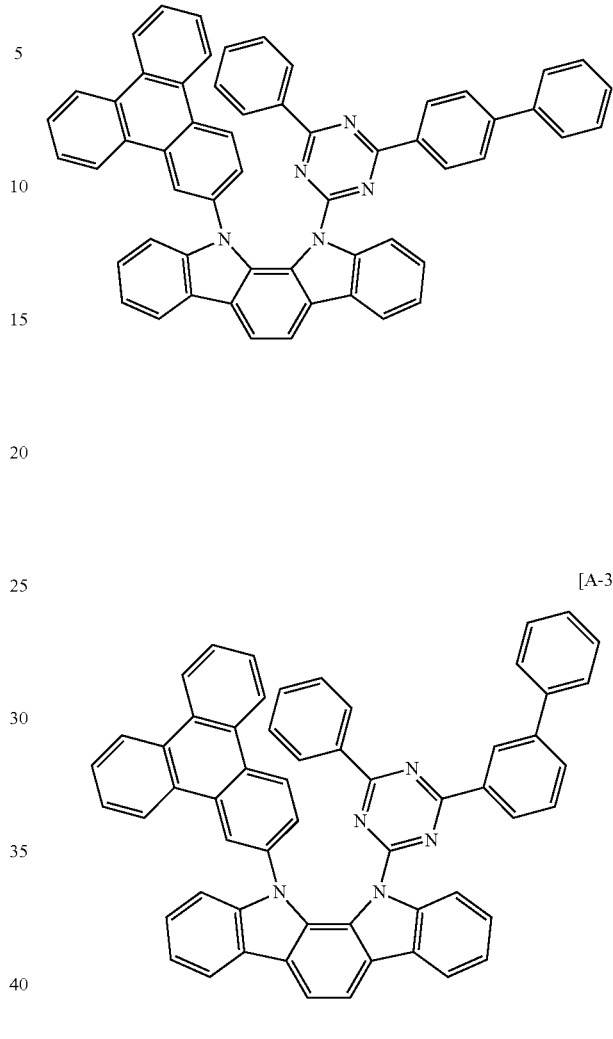
[A-2]
[A-3]
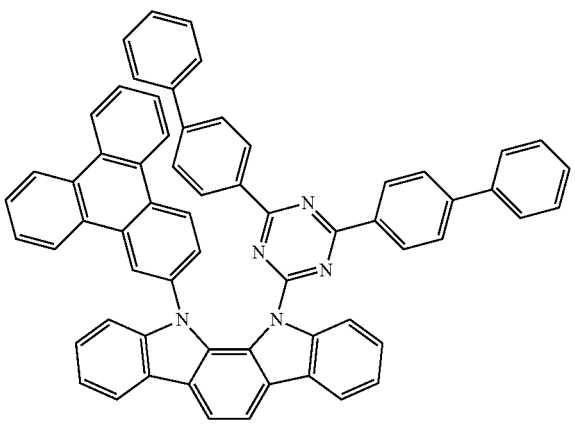
[A-4]

[A-5] 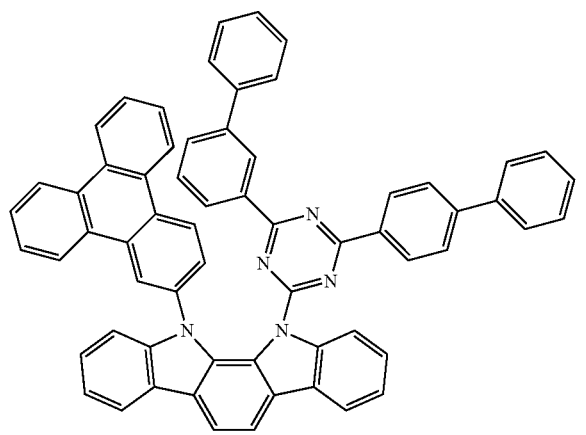
[A-6] 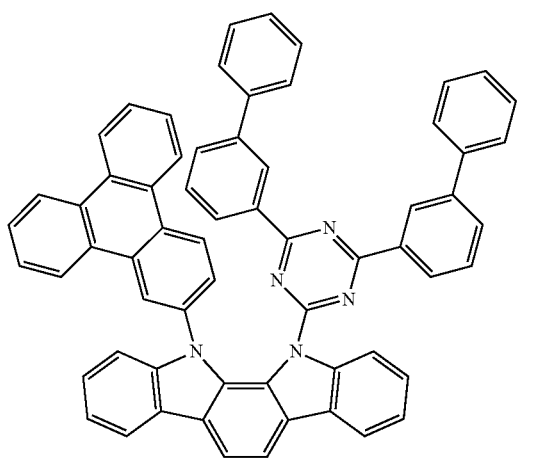
[A-7] 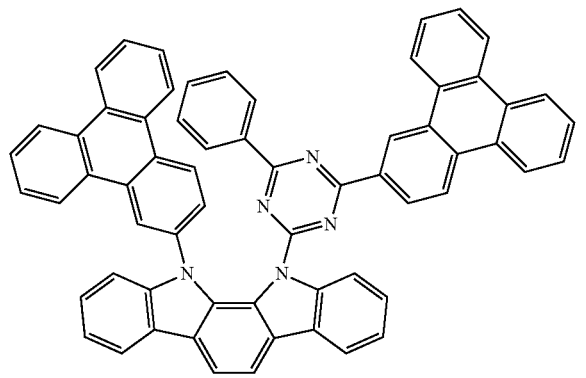
[A-8] 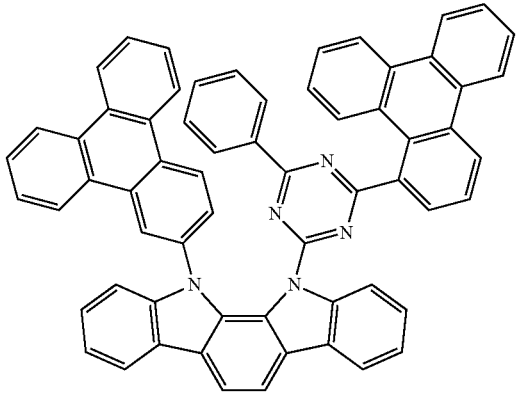
[A-9] 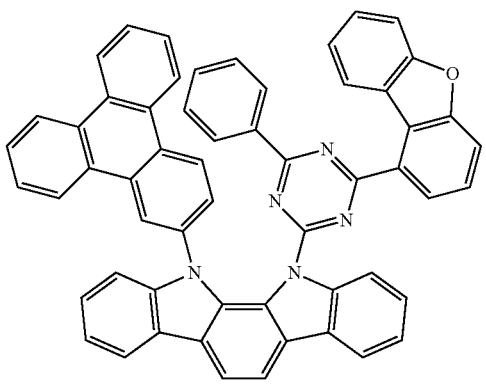
[A-10] 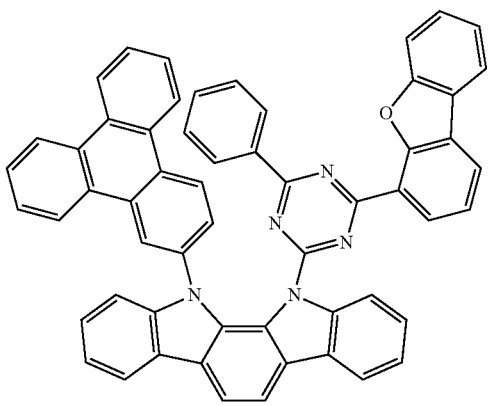
[A-11] 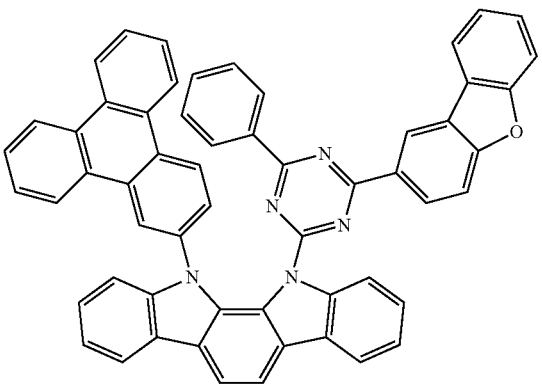

[A-12]
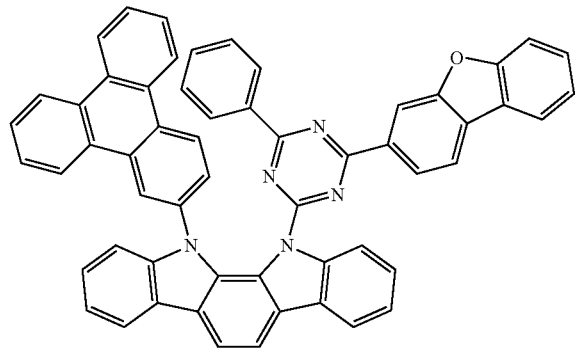
[A-13]
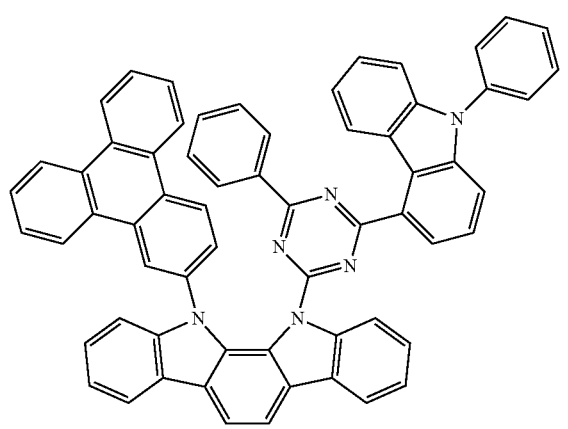
[A-14]
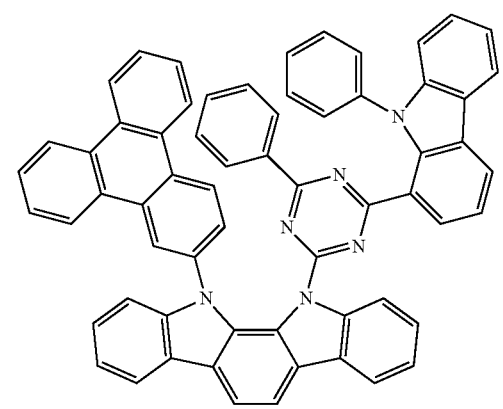
[A-15]
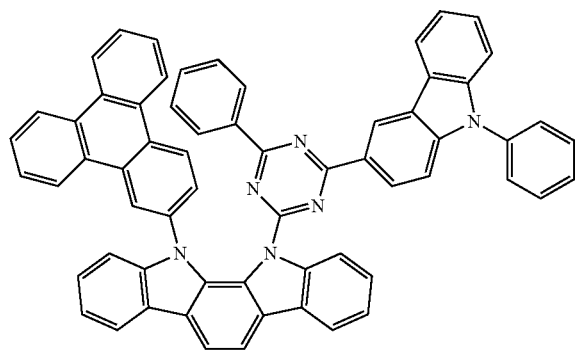
[A-16]
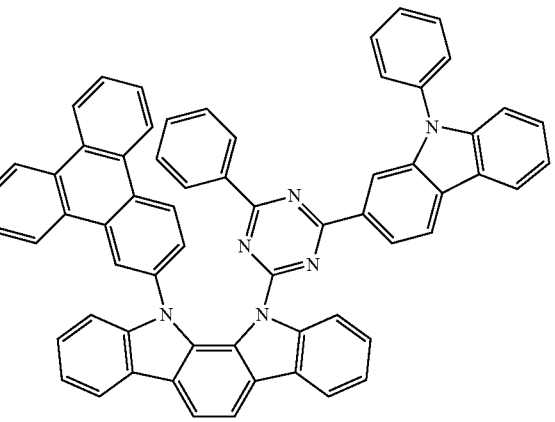
[A-17]
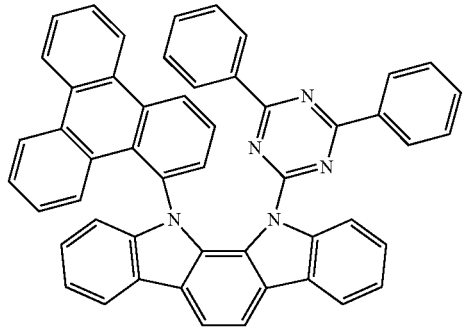
[A-18]
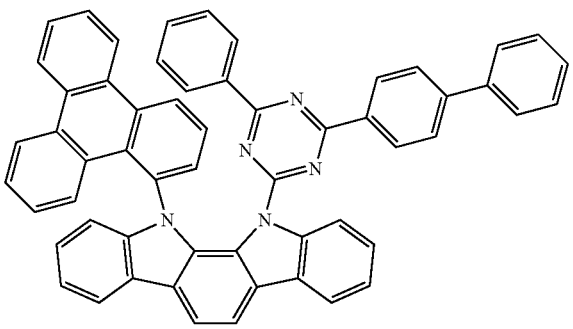
[A-19]
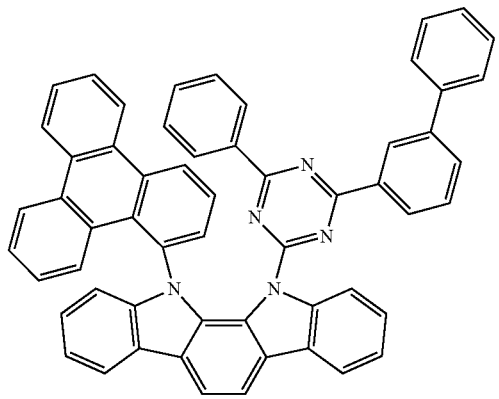

[A-20]
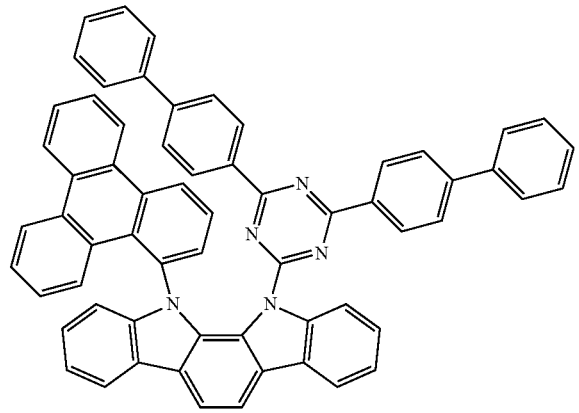
[A-21]
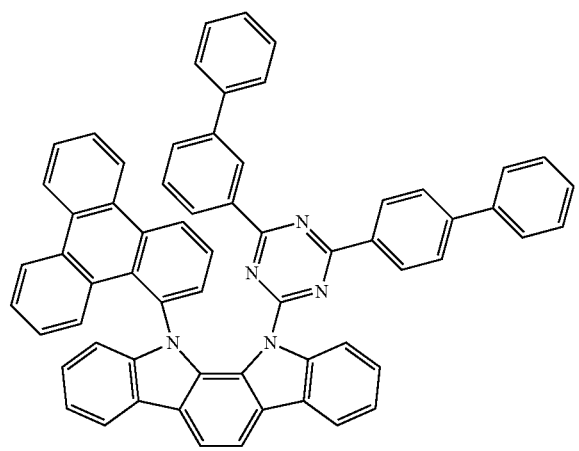
[A-22]
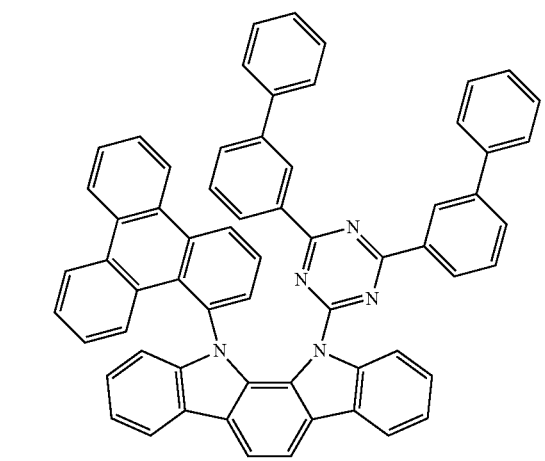
[A-23]
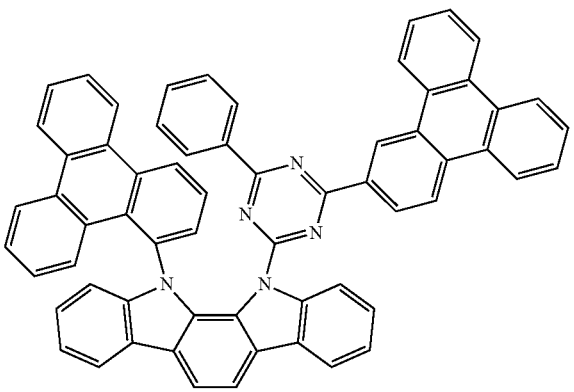
[A-24]
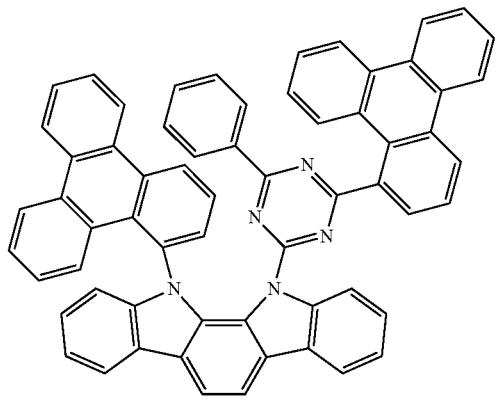
[A-25]
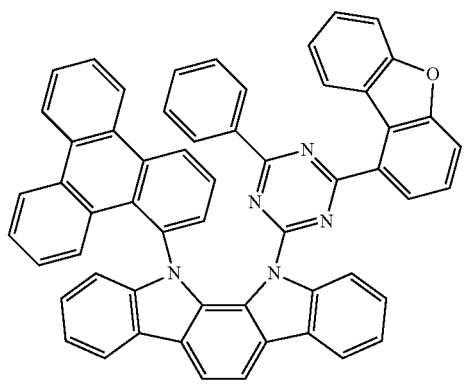
[A-26]
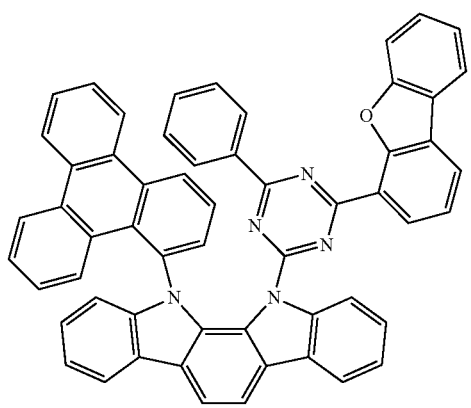

[A-27]
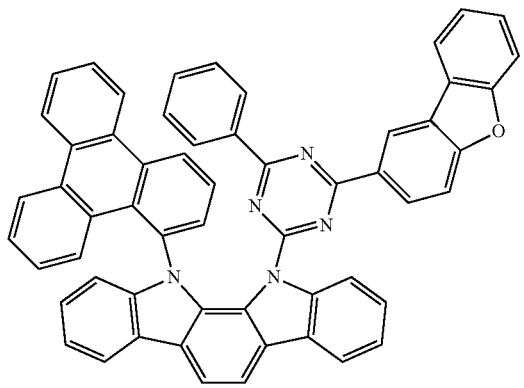
[A-28]
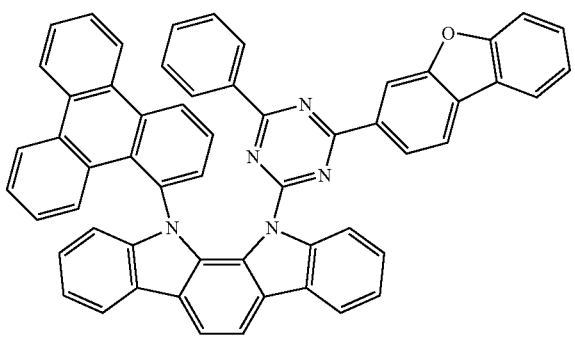
[A-29]
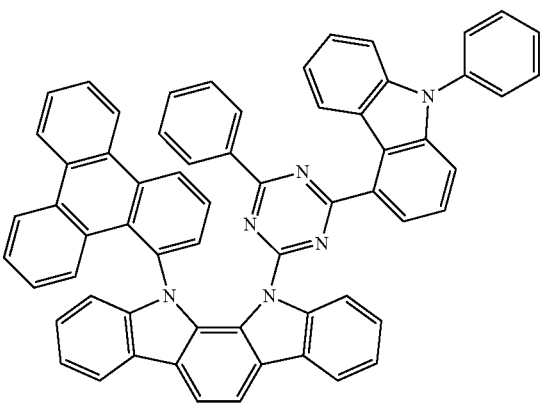
[A-30]
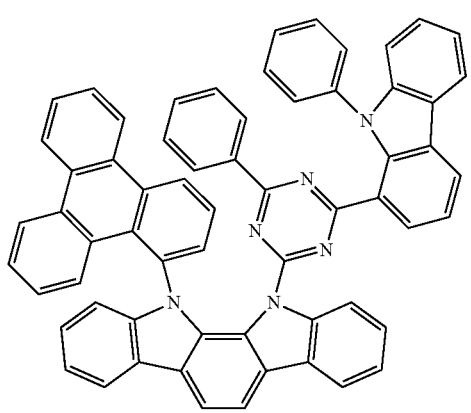
[A-31]
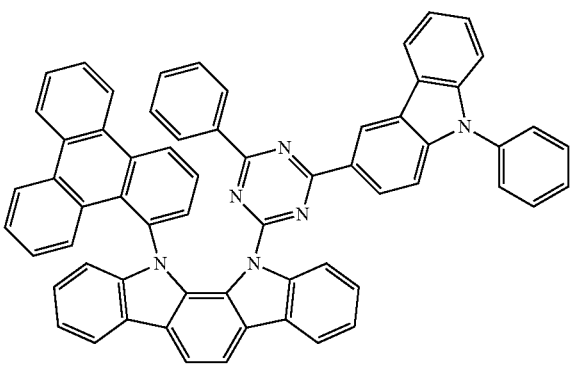
[A-32]
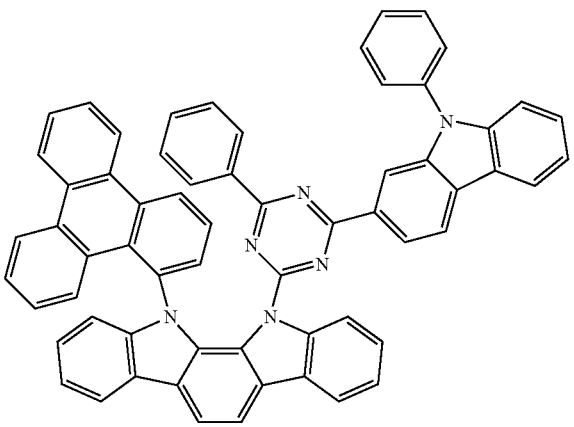
[A-33]
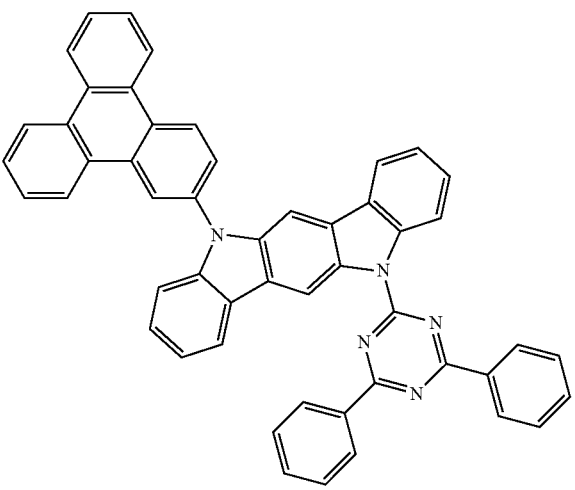

[A-34]
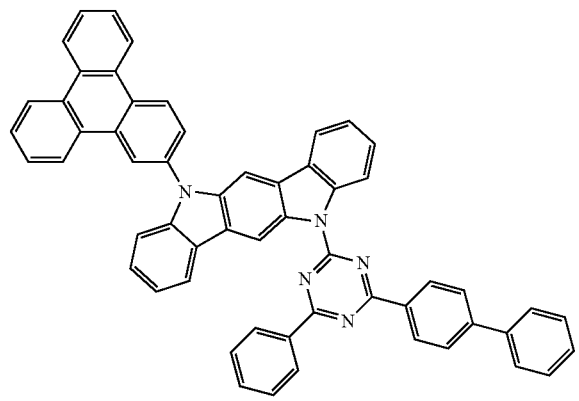
[A-35]
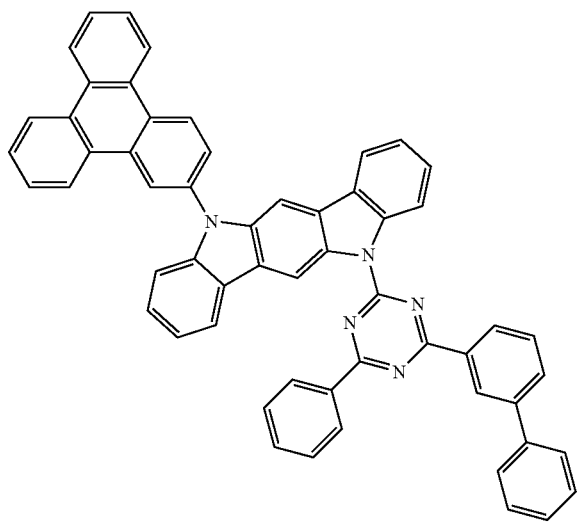
[A-36]
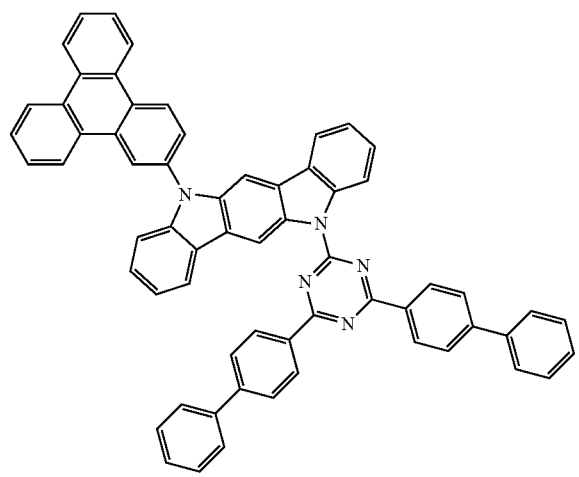
[A-37]
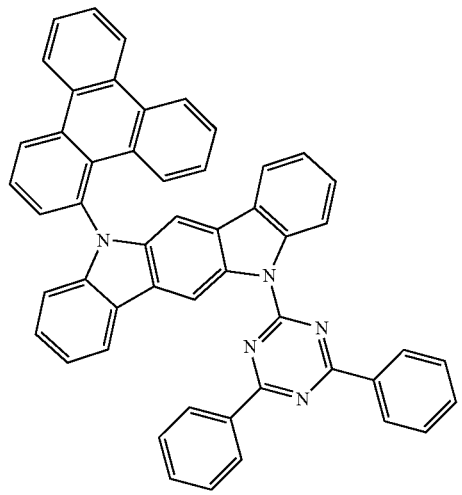
[A-38]
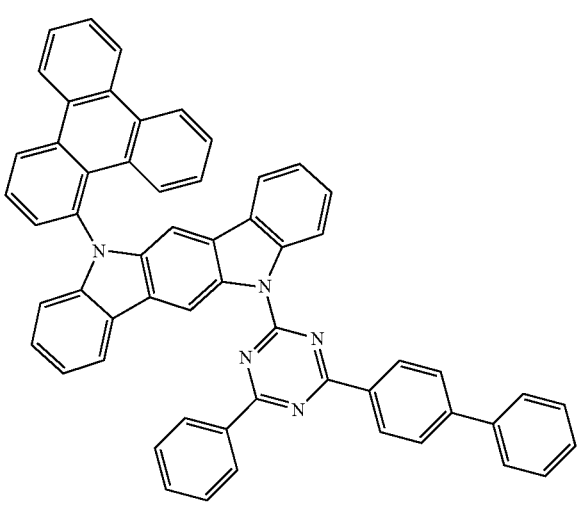
[A-39]
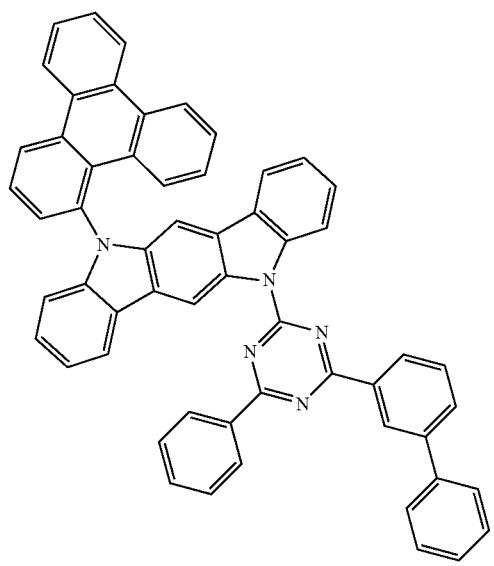

-continued

[A-40]

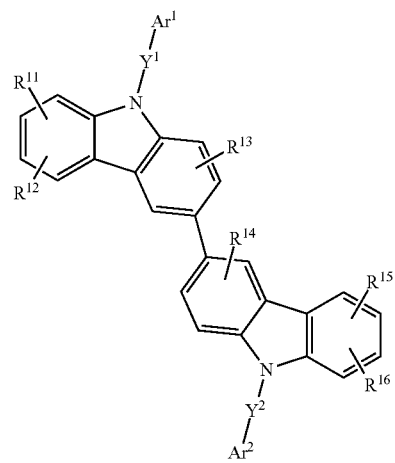

7. A composition for an organic optoelectronic device, the composition comprising:
a first compound and a second compound,
wherein:
the first compound includes the compound for an organic optoelectronic device as claimed in claim 1,
the second compound is represented by Chemical Formula 2:

[Chemical Formula 2]

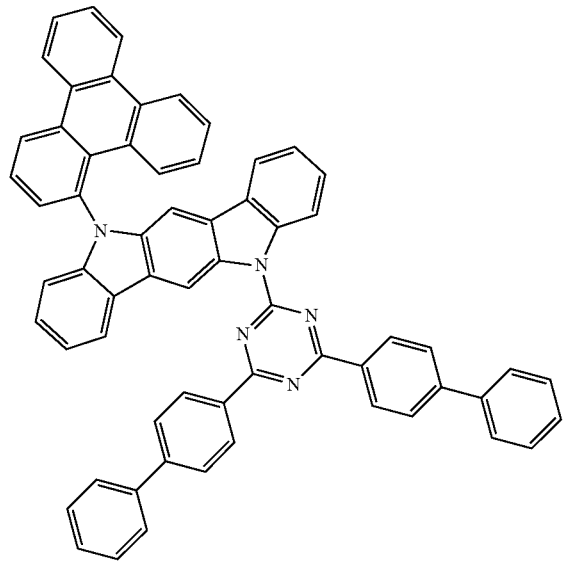

in Chemical Formula 2,
$Y^1$ and $Y^2$ are independently a single bond or a substituted or unsubstituted C6 to C20 arylene group,
$Ar^1$ and $Ar^2$ are independently a substituted or unsubstituted C6 to C20 aryl group or a substituted or unsubstituted C2 to C30 heterocyclic group, and
$R^{11}$ to $R^{16}$ are independently hydrogen, deuterium, a substituted or unsubstituted C1 to C10 alkyl group, a substituted or unsubstituted C6 to C20 aryl group, a substituted or unsubstituted C2 to C30 heterocyclic group, a cyano group, or a combination thereof.

8. The composition as claimed in claim 7, wherein:
moieties *—$Y^1$—$Ar^1$ and *—$Y^2$—$Ar^2$ of Chemical Formula 2 are each independently a moiety of Group II:

[Group II]

B-1
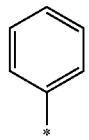

B-2
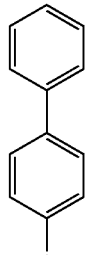

B-3
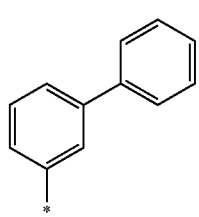

B-4
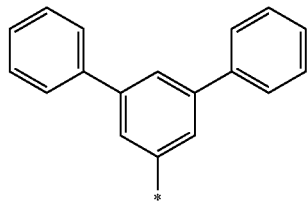

B-5
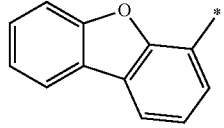

B-6
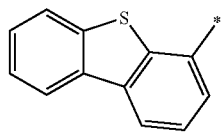

B-7
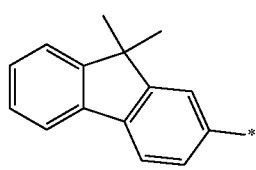

B-8
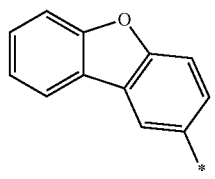

B-9
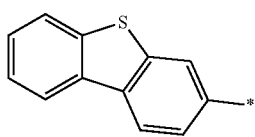
B-9
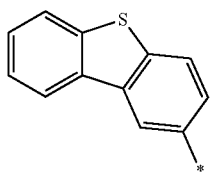
B-10
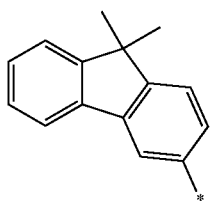
B-11
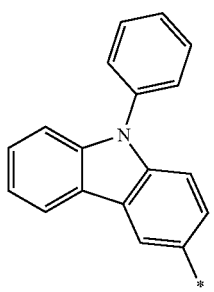
B-12
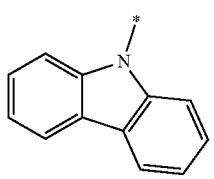
B-13
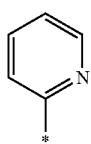
B-14
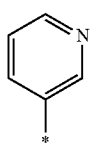
B-15
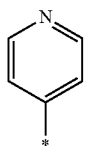
B-16
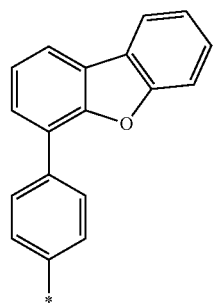
B-17
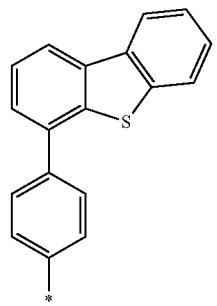
B-18
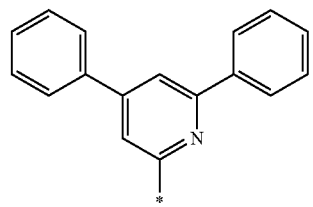
B-19
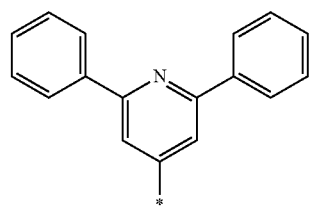
B-20
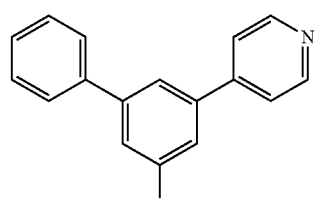
B-21
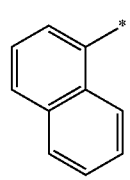
B-22
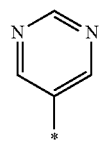

-continued

B-23
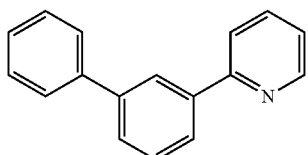

B-24
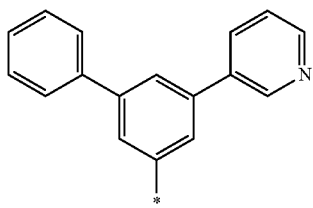

B-25
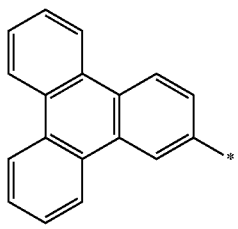

B-26
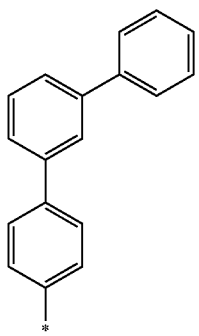

B-27
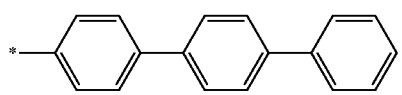

B-28
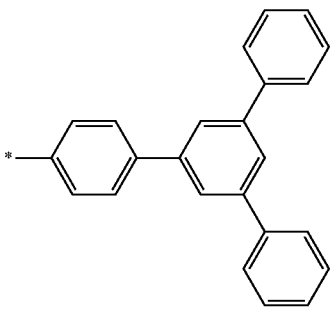

in Group II, * is a linking point.

9. An organic optoelectronic device, comprising
an anode and a cathode facing each other, and
at least one organic layer between the anode and the cathode
wherein the at least one organic layer includes the compound for an organic optoelectronic device as claimed in claim 1.

10. The organic optoelectronic device as claimed in claim 9, wherein:
the at least one organic layer includes a light emitting layer, and
the light emitting layer includes the compound for an organic optoelectronic device.

11. A display device comprising the organic optoelectronic device as claimed in claim 9.

12. An organic optoelectronic device, comprising
an anode and a cathode facing each other, and
at least one organic layer between the anode and the cathode,
wherein the at least one organic layer includes the composition for an organic optoelectronic device as claimed in claim 7.

13. The organic optoelectronic device as claimed in claim 12, wherein
the at least one organic layer includes a light emitting layer, and
the light emitting layer includes the composition for an organic optoelectronic device.

14. A display device comprising the organic optoelectronic device as claimed in claim 12.

* * * * *